US007779371B2

(12) United States Patent
Lottmann

(10) Patent No.: US 7,779,371 B2
(45) Date of Patent: Aug. 17, 2010

(54) METHODS, SYSTEMS AND USER INTERFACE FOR EVALUATING PRODUCT DESIGNS IN LIGHT OF PROMULGATED STANDARDS

(75) Inventor: Todd Francis Lottmann, Washington, MO (US)

(73) Assignee: Cooper Technologies Company, Houston, TX (US)

( * ) Notice: Subject to any disclaimer, the term of this patent is extended or adjusted under 35 U.S.C. 154(b) by 579 days.

(21) Appl. No.: 11/622,526

(22) Filed: Jan. 12, 2007

(65) Prior Publication Data
US 2008/0120579 A1  May 22, 2008

Related U.S. Application Data

(60) Provisional application No. 60/859,624, filed on Nov. 17, 2006.

(51) Int. Cl.
*G06F 17/50* (2006.01)
(52) U.S. Cl. .................................. 716/1; 716/4; 716/5
(58) Field of Classification Search ..................... 716/1, 716/4, 5, 2, 6; 703/18; 326/36–41, 47, 81, 326/101
See application file for complete search history.

(56) References Cited

U.S. PATENT DOCUMENTS

| 2004/0130218 | A1* | 7/2004 | Locke | 307/147 |
| 2005/0197812 | A1* | 9/2005 | Kolenc et al. | 703/9 |
| 2006/0009959 | A1* | 1/2006 | Fischer et al. | 703/18 |
| 2008/0253052 | A1* | 10/2008 | Crewson et al. | 361/98 |

OTHER PUBLICATIONS

Craig DiLouie, "2005 NEC Changes Impact Lighting Control Panels, Metal Halide Lighting," Apr. 2005, pp. 1-4.*

* cited by examiner

*Primary Examiner*—Vuthe Siek
(74) *Attorney, Agent, or Firm*—Armstrong Teasdale LLP

(57) ABSTRACT

Interactive, computer implemented systems and methods for analyzing issues raised by promulgated industry standards for complex electrical product and system design. Data and information related to the electrical system and to the promulgated standards of interest are archived in the system databases, and with an intuitive menu driven user interface and graphic displays, interested users may rather quickly evaluate complex product designs for certification with desired promulgated standards applicable to the product and system design.

65 Claims, 45 Drawing Sheets

FIG. 43A → FIG. 43B http://sccr.bussmann.com/Reports/patent%A20spec.xls - Microsoft Internet Explorer File  Edit  View  Favorites  Tools  Help Back  •  Address  http://sccr.bussmann.com/Reports/patent%A20spec.xls

COOPER Bussmann
Productivity Through Production

Report

| | | | | | | |
|---|---|---|---|---|---|---|
| | Component Location | | | | | Component Ratings from Database |
| Main | Feeder | Sub-Feeder | Branch | Part Number | Device Description | |
| S1 | | | | | Fused Switch (UL 98 Misc Switches) with Branch Circuit Fuses (UL 248 Fuses) | |
| | | | | 1494V-DHX636 | 30 A CLASS J FUSED (60A FUSE CLIP) SWITCH FLANGE-MOUNTED (LEFT SIDE) | |
| | | | | LPJ-35SP | CLASS - J | |
| S1 | | | SB1 | | Branch Circuit Fuses (UL 248 Fuses) in Fuseholder (UL 512 Fuseholder) | |
| | | | | FNQ-R-1 | CLASS - CC | |
| | | | | BC6033B | Fuse Block - Box Lug 3 Pole | |
| S1 | | | SB1 | | Bus Bar System | |
| | | | | | Bus Bar | |
| S1 | | | SB1 | | Bus Bar System | |
| | | | | | Bus Bar | |
| S1 | F11 | | | | Bus Bar System | |
| | | | | | Bus Bar | |
| S1 | F11 | | FB111 | | Branch Circuit Fuses (UL 248 Fuses) in Fuseholder (UL 512 Fuseholder) | |
| | | | | FNQ-R-1 | CLASS - CC | |
| | | | | BC6031B | Fuse Block - Box Lug 1 Pole | |
| S1 | F11 | | FB111 | | Bus Bar System | |
| | | | | | Bus Bar | |
| S1 | F11 | | | | Bus Bar System | |
| | | | | | Bus Bar | |
| S1 | F11 | SF111 | | | Branch Circuit Fuses (UL 248 Fuses) in Fuseholder (UL 512 Fuseholder) | |
| | | | | FNQ-R-1 | CLASS - CC | |
| | | | | BC6031B | Fuse Block - Box Lug 1 Pole | |
| S1 | F11 | SF111 | | | Bus Bar System | |
| | | | | | Bus Bar | |
| S1 | F11 | SF111 | SFB1111 | | Branch Circuit Fuses (UL 248 Fuses) in Fuseholder (UL 512 Fuseholder) | |
| | | | | FNQ-R-1 | CLASS - CC | |
| | | | | BC6031B | Fuse Block - Box Lug 1 Pole | |
| S1 | F11 | SF111 | SFB1111 | | Bus Bar System | |
| | | | | | Bus Bar | |
| | | | | | Short Circuit Current Rating = 10 kA | |

| Voltage | Ampere | SCCR | Adjusted SCCR | IR | Final SCCR | Comments |
|---|---|---|---|---|---|---|
| | | | | | | Assembly SCCR Calculator |
| | | | Project Name | | | patent |
| | | | Panel Designation | | | spec |
| 600 V | 30 A | 200 kA | 200 kA | - | 200 kA | |
| 600 V | 35 A | - | | 300 kA | | |
| 600 V | 1 A | - | | 200 kA | | |
| 600 V | 30 A | 200 kA | 200 kA | - | 200 kA | |
| 600 V | - | 10 kA | 10 kA | - | 10 kA | |
| 600 V | - | 10 kA | 10 kA | - | 100 kA | |
| 600 V | 1 A | - | | 200 kA | | |
| 600 V | 30 A | 200 kA | 200 kA | - | 200 kA | SCCR Rating is increased by the Device upstream. |
| 600 V | - | 10 kA | 10 kA | - | 100 kA | SCCR Rating is increased by the Device upstream. |
| 600 V | 1 A | - | | 200 kA | | |
| 600 V | 30 A | 200 kA | 200 kA | - | 200 kA | |
| 600 V | - | 10 kA | 10 kA | - | 100 kA | SCCR Rating is increased by the Device upstream. |
| 600 V | 1 A | - | | 200 kA | | |
| 600 V | 30 A | 200 kA | 200 kA | - | 0 kA | |
| 600 V | - | 10 kA | 10 kA | - | 0 kA | |

FIG. 43A
FIG. 43B

METHODS, SYSTEMS AND USER INTERFACE FOR EVALUATING PRODUCT DESIGNS IN LIGHT OF PROMULGATED STANDARDS

CROSS REFERENCE TO RELATED APPLICATIONS

This application claims the benefit of U.S. Provisional Application Ser. No. 60/859,624 filed Nov. 17, 2006, the entire disclosure of which is hereby incorporated by reference in its entirety.

BACKGROUND OF THE INVENTION

This invention relates generally to product design and evaluation for certification with applicable industry standards, and more particularly, to interactive methods and systems for determining compliance with applicable standards and regulations for interconnected components in an electrical system.

Electrical systems typically include a large number of interconnected components. Like other industries, the electrical products industry is subject to standard setting bodies for products in the industry. Standards may be promulgated, for example, to address safety issues, to achieve a desired uniformity in performance characteristics of products and systems made by different manufacturers, and/or to achieve a certain degree of compatibility with other products, devices, and systems. A variety of recognized certification marks may be obtained for products that comply with applicable standards, and obtaining proper certification of products can be significant in the marketplace. Obtaining certification of products, devices and systems, as well as ensuring continuing compliance with promulgated standards, can be challenging in a number of aspects.

BRIEF DESCRIPTION OF THE DRAWINGS

FIGS. 4-7 illustrate portions of a flowchart illustrating exemplary navigational and data entry processes utilized by the system shown in FIGS. 2 and 3, wherein:

FIG. 4 illustrates a supply circuit connection data entry processing algorithm;

FIG. 5 illustrates a feeder circuit data entry processing algorithm;

FIG. 6 illustrates a sub-feeder circuit connection data entry processing algorithm; and FIG. 7 illustrates a navigation logic, display and reporting processing algorithm.

FIGS. 8-23 illustrate portions of data analysis processes utilized by the system shown in FIGS. 2 and 3 to analyze the electrical system in light of the promulgated industry standards, wherein:

FIG. 8 illustrates a logon processing algorithm;

FIG. 9 illustrates a project information processing algorithm;

FIG. 10 illustrates a portion of a supply circuit type selection processing algorithm;

FIG. 11 illustrates a supply circuit component selection processing algorithm;

FIG. 12 illustrates a feeder circuit component analysis processing algorithm;

FIG. 13 illustrates the rating adjustment logic processing algorithm shown in FIG. 12;

FIG. 14 illustrates the trans. thru logic algorithm shown in FIG. 12;

FIG. 15 illustrates the let-thru logic algorithm shown in FIG. 12;

FIG. 16 illustrates a branch circuit overcurrent protection device analysis processing algorithm for a first branch circuit;

FIG. 17 illustrates a second branch circuit analysis processing algorithm for an another device in the first branch circuit;

FIG. 18 illustrates a branch circuit overcurrent protection device analysis processing algorithm for a second branch circuit;

FIG. 19 illustrates a branch circuit analysis processing algorithm for another device in the second branch circuit;

FIG. 20 illustrates a sub-feeder circuit overcurrent protection device component analysis processing algorithm;

FIG. 21 illustrates an other device analysis processing algorithm for a sub-feeder circuit;

FIG. 22 illustrates an overcurrent protection device analysis processing algorithm for a branch circuit connected to the sub-feeder circuit; and FIG. 23 illustrates another component analysis processing algorithm for a branch circuit connected to the sub-feeder circuit.

FIGS. 24-44 illustrate exemplary embodiments of a user interface for the system shown in FIGS. 2 and 3, wherein:

FIG. 24 is an example embodiment of a user interface displaying a logon screen for a user of the system;

FIG. 25 is an example of a user interface displaying a panel information screen for a user of the system;

FIG. 26 is an example of a user interface displaying a supply circuit connection screen for a user of the system;

FIG. 27 is an example of a user interface displaying a supply circuit component selection screen for a user of the system;

FIG. 28 is an example of a user interface displaying a branch circuit connected to supply circuit device selection screen for a user of the system;

FIG. 29 is an example of a user interface displaying a feeder circuit connected to supply circuit screen for a user of the system;

FIG. 30 is an example of a user interface displaying a feeder circuit connected to supply circuit device selection screen for a user of the system;

FIG. 31 is an example of a user interface displaying a branch circuit connected to supply circuit selection screen for a user of the system;

FIG. 32 is an example of a user interface displaying a first branch circuit connected to supply circuit overcurrent protection device selection screen for a user of the system;

FIG. 33 is an example of a user interface displaying another first branch circuit connected to supply circuit device selection screen for a user of the system;

FIG. 34 is an example of a user interface displaying a second branch circuit connected to feeder circuit overcurrent protection device selection screen for a user of the system;

FIG. 35 is an example of a user interface displaying another second branch circuit connected to feeder circuit device selection screen for a user of the system;

FIG. 36 is an example of a user interface displaying a sub-feeder circuit screen for a user of the system;

FIG. 37 is an example of a user interface displaying a sub-feeder circuit connected to feeder circuit overcurrent protection device selection screen for a user of the system;

FIG. 38 is an example of a user interface displaying another sub-feeder circuit connected to feeder circuit device selection screen for a user of the system;

FIG. 39 is an example of a user interface displaying a branch circuit to sub-feeder circuit screen for a user of the system;

FIG. 40 is an example of a user interface displaying a first branch circuit to sub-feeder circuit component selection screen for a user of the system;

FIG. 41 is an example of a user interface displaying a second sub-feeder circuit component selection screen for a user of the system;

FIG. 42 is an example of a user interface displaying a project summary analysis screen;

FIG. 43 is an example of a user interface displaying a detailed project analysis screen for a user of the system; and FIG. 44 is an example of a user interface displaying a custom device input and selection screen for a user of the system.

DETAILED DESCRIPTION OF THE INVENTION

Exemplary embodiments of methods and systems are disclosed herein that overcome problems, difficulties and disadvantages discussed below for analyzing, for example, electrical products and systems to ensure that proper certification marks of the products and systems may be obtained. This is achieved at least in part with the provision of interactive web-based systems and methods for analyzing issues raised by promulgated industry standards for complex electrical product and system design. Data and information related to the electrical system and to the promulgated standards of interest are archived in the system databases, and with an intuitive menu driven user interface and graphic displays, interested users may rather quickly evaluate complex product designs for certification with desired promulgated standards. Human error in the analysis and evaluation is largely, if not completely avoided. Real time analysis feedback is presented and updated at each step of the analysis, permitting the user to understand the impact of design changes on the certification analysis. The feedback is available in summary form and in a detailed form for study by the user.

In order to appreciate the invention to its fullest extent, the following disclosure will be divided into different parts or segments, wherein Part I discusses particular problems of evaluating rather complex electrical products and systems with promulgated industry standards; Part II discloses an exemplary system for analyzing and evaluating the complex electrical products and systems discussed in Part I; Part III discloses exemplary processes utilized by the system of Part II to complete its analysis; and Part IV discusses exemplary systems and user interfaces implementing the systems and processes disclosed in Parts II and III.

I. INTRODUCTION TO THE INVENTION

The number and scope of potentially applicable promulgated industry standards or regulations for a given project, such an electrical product and system design, is extensive. Locating the applicable standards, gathering necessary information to assess the standards to a given electrical system or product design, and properly applying the applicable standards to a selected design, can present significant challenges to product and system designers and manufacturers.

One exemplary type of electrical product or system in which such challenges are notable is the manufacture and assembly of electrical control panels. Industrial motors, machines, and HVAC equipment for example, typically are provided with electrical control panels that regulate power thereto. While the invention will be explained in the context of such electrical panels and the vexing problems associated therewith, it is contemplated that the invention may be equally applicable to other electrical products and systems apart from the electrical panels described below but raising similar issues.

Figure 1:
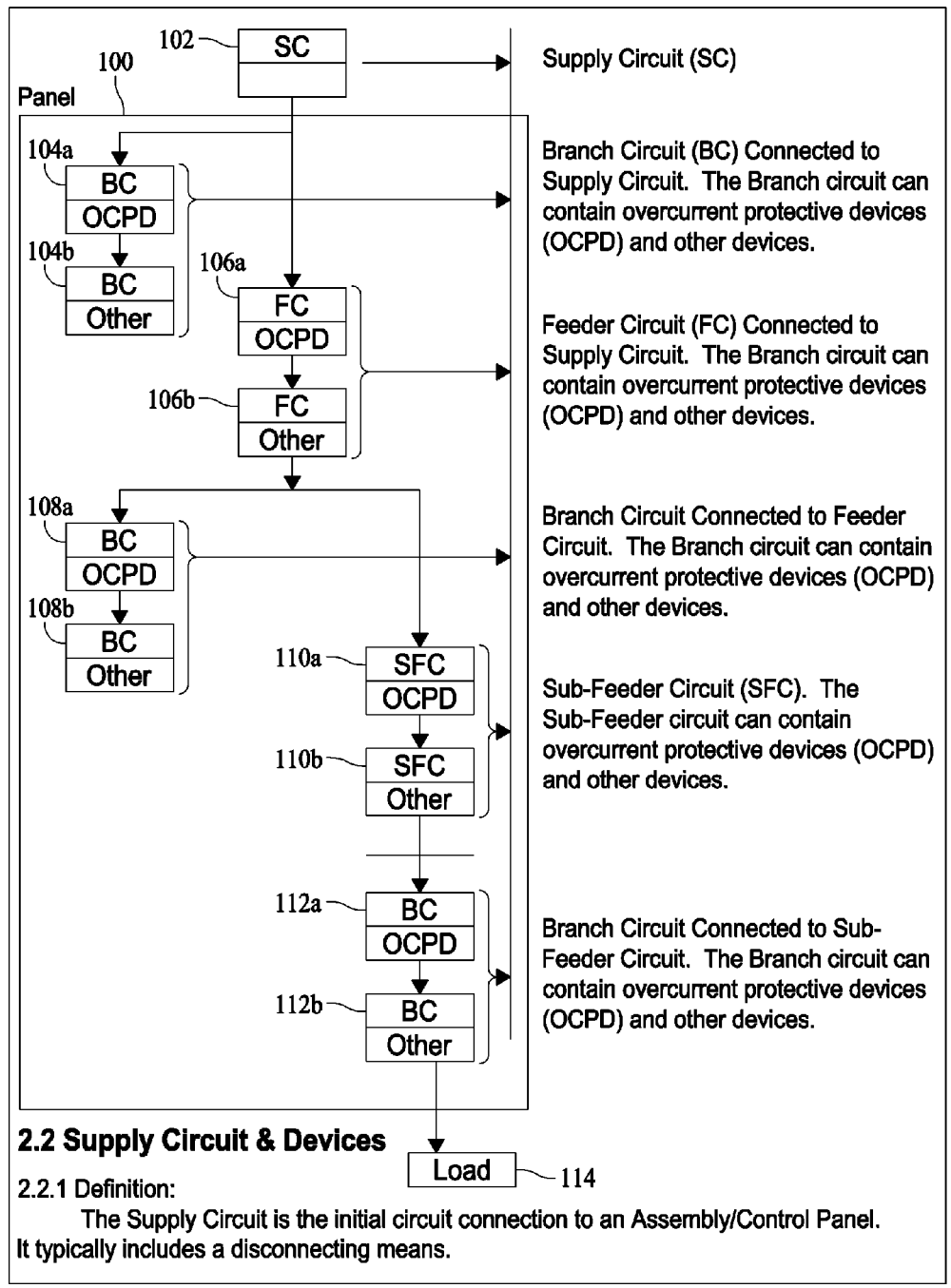
FIG. 1 is a schematic diagram of a portion of an exemplary electrical system that is subject to promulgated electrical industry standards.

FIG. 1 is a schematic diagram of an electrical control panel 100, in which the challenges of accurately and efficiently evaluating or assessing the panel in light of applicable standards are believed to be demonstrated. The panel 100 is connected to a power supply 102 and includes control circuitry, described below, including protective devices to prevent damage to associated electrical loads in electrical fault conditions, which may include short-circuit current conditions, overcurrent conditions, and overvoltage conditions. The protective devices may include fuses, limiters, breakers, surge suppressors and other known devices.

One aspect of electrical control panel design that is important to safe installation and use is the short-circuit current rating of the panel 100. Recent changes to the National Electric Code (NEC) require that electrical control panel 100 satisfies short-circuit current rating marking requirements. Specifically, Article 409 of the NEC provides that short-circuit current fault levels throughout the entire control panel 100 be assessed, and the protective devices such as fuses and circuit breakers be selected in such a manner that the short-circuit current ratings of the panel 100, including all of its components, will not be exceeded should a short-circuit occur. As such, the electrical loads will be subjected to a short-circuit current that is no more than the short-circuit current rating of the panel 100.

The short circuit rating of the components used in the panel 100 are distinguishable from the short-circuit current rating of the panel 100 overall, although in some cases, the short-circuit current rating of the panel 100 as a whole may be found to be equal to a short current rating of one or more of its individual components. As used herein, the short-circuit current rating of an electrical component or device used in the panel 100 shall refer to the maximum short-circuit current rating that the individual component may safely withstand. In effect, however, the short circuit rating of the panel 100 including all its interconnected components may not be equal to the short circuit rating of any of its individual components. In particular certain components or devices connected upstream of other components or devices in the panel may and sometimes do increase the ultimate amount of short-circuit current that the panel 100 may safely withstand. Careful analysis and consideration is therefore required to determine the true short-circuit current rating of the panel 100.

It is a preferred practice that electrical control panels such as the panel 100 be marked appropriately with their short-circuit current ratings. To obtain certification of the panel 100 for use, the panel 100 is subject to approval by Underwriters Laboratories (UL). Application of UL standards, however, to the electrical control panel 100 can be complex, especially as the number of interconnected circuits and associated circuit components or circuit devices in any given control panel increases. In particular U.L. 508A defines procedures for determining a short-circuit current rating of interconnected components, and U.L. 508A as will be described below, can be complex to apply in the context of the electrical control panel 100. Moreover, the panel 100 can itself be rather complex in its number of circuits, devices connected in the circuits, and the functional relationship of the interconnected devices.

As shown in FIG. 1, a power supply circuit ("SC") 102 is the initial current circuit connection to the control panel 100. Within the panel 100 are one or more branch circuits 104 connected to the supply circuit 102, one or more feeder circuits 106 connected to the supply circuit 102 and/or the branch circuits 104, one or more branch circuits 108 connected to the feeder circuits 106, one or more sub-feeder circuits 110 connected to the feeder circuits 106 and/or the branch circuits 108, and one or more branch circuits 112 connected to the sub-feeder circuits 110. The branch circuits 112 are, in turn, connected to one or more loads 114. The control panel 100, via the circuits 104, 106, 108, 110 and 112 regulates power from the supply circuit 102 to the loads 114, and among other things regulates current flow to the electrical loads 114 to protect them from potentially damaging short circuit conditions, as well as other potential electrical fault conditions.

The number of branch circuits 104, feeder circuits 106, branch circuits 108 connected to feeder circuits, sub-feeder circuits 110 and branch circuits 112 connected to sub-feeder may each be relatively large in number, such as about ten, in different embodiments of the panel 100. In different embodiments, the panel 100 may be assembled with all its circuits and sold as an integral pre-packaged product for a particular load or loads 114, or the panel 100 may alternatively be assembled on site or constructed in a custom manner to meet the needs of a particular load or loads 114. Regardless, the short-circuit current rating of the panel 100 typically must be reliably established, and proper certification marks must be obtained and provided somewhere on the panel 100 prior to being connected to an energized power supply circuit 102.

Not only may the panel 100 entail a large number of circuit devices, but it may include a large number of different types of devices that each may affect the short-circuit rating of the panel as a whole. The power supply circuit 102 represents the first incoming circuit that is connected to the panel 100. and the components in the supply circuit 102 may affect the short-circuit current rating of the panel 100 in use. In different embodiments, the supply circuit 102 may include a disconnect switch or switching mechanism. More specifically, two basic types of supply circuits are conventionally provided for powering electrical control panels such as the panel 100, namely a disconnecting means coupled to a circuit protector such as an overcurrent protector, or a disconnecting means without a circuit protector, including but not limited to a remote disconnector.

The panel 100 may also include one or more branch circuits 104 connected to power supply circuit. The branch circuits 104 may contain protective devices such as overcurrent protection devices designated in portion 104a, and other devices designated in the portion 104b.

Additionally, the panel 100 may include a feeder circuit or circuits 106 connected to the power supply circuit 102, and the feeder circuit 106 may include protective devices such as overcurrent protection devices designated in portion 106a, and other devices designated in the portion 106b. The feeder circuit 106 represents the next level of circuit connection to the panel 100 after the supply circuit 102, and the feeder circuits may include devices connected on the supply side of the branch circuit overcurrent protection device designated in portion 104a.

The panel 100 may also include one or more branch circuits 108 connected to the feeder circuits 106, and the branch circuits 108 may include protective devices such as overcurrent protection devices designated in portion 108a, and other devices designated in the portion 108b.

Sub-feeder circuits 110 may also be provided in the panel 100 and may be connected to the feeder circuits 106. The sub-feeder circuits 110 may include protective devices such overcurrent protection devices designated in portion 110a, and other devices designated in the portion 110b. The sub-feeder circuits 100 may be considered similar to the feeder circuits 106 and are the next level of feeder circuits connected to the panel 100. The sub-feeder circuits 110 may include devices that are connected on the supply side of the branch circuit overcurrent protection device 108a.

Branch circuits 112 may be provided in the panel 100 and connected to the sub-feeder circuits 110. The branch circuits 112 may include protective devices such overcurrent protection devices designated in portion 112a and or other devices designated in the portion 112b. The branch circuits 112 are the final or lowest level of circuits closest to the loads 114 associated with the panel 100, such as a motor, a machine or HVAC equipment as several examples. The branch circuits 112 may include devices that are connected from the last overcurrent protection device in the panel 100 to the load 114. In other words, the branch circuits 112 include the conductors and components following the last overcurrent protection device protecting a load associated with the panel 100.

Considering that a variety of circuit devices exist that may be utilized as overcurrent protection devices and other devices in the various circuits of the panel 100, it should be apparent that the possible combinations of numbers of circuits and the number and type of components connected in the circuits in the panel 100 is substantial. To determine the maximum short-circuit current rating of the panel 100, one would need to know specific details for each component and device used in the circuits 104, 106, 108, 110 and 112. Conventionally, after the components after selected circuit-by-circuit for the panel 100, a search for the short-circuit current rating and other pertinent parameters of the devices, such as IR and $i^2t$ values of each individual circuit component used or device in the panel 100 would typically be undertaken. Such a search may include calling the various manufactures or suppliers of the components used, searching for the information on a manufacturer's website, or by perusing catalogs and publications including the necessary data for selected components. While much of short-circuit current data information is typically publicly available for individual components, finding and extracting the data from various sources for a large number of components offered by different manufacturers is often time and labor intensive. Aside from difficulties in obtaining the information in the first instance, it can sometimes be difficult to know whether the information is current and up-to-date for certain devices.

Researching the individual component ratings for devices and components selected in an proposed panel design may also involve locating the proper standard and learning the process and procedures for determining the panel short-circuit current rating by researching the appropriate Codes and standards. In doing so, one would find that N.E.C. Article 409 and UL 508A provides the industry recognized procedure for determining the short-circuit current rating of the panel 100. Especially for those that are not completely familiar with the applicable Codes and standards, locating the proper standard may also be time and labor intensive. Aside from difficulties in locating the proper standards in the first instance, it can sometimes be difficult to know whether the standards are current and up-to-date as the standards are subject to periodic revision.

Once all the component information has been obtained and the applicable procedures have been identified to analyze a proposed design for the panel 100, one would conventionally have to methodically, and typically manually apply the provisions of N.E.C. Article 409 and U.L. 508A for each component and circuit 104, 106, 108, 110 and 112 in the panel 100 to determine the short current rating assembly of the panel 100 as a whole. Once a result is obtained, it may or not match the short-circuit current rating of any of the individual components used in the panel 100, and it may be difficult to verify that the obtained result is, in fact, accurate. Many opportunities for mistake and misapplication are present, ranging from an improper or incomplete understanding of the procedures used in the analysis, a simple mistake in applying the procedure, reliance upon incorrect or obsolete data in the analysis, failure to account for all components in the analysis, and other error. Thus, it may take considerable time and resources to confirm the analysis result and ensure that the procedures were performed correctly.

Additionally, the interconnected components in the 104, 106, 108, 110 and 112 in the panel 100 may impact the short-circuit current rating of the panel 100 in ways that are neither intuitive nor are readily appreciated by persons performing the analysis. Exactly how the selection of components in each of the circuits 104, 106, 108, 110 and 112 affect the ultimate short-circuit current rating of the panel as a whole is often far from clear, and whether substituting different components in or more of the circuits 104, 106, 108, 110 and 112 would raise, lower or be neutral to the final short-circuit current rating of the entire panel 100 may also be unclear, making it difficult to make design changes in a way that predictably affects the outcome of the analysis.

For all the above reasons, obtaining a panel design that achieves a desired short-circuit current rating for a particular load, while meeting other requirements for controlling power to the loads, is conventionally a trial and error process. From start to finish, the entire evaluation process can be a considerable amount of work and may take days or weeks to accomplish.

The consequences of not obtaining the proper short-circuit current rating can be significant. Any misunderstanding or misapplication of promulgated standards may lead to a failure to obtain certification marks from the standard setting bodies and costly redesign of the panel 100, or conversely may lead to unnecessary analysis and redesign of an otherwise compliant panel 100 on the mistaken belief that the panel 100 does not comply.

II. THE SYSTEM OF THE INVENTION

FIGS. 2-23 illustrate aspects of an exemplary system 150 and FIGS. 24-44 illustrate an exemplary user interface therefore, that in one embodiment is a computer program or software embodied on a computer readable medium and utilizing, for example, a Structured Query Language (SQL) with a client user interface front-end for administration and a web interface for user input, access, and information retrieval and reports by persons interested in assessing and evaluating, for example, a proposed panel design in light of an existing promulgated standard, such as the provisions of N.E.C. Article 409 and U.L. 508A relating to determination of a short-circuit current rating for the panel. The analysis and evaluation system 150 may be web enabled and may be run on a business-entity intranet or alternatively may be fully accessed by individuals having an authorized access outside the firewall of the business-entity through the Internet. In an exemplary embodiment, the analysis and evaluation system 150 may be run in a Windows® NT environment or operating system that is commercially available from Microsoft Corporation of Redmond, Wash. The application may be flexible and designed to run in various different environments without compromising any major functionality.

Figure 2:
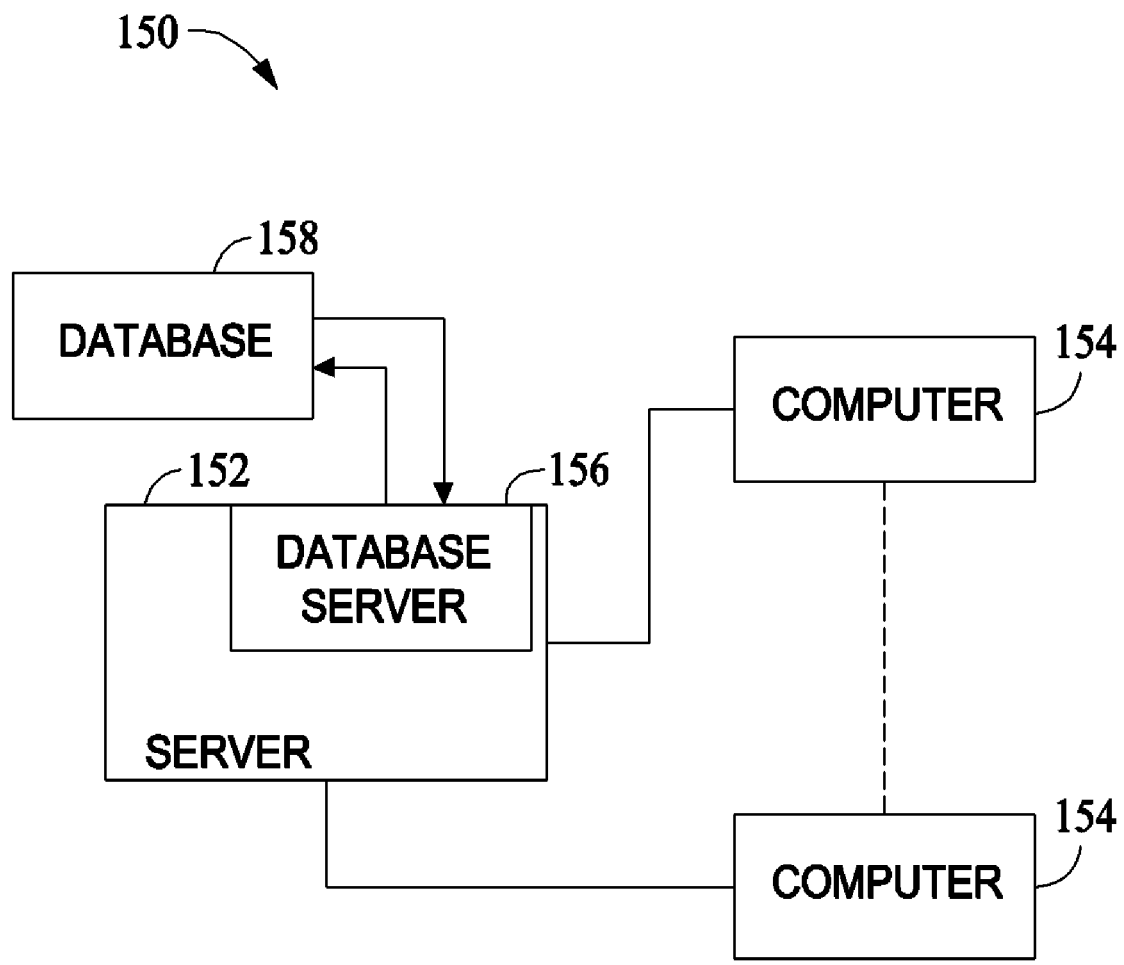
FIG. 2 is a simplified block diagram of an exemplary embodiment of an interactive system for ensuring that the system shown in FIG. 1 complies with promulgated standards.

FIG. 2 is a simplified block diagram of an exemplary embodiment of the analysis and evaluation system 150 including a server system 152, and a plurality of client subsystems, also referred to as client systems 154, connected to the server system 152. Computerized modeling and grouping tools, as described below in more detail, are stored in the server system 152 and can be accessed by a requester at any one of the client systems 154. In one embodiment, the client systems 154 are computers or other electronic devices including a web browser, such that the server system 152 is accessible to the client systems 154 using, for example, the Internet.

The client systems 154 may be interconnected to the Internet through many interfaces including, for example, a network such as a local area network (LAN) or a wide area network (WAN), dial-in-connections, cable modems and special high-speed ISDN lines. The client systems 154 may be any device capable of interconnecting to the Internet including a web-based phone, personal digital assistant (PDA), or other web-based connectable equipment or equivalents thereof. A database server 156 is connected to a database 158 containing information on a variety of matters, as described below in greater detail. In one embodiment, the database 158 is centralized and stored on the server system 152, and the database 158 be accessed by potential users at one of the client systems 154 by logging onto the server system 152 through one of the client systems 154. In an alternative embodiment, the database 158 may be stored remotely from server system 152 and may be non-centralized.

Figure 3:
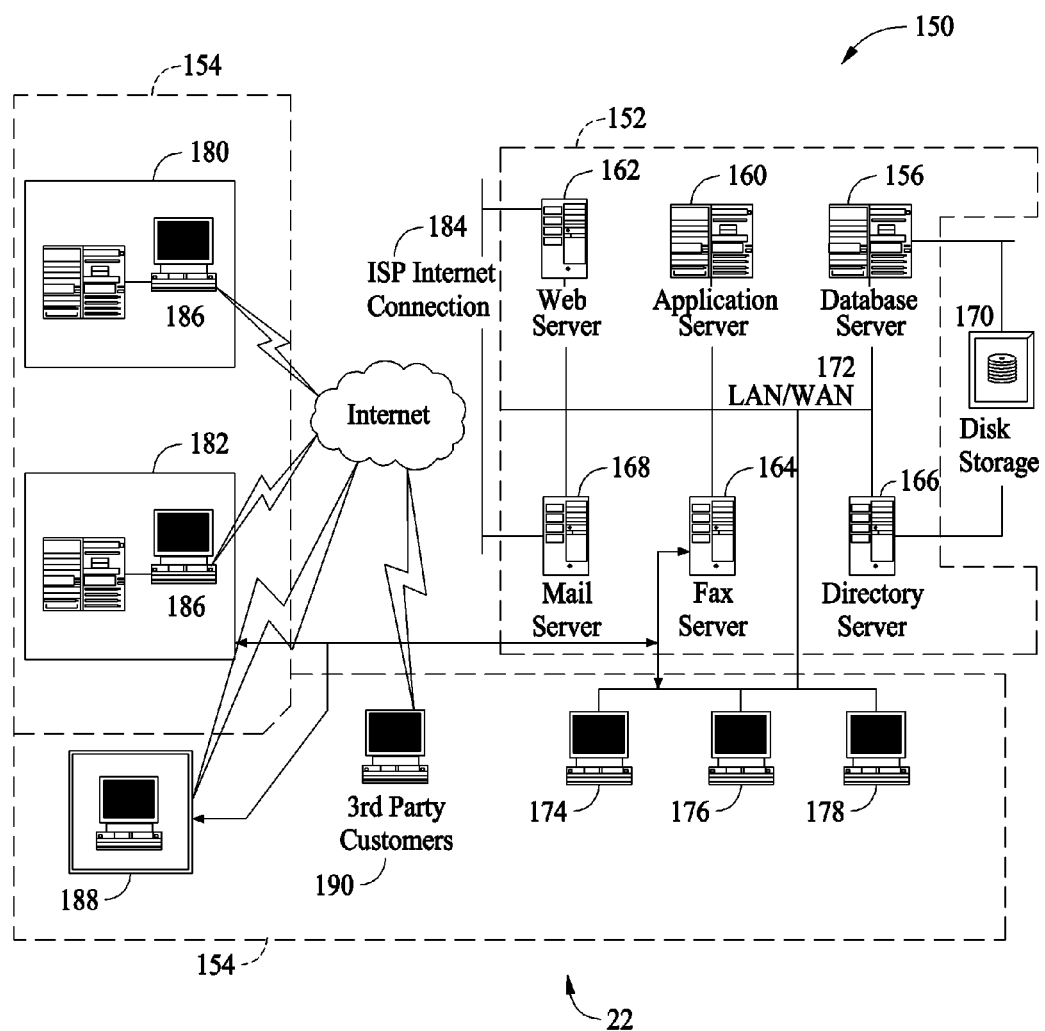
FIG. 3 is an expanded block diagram of an exemplary embodiment of a server architecture of the system shown in FIG. 1.

FIG. 3 is an expanded block diagram of an exemplary embodiment of a server architecture of the analysis and evaluation system 150 including the server system 152 and the client systems 154. The server system 152 may include the database server 156, an application server 160, a web server 162, a fax server 164, a directory server 166, and a mail server 168. A disk storage unit 170 may be coupled to the database server 156 and the directory server 166. The servers 156, 160, 162, 164, 166, and 168 may be coupled in a local area network (LAN) 172. In addition, a system administrator's workstation 174, a user workstation 176, and a supervisor's workstation 178 may be coupled to the LAN 172. Alternatively, workstations 174, 176, and 178 may be coupled to LAN 172 using an Internet link or are connected through an Intranet.

Each workstation 174, 176, and 178 may be a personal computer or other electronic device having a web browser. Although the functions performed at the workstations typically are illustrated as being performed at respective workstations 174, 176, and 178, such functions may be performed at one of many personal computers coupled to the LAN 172. Workstations 174, 176, and 178 are illustrated as being associated with separate functions only to facilitate an understanding of the different types of functions that can be performed by individuals having access to the LAN 172.

The server system 152 in one embodiment is configured or adapted to be communicatively coupled to various individuals via some of the client systems 154, including employees 180 associated with the analysis and evaluation system 150, and to third parties 182 in communication with the server system 152 using, for example, an ISP Internet connection 184. The communication in the exemplary embodiment is illustrated as being performed using the Internet, however, any other wide area network (WAN) type communication can be utilized in other embodiments. That is, the analysis and evaluation system 150, and its operating algorithms and processes described below are not limited to being practiced using the Internet.

In an exemplary embodiment, any authorized individual having a workstation 186, 188 can access the server system 152 via one of the client systems 154. At least one of the client systems 154 includes a manager workstation 188 located at a remote location. Workstations 786 and 188 may be personal computers or other electronic devices having a web browser. Additionally, third party customers may communicate with the server system 152 via a workstation 190 having, for example, a web browser.

The fax server 164 may communicates with remotely located client systems 154, including the workstations 186, 188 and 190. The fax server 164 may be configured or adapted to communicate with other client systems including but not limited to the workstations 174, 176 and 178 as well for reporting purposes.

The functionality and programming of the system is explained in detail below with respect to the methods and processes described below in Part III and the user interface disclosed in Part IV.

III. EXEMPLARY SYSTEM METHODS AND PROCESSES

The technical effect of the processes and systems described herein is achieved when data and information pertaining to a proposed product design or proposed system design, and components and devices utilized in the proposed designs to be considered is entered, transmitted, downloaded or otherwise accepted by the analysis and evaluation system 150. The data and information used by the analysis and evaluation system 150 may be supplied an accepted through any of the workstations connected to the server system 152 as described above, or may be supplied from other sources if desired. Exemplary data and information utilized by the system is described in some detail below.

The data and information supplied to the system 150 may be stored or archived in the aforementioned server system 152, and the data and information may be accessed by the system 150 to permit a reliable assessment, evaluation or analysis of the proposed product design in light of a promulgated industry standard in a dramatically reduced amount of time and labor, while substantially avoiding and eliminating human error.

The processes utilized in the system 150 will now be explained using the example of the electrical control panel 100 shown in FIG. 1, wherein the analysis and evaluation system 150 is configured to efficiently and reliably evaluate and assess a proposed electrical panel design in light of a promulgated industry standards such as the provisions of N.E.C. Article 409 and U.L. 508A pertaining to short-circuit current ratings of the circuit assemblies used in the control panel. As will become evident below, the analysis and evaluation system 150 is operable in an interactive manner in response to user inputs, and in one embodiment displays real time feedback at all stages of analysis. The time and labor required to evaluate a panel design short-circuit current rating is dramatically reduced, while substantially avoiding human misunderstanding and error in applying a rather complex industry standard to a relatively complex assembly in the proposed electrical control panel design.

In the illustrative embodiment, the system analysis and evaluation system 150 utilizing the processes described below is sometimes referred to as an OSCAR™ (Online Short-Circuit Current UL508A Rating) Compliance system. The OSCAR™ Compliance system in one embodiment is a comprehensive web application tool for calculating the short-circuit current rating of a proposed electrical control panel. The OSCAR™ system in one implementation is a database driven tool, where current and up-to-date device details for the control panel design are available and accessible in a database and the user selects the device from drop-down lists and menus. The OSCAR™ system may include large databases storing product details of major electrical components available to electrical control panel designers, sometimes referred to as eligible devices. By providing an up-to-date and accurate database of eligible device details, the user need not separately search for needed information to evaluate a proposed design and/or confirm the accuracy of the information. The system databases may be periodically updated to purge obsolete data and information, make and necessary revisions to the data, include new products and information, or to reflect changes to the standards of interest and information needed to evaluate them. Data and information to be stored in the databases may be directly supplied by device manufacturers, or gathered by responsible third parties.

Additionally, the OSCAR™ system also allows custom device selection by user, so that the user can provide information on custom devices that are not listed or stored in the database or that may not be considered eligible devices, and as such, the system can be extended to operate on circuit components or circuit devices outside of those captured in the system databases. Thus, for example, when new circuit components and devices are introduced to the market that is not yet in the system databases, the component or device may still be considered by the OSCAR™ system as a custom device.

It is to be understood that electrical control panel design and determination of short-circuit current ratings as described herein is but one example of a difficulties faced when evaluating a proposed assembly design in light of promulgated industry standards, and that the analysis and evaluation system 150 could be adapted to address other standards and other proposed product designs and proposed system designs if desired.

For proper operation of the system 150, some attention must be paid to data input and selection processes, and some attention must be paid to processing of the data and information pertaining to the input data and device selections made for a proposed panel design.

A. Data Entry and Device Selection

FIGS. 4-7 illustrate portions of a flowchart concerning exemplary navigational and data entry process 200 utilized by the analysis and evaluation system 150 shown in FIGS. 2 and 3. The navigational and data entry process 200 in one embodiment facilitates user identification and entry of components and devices in a proposed panel design to be evaluated, such as the panel 100 shown in FIG. 1.

Figure 4:
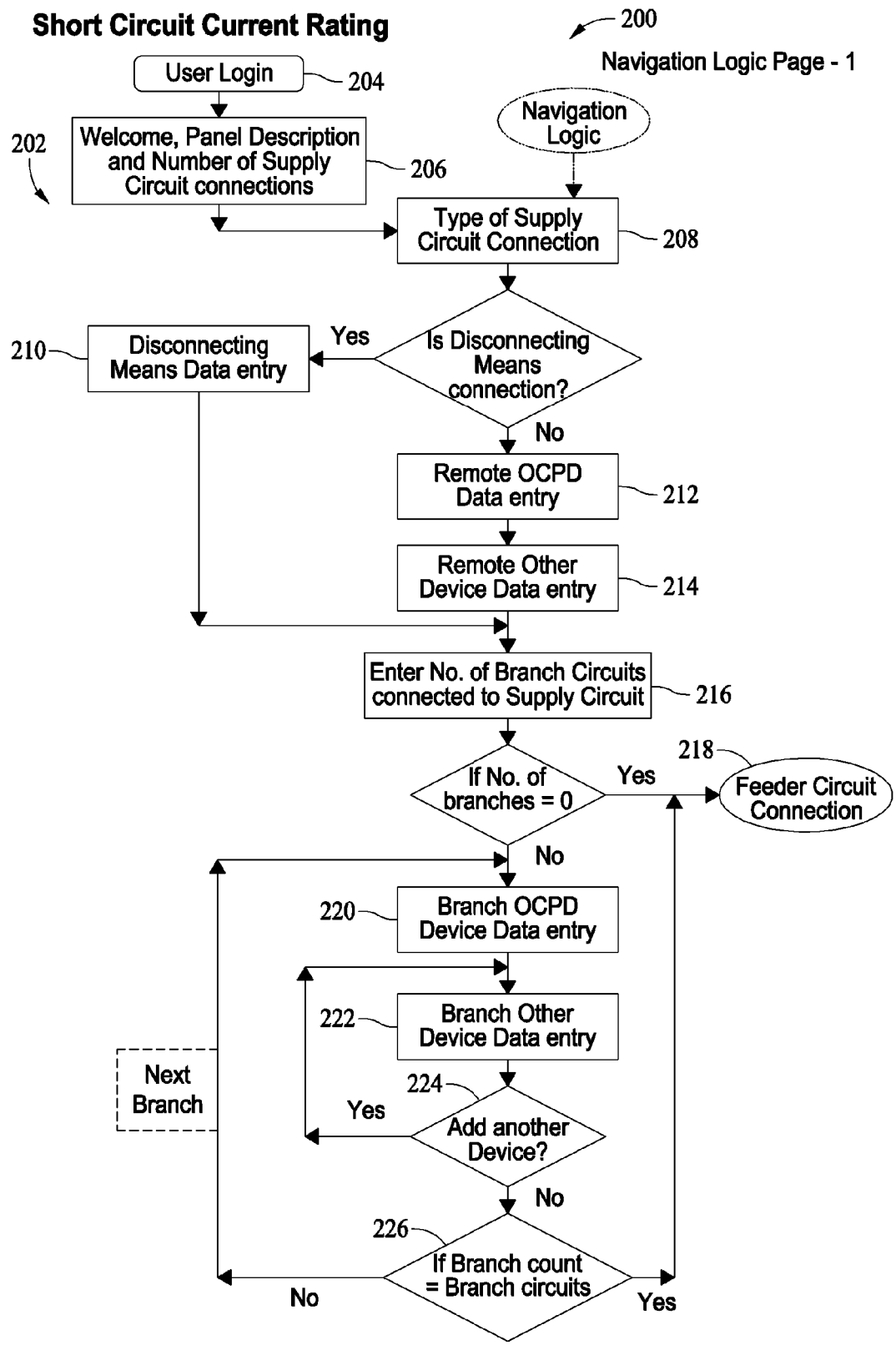

FIG. 4 illustrates a supply circuit connection data entry processing algorithm portion 202 of the navigational and data entry process 200. As shown in FIG. 4, the algorithm portion 202 includes prompting 204 a user to logon to the system 150, and presenting 206 a welcome to the user that facilitates user identification of or description of the electrical control panel to be analyzed, as well as prompting user entry of a number of supply circuits utilized for the proposed control panel to be analyzed.

After the welcome 206 is completed, the system prompts a user to enter or input 208 the type of supply circuit connection to be used with the proposed control panel to be analyzed. As previously mentioned, two types of supply circuits are predominately used in supply circuits, namely a supply circuit having disconnecting means with overcurrent protection, or a remote disconnecting means or disconnecting means without overcurrent protection. As used herein, a supply circuit type of "disconnecting means without overcurrent protection" shall refer to a circuit terminating in a device that provides both a disconnecting means and an overcurrent protection device, such as a fused disconnect switch or circuit breaker. As used herein a supply circuit type of "remote disconnecting means or disconnecting means without overcurrent protection" shall refer to a circuit terminating in a device that does not provide a disconnect function such as a power distribution block or fuse, or a circuit that terminates in a disconnect device that does not include overcurrent protection such as a molded case switch.

Depending on whether the user input or selection at step 208 is a disconnecting means with overcurrent protection or a remote disconnecting means, the system proceeds to prompt data input, selection or entry in steps 210, 212, and 214 for the applicable devices in the control panel to be utilized.

In an exemplary embodiment, when the control panel to be analyzed includes a disconnecting means with overcurrent protection selected at step 210 the system may require selection of one or the following possibilities for the disconnecting means in the supply circuit: a fused pullout device such as a UL 1429 Pullout Switch with Branch Circuit Fuses such as UL 248 Fuses; a Fused Switch such as UL 98 Misc. Switches with Branch Circuit Fuses such as UL 248 Fuses; a circuit breaker such as a UL 489 Circuit Breaker; a Combination Starter-Fusible such as a UL 508—Combination Motor Controller; a Combination Starter such as a UL 508 Combination Motor Controller—with Circuit Breaker; a Combination Starter such as UL 508—Combination Motor Controller with MCP; or a Combination Starter such as a UL 508—Combination Motor Controller with Self Protected Starter.

Further, for each of the possible selections for the disconnecting means at step 210, data and information pertaining to the devices may be entered, input or selected by the user, or alternatively the system may retrieve device data and information from the system database once the device is identified by the user. The data and information may include a manufacturer name, device codes supplied by the manufacturer to identify a specific device, and a short description, name, or title of the device. The data may also include current ratings, voltage ratings, short-circuit current ratings, interrupting ratings, let thru current ratings, $i^2t$ ratings, and other product information of interest needed to analyze, assess, or evaluate the proposed control panel. In one exemplary embodiment, such data and information for a variety of available devices offered from various manufacturers are input by system operators and stored and archived in the databases 154 (FIG. 2) of the system 150 for use by the system without manual entry by the user, although in some embodiments the data and information could be manually entered by the user if desired.

In an exemplary embodiment, when the control panel to be analyzed includes a remote disconnecting means selected at step 212 the system may require selection of one or the following possible devices for the remote disconnecting means in the supply circuit: Branch Circuit Fuses such as UL 248 Fuses; a Circuit Breaker such as a UL 489 Circuit Breaker; or a Fuse or Circuit Breaker—Not Specified.

Further, for each of the possible selections for the remote disconnecting means at step 212, data and information pertaining to the devices may be entered, input or selected by the user, or alternatively the system may retrieve device data and information from the system database once the device is identified by the user. The data may include a manufacturer name, device codes supplied by the manufacturer to identify a specific device, and a short description, name, or title of the device. The data may also include current ratings, voltage ratings, short-circuit current ratings, interrupting ratings, let thru current ratings, $i^2t$ ratings, and other product information of interest needed to analyze, assess, or evaluate the proposed control panel. In one exemplary embodiment, such data and information for a variety of available devices offered from various manufacturers are input by system operators and stored and archived in the databases 154 (FIG. 2) of the system 150 for use by the system without manual entry by the user, although in some embodiments the data and information could be manually entered by the user if desired.

In an exemplary embodiment, when the control panel to be analyzed includes remote disconnecting means selected at step 214 the system may require selection of one or the following possible other devices utilized with the remote disconnecting means in the supply circuit: Branch Circuit Fuses such as UL 248 Fuses in a Fuse holder such as a UL 512 Fuse holder; a Bus Bar System, a GFCI Receptacle (UL 943); a Magnetic Controller, including definite purpose, lighting, or HP rated contactor; a Magnetic Motor Starter—Contactor with Overload Relay such as a UL 508 Magnetic Controller; a Manual Motor Starter—MMP such as a UL 508 Manual Motor Controller; a Molded Case Switch such as a UL 489 Molded Case Switch; a Non-Fused Switch such as a UL 508 Manual Motor Controller; a Non-Fused Switch such as a UL 98 Misc. Switch; an Overload relay (UL 508); Power Conversion Equipment—Drive or Soft-Start (UL 508C); a Receptacle (UL 498); Semiconductor Fuses such as UL 248 Fuses in a Fuse holder such as a UL 512 Fuse holder; Semiconductor Fuses in Power Conversion Equipment—Drive or Soft-Start; a Silicon Control Rectifier (UL508C); a Terminal Block—Power Distribution Block (Recognized to UL 1059) with Feeder Circuit Spacing; a Terminal Block (Recognized to UL 1059) with Branch Circuit Spacing; and a Terminal Block-Power Distribution Block (Listed to UL 1953).

Further, for each of the possible selections for devices selected at step 214, data and information pertaining to the devices may be entered, input or selected by the user, or alternatively the system may retrieve device data and information from the system database once the device is identified by the user. The data may include a manufacturer name, device codes supplied by the manufacturer to identify a specific device, and a short description, name, or title of the device. The data may also include current ratings, voltage ratings, short-circuit current ratings, interruption ratings, let thru current ratings, $i^2t$ ratings, and other product information of interest needed to analyze, assess, or evaluate the proposed control panel. In one exemplary embodiment, such data and information for a variety of available devices offered from various manufacturers are input by system operators and stored and archived in the databases 154 (FIG. 2) of the system 150 for use by the system without manual entry by the user, although in some embodiments the data and information could be manually entered by the user if desired.

Once the data input or selection steps 210, 212 and 214 are performed for the applicable devices of the proposed control panel, the system prompts 216 the user to enter the number of branch circuits connected to the supply circuit for the proposed panel. The prompt may ask the user to enter the number, or ask the user to select the number of branch circuits from a menu or list. In one embodiment, user input selection values of 0 through 10 are made available for user selection of the number of branch circuits connected to the supply circuits in the proposed panel, although input or selection values greater than 10 may be used if desired.

Figure 5:
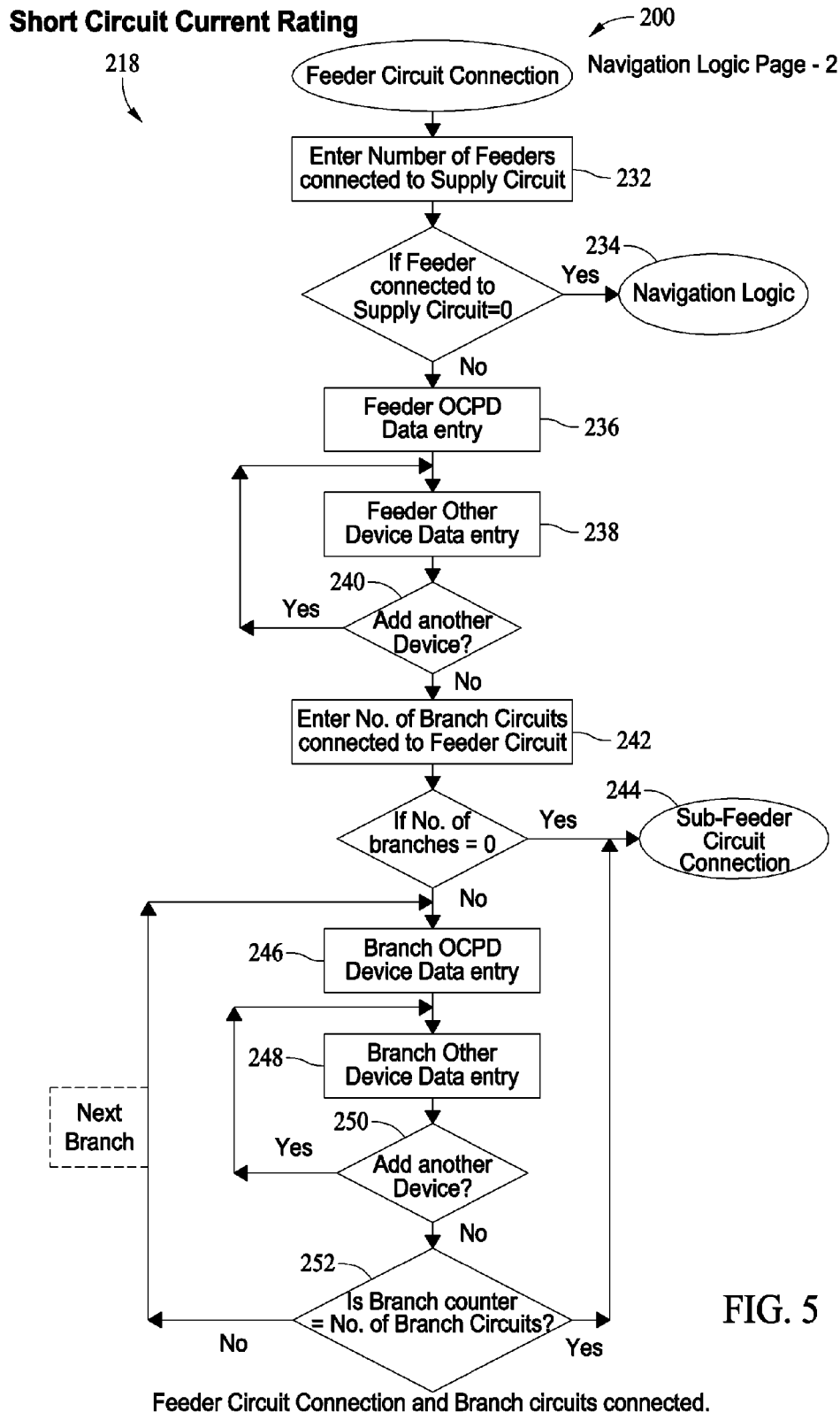

If the user selects or enters 0 for the number of branch circuit connected to supply circuits, the system enters 218 the feeder circuit data entry processing algorithm shown in FIG. 5. If the user selects or enters a non-zero value, the system prompts 220 and 222 the user to input, enter or select an overcurrent protection device for the branch circuit at step 220. At step 222, the system prompts the user to input, enter or select an "other device" for the branch circuit, and also prompts the user to enter whether the branch circuit contains yet another device at step 224. If the user chooses to add another device at step 224, the system returns to step 222. Possible devices to be entered, input or selected for the branch circuits at steps 220, 222 and 224 include any of the devices described above in reference to the steps 210, 212 and 214. It is understood that the devices mentioned in reference to steps 210, 212 and 214 are exemplary only, and that greater or fewer numbers of devices, including devices not listed above, may be may be entered, input or selected in other embodiments of the invention without limitation.

If the user does not choose to add another device at step 224, the system determines 226 whether the branch count obtained from step 216 equals the number of branch circuits entered into the system at steps 220 and 222. If the branch count is less than the number of branch circuits entered by the user, the system returns to step 220 for the next branch to be entered. If the branch count is equal to the number of branch circuits entered by the user, the system enters 218 the feeder circuit data entry processing algorithm shown in FIG. 5.

Turning now to FIG. 5, the feeder circuit data entry processing algorithm portion 218 of the navigational and data entry process 200 is illustrated. The feeder circuit algorithm portion 218 includes prompting 232 the user to enter, input or select the number of feeder circuits connected to the supply circuit. The prompt 232 may ask the user to enter the number of feeder circuits, or ask the user to select the number of feeder circuits from a menu or list. In one embodiment, user input selection values of 0 through 10 are made available for user selection of the number of feeder circuits connected to the supply circuits in the proposed panel, although input or selection values greater than 10 may be used if desired.

If the number of feeder circuits entered, input or selected by the user at step 232 is zero, the systems enters navigation logic 234 as explained below. If the number of feeder circuits entered, input or selected by the user at step 232 is a non-zero value, the system proceeds to prompt the user to input, enter or select an overcurrent protection device for the feeder circuit at step 236. At step 238, the system prompts the user to input, enter or select an "other device" for the feeder circuit, and also prompts the user to enter whether the branch circuit contains yet another device at step 240. If the user chooses to add another device at step 240, the system returns to step 238.

There are two basic types of devices for feeder circuits represented in steps 236 and 238. Possible overcurrent protective devices for feeder circuits to be entered, input or selected by the user at step 236 include Branch Circuit Fuses such as UL 248 Fuses in a Fuse holder such as a UL 512 Fuse holder; Circuit Breakers such as UL 489 Circuit Breakers; Fused Pullouts such as UL 1429 Pullout Switches with Branch Circuit Fuses such as UL 248 Fuses; and Fused Switches such as UL 98 Misc. Switches with Branch Circuit Fuses such as UL 248 Fuses.

Possible other devices for feeder circuits to be entered, input or selected by the user at step 238 include Bus Bar Systems; Magnetic Controllers including includes definite purpose, lighting, or HP rated contactors; molded Case Switches such as UL 489 Molded Case Switches; Non-Fused Switches such as UL 508 Manual Motor Controllers; Non-Fused Switches such as UL 98 Misc. Switches; Terminal Block-Power Distribution Blocks (Listed to UL 1953); Semiconductor Fuses (UL 248 Fuses) in Fuse holder (UL 512 Fuse holder); Silicon Control Rectifiers (UL508C); Terminal Blocks—Power Dist. Blocks (Recognized to UL 1059) with Feeder Circuit Spacing; Transformers (UL 506 or UL 1561); and Multi-Lug Terminals.

It is understood that the devices mentioned in reference to steps 236 and 238 are exemplary only, and that greater or fewer numbers of devices, including devices not listed above, may be entered, input or selected in other embodiments of the invention without limitation.

If the user does not choose to add another device at step 240 for the feeder circuit, the system prompts 242 the user to enter, input or select the number of branch circuits connected to the feeder circuit. The prompt 242 may ask the user to enter the number of branch circuits connected to the feeder circuit, or asks the user to select the number of branch circuits from a menu or list. In one embodiment, user input selection values of 0 through 10 are made available for user selection of the number of branch circuits connected to the feeder circuit in the proposed panel, although input or selection values greater than 10 may be used if desired.

Figure 6:
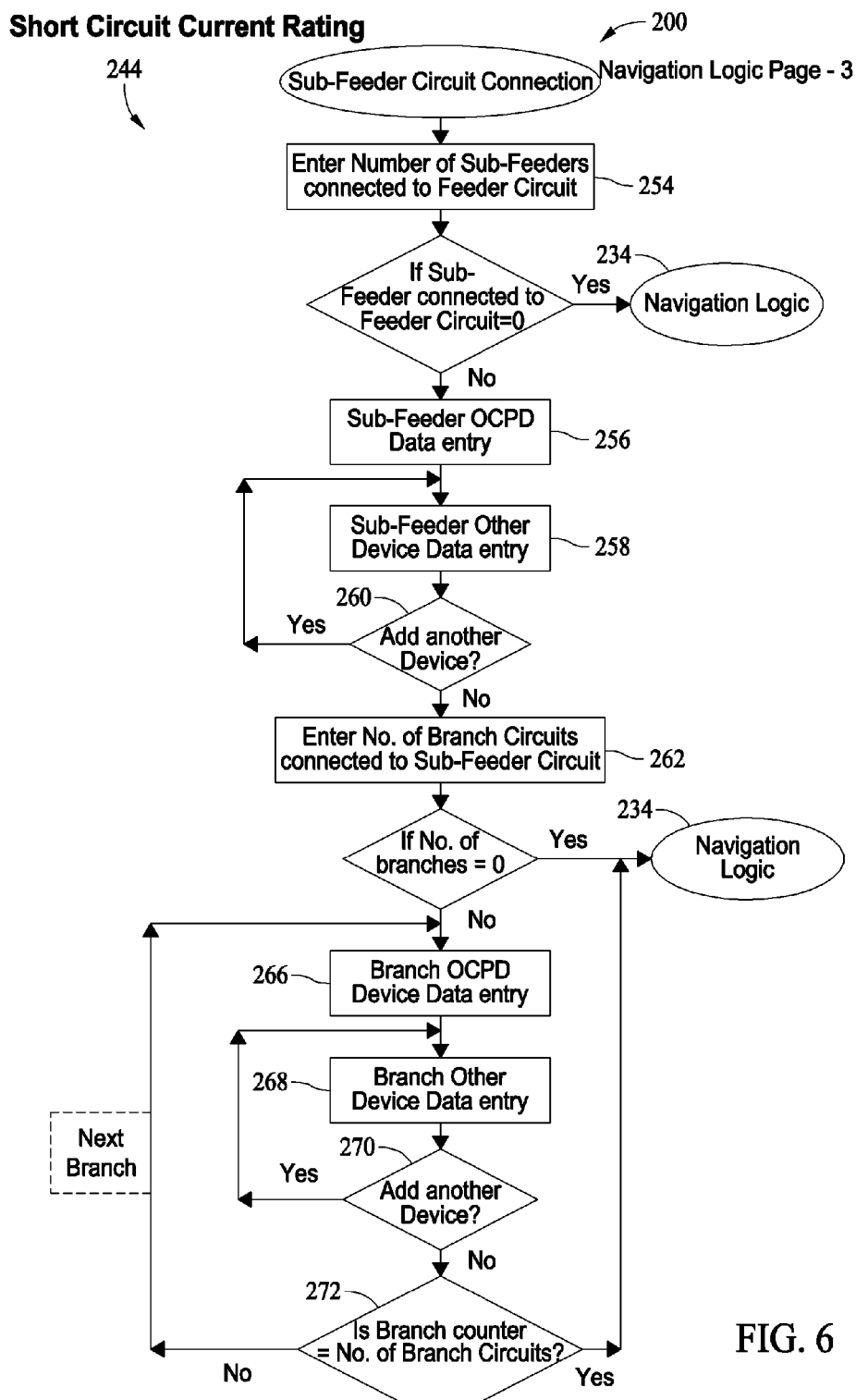

If the number of branch circuits entered, input or selected by the user at step 242 is zero, the systems enters 244 the sub-feeder circuit connection data entry processing algorithm shown in FIG. 6. If the number of branch circuits entered, input or selected by the user at step 242 is a non-zero value, the system proceeds to prompt the user to input, enter or select an overcurrent protection device for the branch circuit at step 246. At step 248, the system prompts the user to input, enter or select an "other device" for the branch circuit, and also prompts the user to enter whether the branch circuit contains yet another device at step 250. If the user chooses to add another device at step 250, the system returns to step 248.

In one embodiment, the possible devices to be entered, input or selected by the user for the branch circuits at steps 246 and 248 may include any of the branch circuit devices described in relation to steps 220 and 222 of FIG. 4. While specific devices are described, it is understood that the devices for the branch circuits are exemplary only, and that other devices may be entered, input or selected by a user in another embodiment.

If the user does not choose to add another device at step 250, the system determines 252 whether the branch count obtained from step 242 equals the number of branch circuits entered into the system at steps 246 and 248. If the branch count is less than the number of branch circuits entered by the user, the system returns to step 246 for the next branch to be entered. If the branch count is equal to the number of branch circuits entered by the user, the system enters 244 the sub-feeder circuit data entry processing algorithm shown in FIG. 6.

FIG. 6 illustrates the sub-feeder circuit connection data entry processing algorithm 244 of the navigational and data entry process 200. The sub-feeder circuit algorithm 244 includes prompting 254 the user to enter, input or select the number of sub-feeder circuits connected to the feeder circuit. The prompt 254 may ask the user to enter the number of sub-feeder circuits, or ask the user to select the number of sub-feeder circuits from a menu or list. In one embodiment, user input selection values of 0 through 10 are made available for user selection of the number of sub-feeder circuits connected to the feeder circuit, although input or selection values greater than 10 may be used if desired.

If the number of sub-feeder circuits entered, input or selected by the user at step 254 is zero, the systems enters navigation logic 234 as explained below. If the number of sub-feeder circuits entered, input or selected by the user at step 254 is a non-zero value, the system proceeds to prompt the user to input, enter or select an overcurrent protection device for the sub-feeder circuit at step 256. At step 258, the system prompts the user to input, enter or select an "other device" for the feeder circuit, and also prompts the user to enter whether the branch circuit contains yet another device at step 260. If the user chooses to add another device at step 260, the system returns to step 258.

There are two basic types of devices for sub-feeder circuits represented in steps 256 and 258. Possible overcurrent protective devices for sub-feeder circuits to be entered, input or selected by the user at step 256 include Branch Circuit Fuses such as UL 248 Fuses in a Fuse holder such as a UL 512 Fuse holder; Circuit Breakers such as UL 489 Circuit Breakers; Fused Pullouts such as UL 1429 Pullout Switches with Branch Circuit Fuses such as UL 248 Fuses; and Fused Switches such as UL 98 Misc. Switches with Branch Circuit Fuses such as UL 248 Fuses.

Possible other devices for feeder circuits to be entered, input or selected by the user at step 258 include Bus Bar Systems; Magnetic Controllers including includes definite purpose, lighting, or HP rated contactors; molded Case Switches such as UL 489 Molded Case Switches; Non-Fused Switches such as UL 508 Manual Motor Controllers; Non-Fused Switches such as UL 98 Misc. Switches; Terminal Block-Power Distribution Blocks (Listed to UL 1953); Semi-conductor Fuses (UL 248 Fuses) in Fuse holder (UL 512 Fuse holder); Silicon Control Rectifiers (UL508C); Terminal Blocks—Power Dist. Blocks (Recognized to UL 1059) with Feeder Circuit Spacing; Transformers (UL 506 or UL 1561); and Multi-Lug Terminals.

It is understood that the devices mentioned in reference to steps 256 and 258 are exemplary only, and that greater or fewer numbers of devices, including devices not listed above, may be entered, input or selected in other embodiments of the invention without limitation.

If the user does not choose to add another device at step 260 for the feeder circuit, the system prompts 262 the user to enter, input or select the number of branch circuits connected to the sub-feeder circuit. The prompt 262 may ask the user to enter the number of branch circuits connected to the sub-feeder circuit, or asks the user to select the number of branch circuits from a menu or list. In one embodiment, user input selection values of 0 through 10 are made available for user selection of the number of branch circuits connected to the sub-feeder circuit in the proposed panel, although input or selection values greater than 10 may be used if desired.

Figure 7:
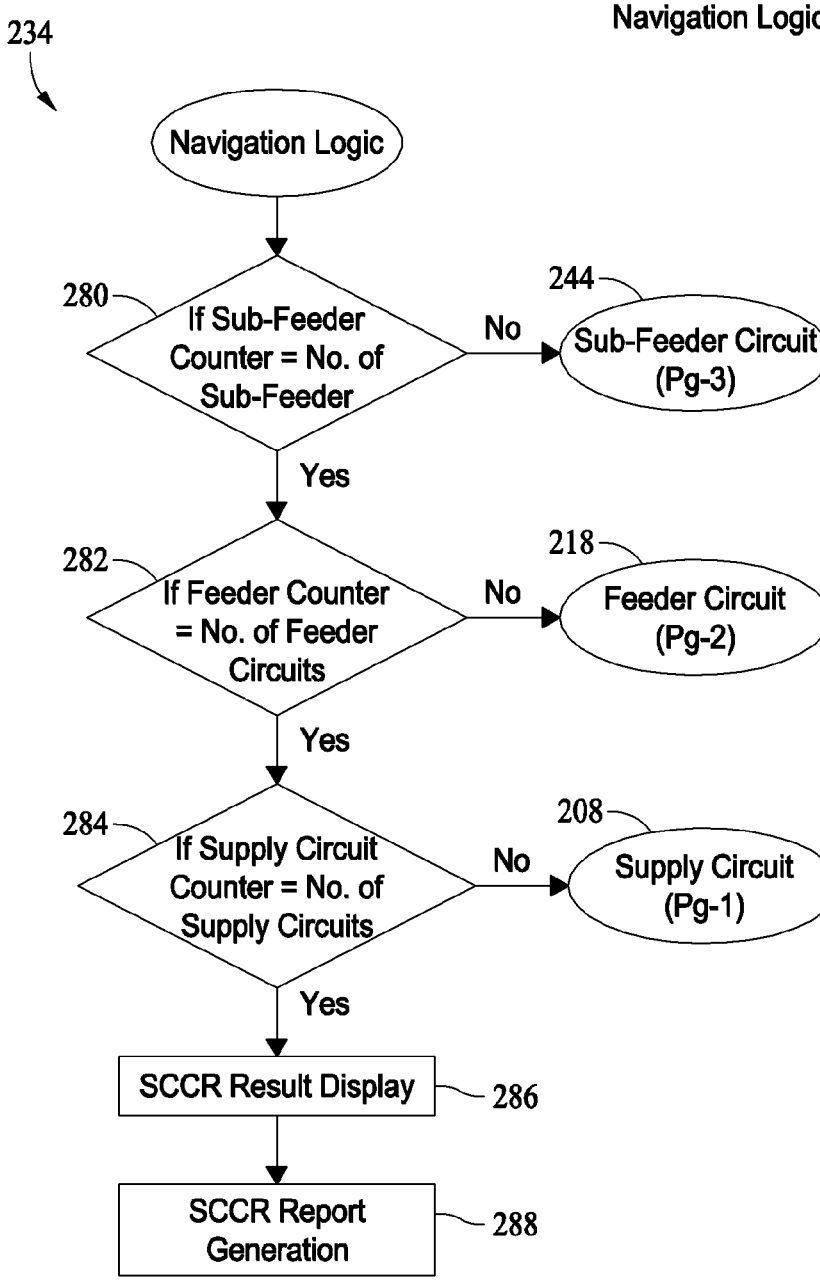

If the number of branch circuits entered, input or selected by the user at step 262 is zero, the systems enters 234 the navigation logic algorithm shown in FIG. 7. If the number of branch circuits entered, input or selected by the user at step 262 is a non-zero value, the system proceeds to prompt the user to input, enter or select an overcurrent protection device for the branch circuit at step 266. At step 268, the system prompts the user to input, enter or select an "other device" for the branch circuit, and also prompts the user to enter whether the branch circuit contains yet another device at step 270. If the user chooses to add another device at step 270, the system returns to step 268.

In one embodiment, the possible devices to be entered, input or selected by the user for the branch circuits at steps 266 and 268 may include any of the branch circuit devices described in relation to steps 220 and 222 of FIG. 4. While specific devices are described, it is understood that the devices for the branch circuits are exemplary only, and that other devices may be entered, input or selected by a user in another embodiment.

If the user does not choose to add another device at step 270, the system determines 272 whether the branch count obtained from step 262 equals the number of branch circuits entered into the system at steps 266 and 268. If the branch count is less than the number of branch circuits entered by the user, the system returns to step 266 for the next branch to be entered. If the branch count is equal to the number of branch circuits entered by the user, the system enters 234 navigation logic algorithm shown in FIG. 7.

Turning now to FIG. 7, the navigational logic algorithm 234 includes determining 280 whether the sub-feeder count obtained from step 254 in FIG. 6 is equal to the number of sub-feeder circuits entered into the system. If the sub-feeder count is less than the number of sub-feeder circuits entered into the system, the system returns to the sub-feeder circuit connection data entry processing algorithm 244.

If the sub-feeder count is equal to the number of sub-feeder circuits entered into the system, the system determines 282 whether the feeder count obtained from step 232 in FIG. 5 is equal to the number of feeder circuits entered into the system. If the feeder count is less than the number of feeder circuits entered into the system, the system returns to the feeder circuit connection data entry processing algorithm 218.

If the feeder count is equal to the number of feeder circuits entered into the system, the system determines 284 whether the supply circuit count obtained from step 206 in FIG. 4 is equal to the number of supply circuits entered into the system. If the supply circuit count is less than the number of supply circuits entered into the system, the system returns to the supply circuit data entry processing algorithm 202 at step 208.

By virtue of the steps 280, 282 and 284, the system is ensured of completely accounting for all circuits in the electrical panel and to account for all the circuits in the assessment or evaluation of the control panel. Human error associated with the failure to consider all the devices in all of the circuits in the panel is avoided.

If the supply circuit count at step 284 is equal to the number of supply circuits entered into the system, the system applies the promulgated standard of interest to the components or devices entered, input or selected by the user, and displays 286 the result, such as the short-circuit current rating of the electrical control panel per N.E.C. Article 409 and U.L. 508A as explained below, to the user. Additionally, the system generates 288 a detailed report for analysis by the user. As will become evident below, the system in one embodiment displays the result at each step of the analysis as the component devices of the supply circuits, feeder circuits, sub-feeder circuits and associated branch circuits are entered, input or selected by the user. Display of the result at each step provides feedback to the user at each step and provides some ability for the user to understand how certain devices impact the ultimate result obtained.

Algorithms for obtaining the processing of data and information inputs to generated outputs to be displayed to the user will now be explained.

B. Data Analysis Processes

FIGS. 8-23 illustrate portions of exemplary data analysis processes utilized by the system 150 shown in FIGS. 2 and 3 and which operate upon the data entered, input, selected or otherwise obtained with the navigational and data entry process 200 shown in FIGS. 4-7. Corresponding steps of FIGS. 4-7 and FIGS. 8-23 will be indicated with like reference characters in FIGS. 8-23 considering the overlap between the data analysis processes and the navigational and data entry processes. It is to be understood that while for the sake of description the data analysis processes and the navigational and data analysis processes are separately discussed herein, the data analysis processes and the navigational and data analysis processes operate in tandem as the user interacts with the system 150 as further explained below.

FIGS. 8-23 will be described in the context of an exemplary proposed panel design having one supply circuit, one feeder circuit, two branch circuits connected to the feeder circuit, one sub-feeder circuit and one branch circuit connected to the sub-feeder circuit. The selection of the components used in this example will also be explained in reference to the user interface and displays demonstrated in FIGS. 24-44 set forth below.

Figure 8:
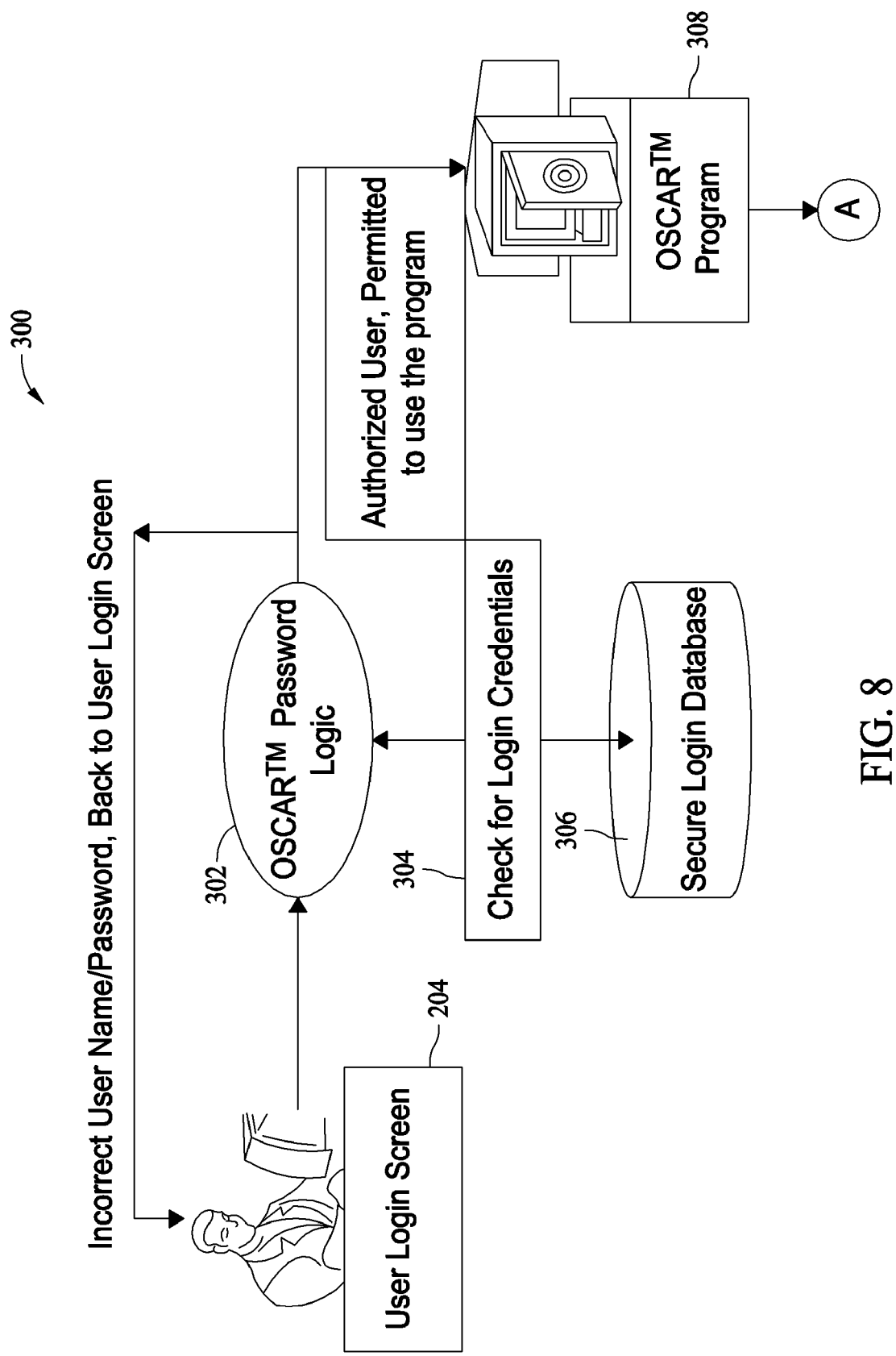

FIG. 8 illustrates an exemplary logon processing algorithm 300 for the analysis and evaluation system 150. The logon algorithm 300 may include prompting 204 the user to login to the system using a unique user-specified name and password. Once the name and password are entered by the user, the system processes 302 the name and password and compares the user name and password to login credentials 304 stored in a secure login database 306 on the system. If the credentials of the user name and password match a name and password stored in the database 306, the system determines that the user is authorized and enters 308 a main program algorithm, which in one embodiment may begin with the supply circuit data collection and navigation algorithm 202 shown in FIG. 4.

If the user name and password entered by a user do not match the credentials stored in the database 306 at step 302, the system returns to prompt 204 the user to login with a valid name and password. If the user forgets his or her username or password, username and password retrieval steps may be implemented with appropriate security measures may be provide to assist the user.

Figure 9:
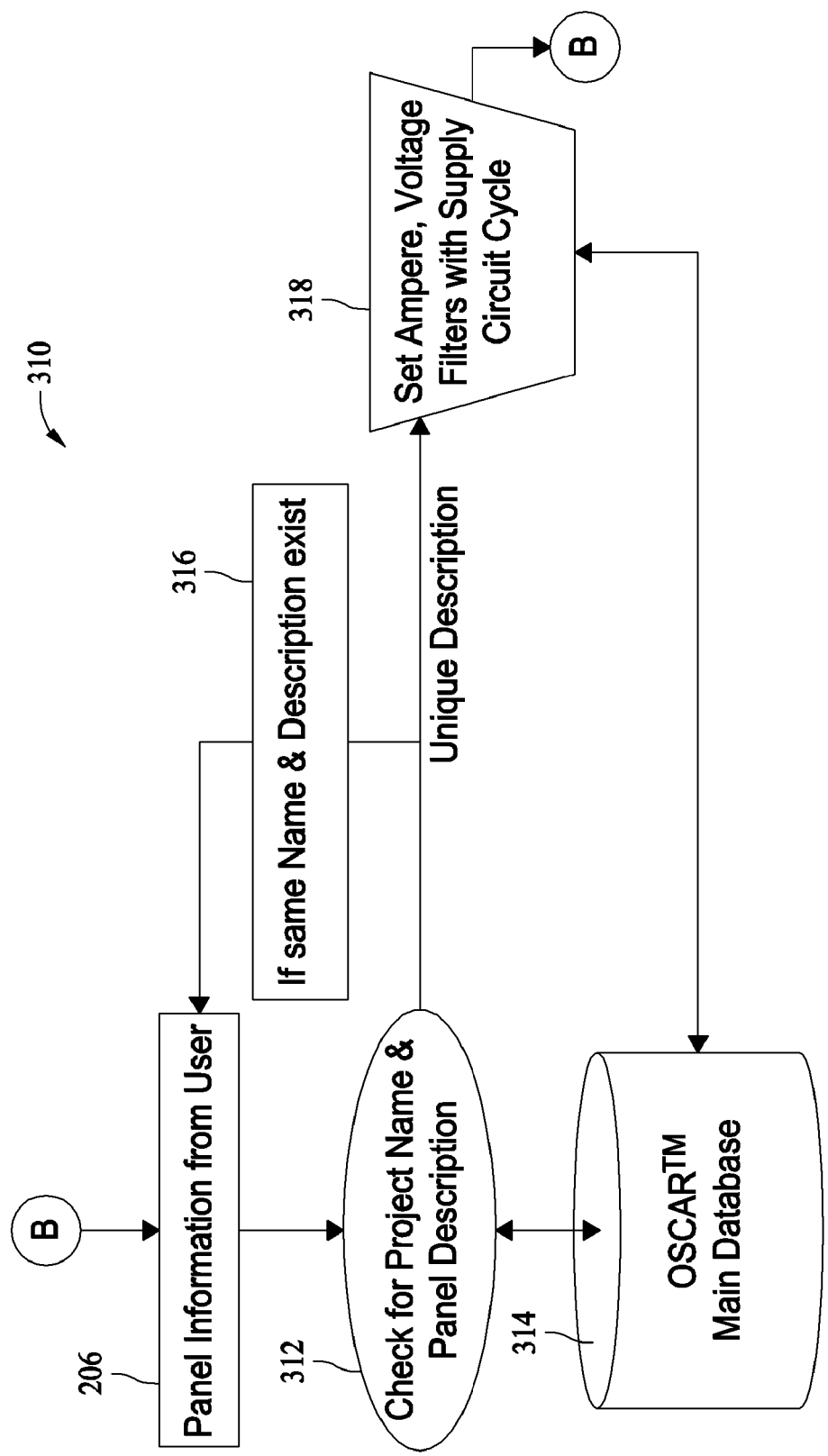

FIG. 9 illustrates a project information processing algorithm 310 that may be implemented in conjunction with the user welcome 206 as shown in FIG. 4 after a successful login by the user. At step 206, the user is prompted to enter panel information relating to the proposed electrical panel design. In an exemplary embodiment, the information includes a Project Name, a Panel Designation, an Ampere Rating of the Panel, a Voltage Rating of the Panel and a number of supply circuits connected to the Panel, although it is appreciated that other information may be prompted by the system for user entry if desired.

Once the panel information is obtained from the user at step 206, the system checks 312 the Project Name and Panel Description against project names and panel descriptions stored in a main database 314 of the system. If at step 316, the entered Project Name and Panel Description are found to exist in the database 314, the system returns to prompt 206 the user to re-enter panel information. Providing unique panel information for each project specified by a user increases the security of the system and prevents a user from creating multiple projects having the same name, but involving different panels and potentially confusing or inconsistent results.

As shown in FIG. 9, if a unique panel name and description are entered, the system sets 318 filters for the database so that available device selections presented to a user from the database are consistent with the user-entered Ampere Rating of the Panel, Voltage Rating of the Panel and Supply Circuit Cycle for the project.

Figure 10:
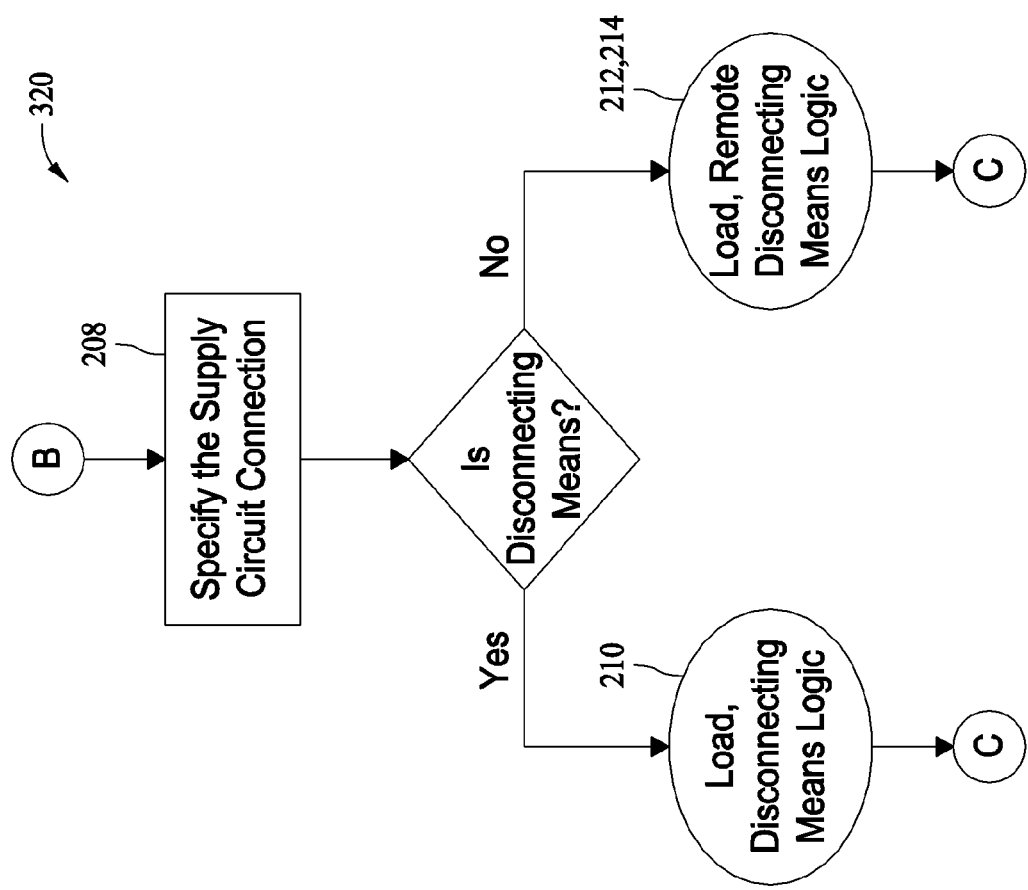

FIG. 10 illustrates a portion of a supply circuit type selection processing algorithm 320 utilized by the program after the project information processing algorithm 310 of FIG. 9 is completed. The supply circuit type processing algorithm 320 includes the steps 210 and 212, 214 as described above in relation to FIG. 4 wherein the user enters, inputs, or selects the devices utilized in the supply circuit for the project.

Figure 11:
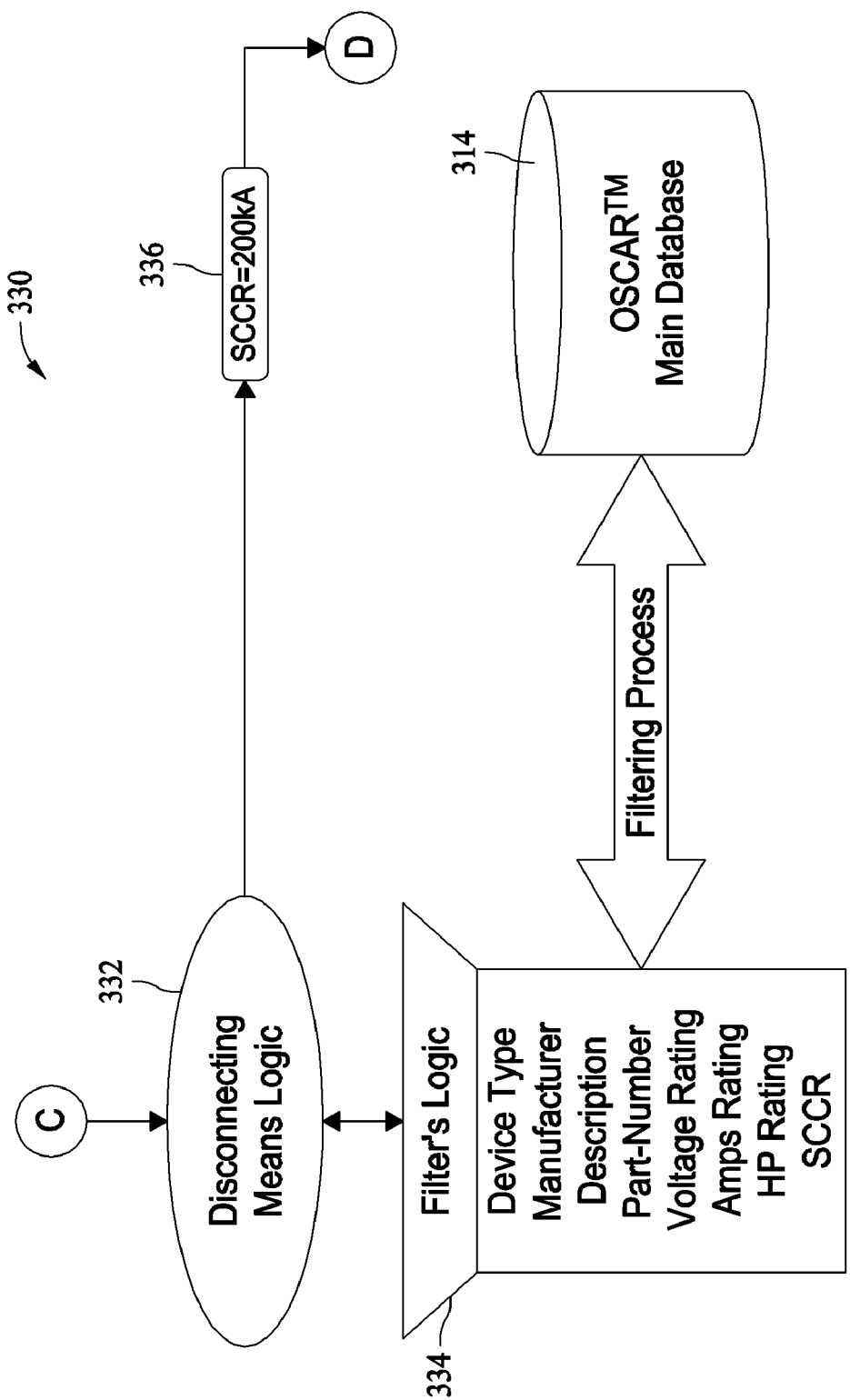

FIG. 11 illustrates a supply circuit component selection processing algorithm 330 that the system performs after the algorithm 320 of FIG. 10. The supply circuit component selection processing algorithm 330 includes entering 332 a logic loop wherein the main system database 314 is filtered to obtain device data and information corresponding to the selected component devices in the algorithm 320 for the supply circuit. Via the filtering process, complete information regarding the selected devices is obtained at step 334, including, for example, device type codes, manufacturer names, device descriptions, device part-numbers, device voltage ratings, device current ratings, HP ratings, and (short-circuit current ratings (SCCR ratings) for the selected devices. Once the information is obtained at step 334, the system displays 336 the short-circuit current rating for the supply circuit, which in one example may be found to be 200 kA as shown in FIG. 11.

Figure 12:
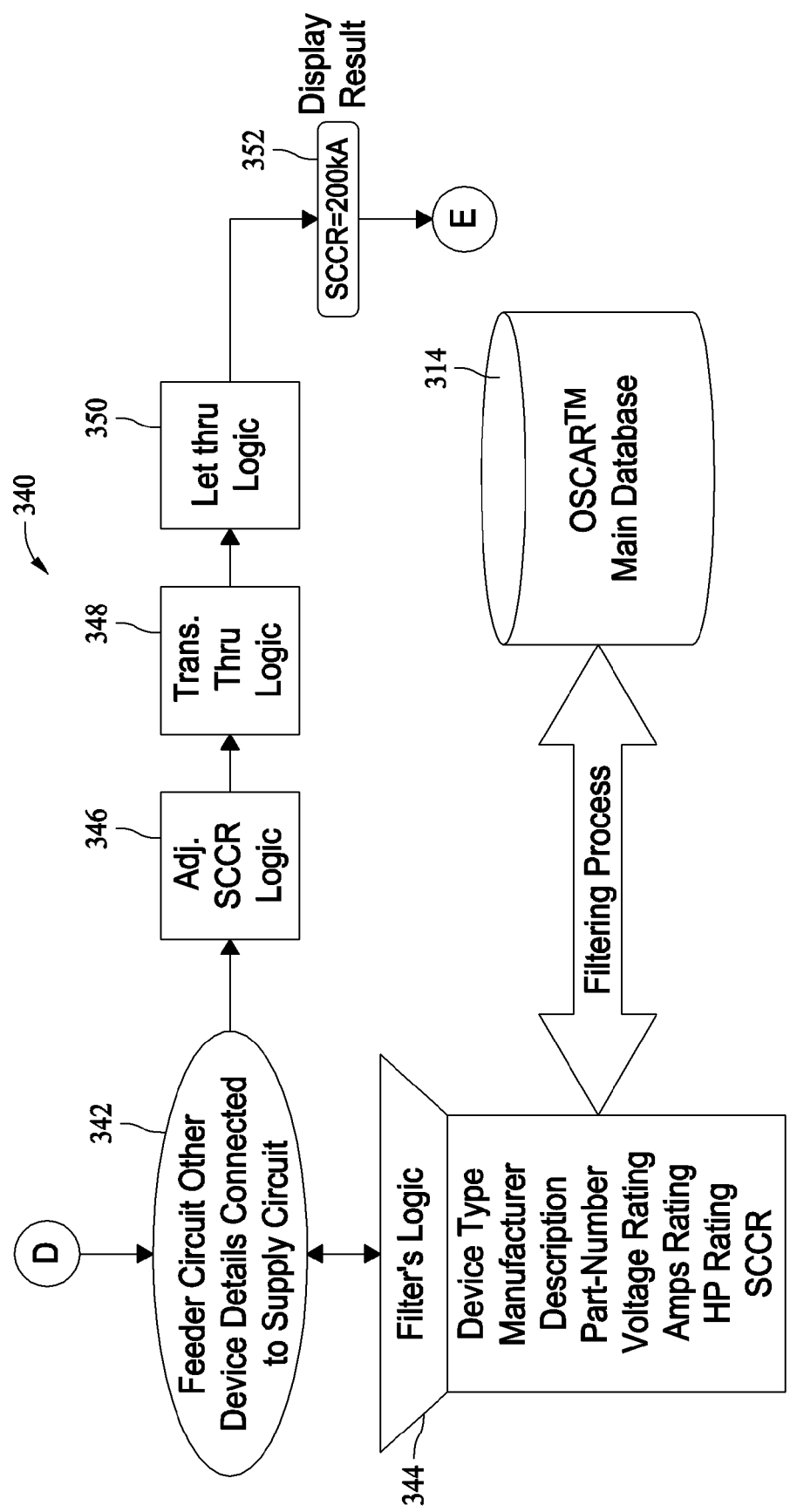

FIG. 12 illustrates a feeder circuit component analysis processing algorithm 340 to be performed after the supply circuit processing algorithm shown in FIG. 11. The feeder circuit component analysis processing algorithm 340 operates on the user inputs from the feeder circuit data collection and navigation algorithm 218 shown in FIG. 5.

The feeder circuit component selection processing algorithm 340 includes entering 342 a logic loop wherein the main system database 314 is filtered to obtain device data and information corresponding to the selected component devices in the algorithm 218 at steps 236 and 238 (FIG. 5) for the feeder circuit. Via the filtering process, complete information regarding the selected devices is obtained at step 344, including, for example, device type codes, manufacturer names, device descriptions, device part-numbers, device voltage ratings, device current ratings, HP ratings, and SCCR ratings for the selected devices. Once the information is obtained at step 344, the system enters a series of logic loops 346, 348, 350 applying the procedures of U.L. 508A to the obtained information to determine the short-circuit current rating of the supply circuit and the connected feeder circuit.

More specifically, the system at step 346 enters an Adjusted SCCR Logic Loop that evaluates whether devices connected in the upstream circuit or immediately preceding circuit in the panel, such as the supply circuit, may increase the short-circuit current rating of the feeder circuit. At step 348 the system enters a Trans. thru Logic loop that evaluates the effects of an upstream transformer on the short-circuit current rating of the feeder circuit. At step 350, the system enters a Let Thru Logic Loop that evaluates let-thru currents of overcurrent protection devices as they open or otherwise operate in a short-circuit current condition and the effects of let-thru currents on the rating of the panel. Once the steps 346, 348 and 350 are performed on the information obtained at step 348, the system displays 352 the short-circuit current rating for combination of the supply circuit and the feeder circuit, which in one example may be found to be 200 kA as shown in FIG. 12.

While the exemplary SCCR values displayed in FIGS. 11 and 12 match one another, it is noted that for certain combinations of devices in the supply circuit and the feeder circuit the values obtained and displayed in the algorithms 330 and 340 of FIGS. 11 and 12 will not match one another.

Figure 13:
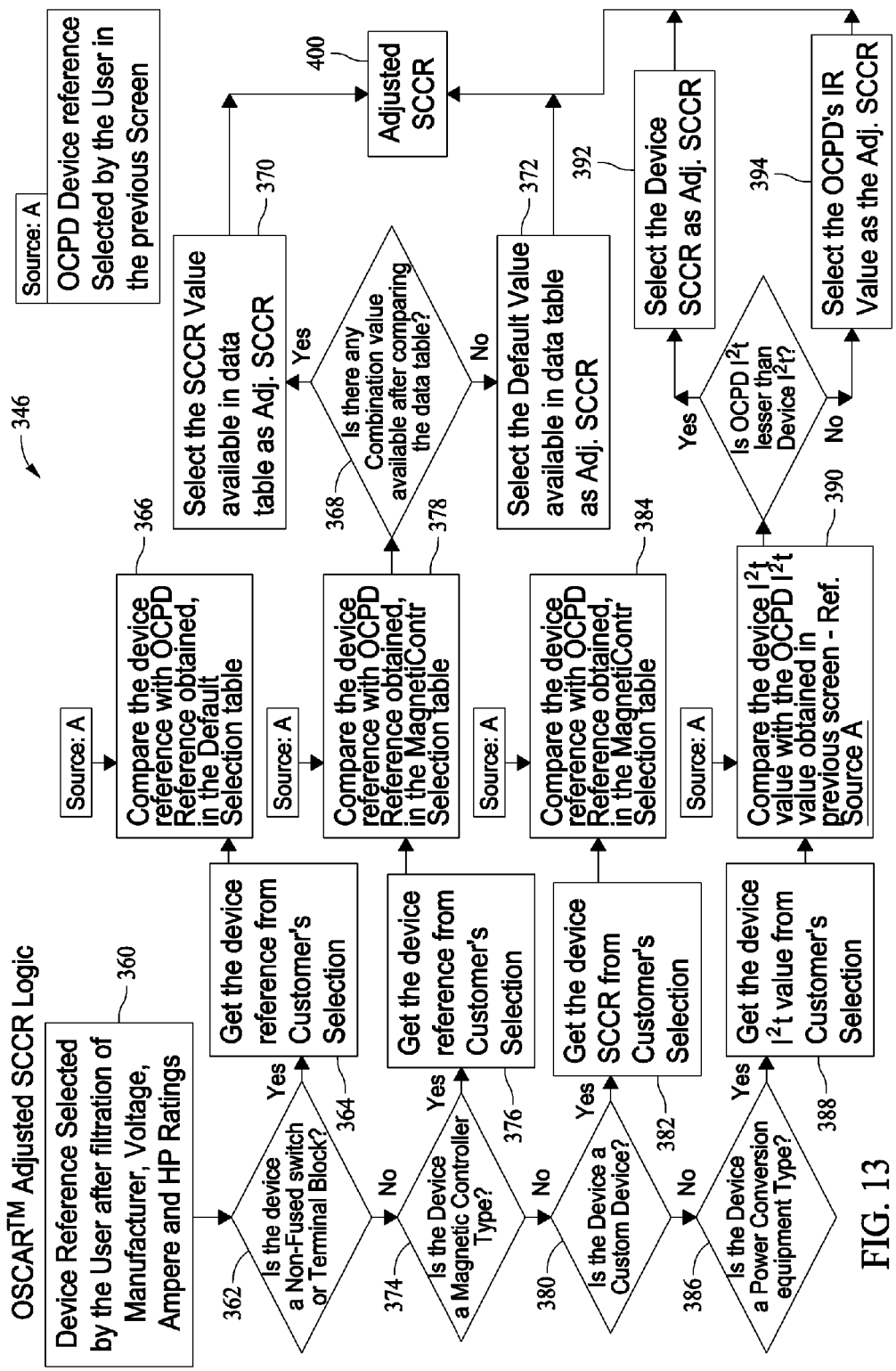

FIG. 13 illustrates the Adjusted SCCR Logic Loop 346 which is operable not only on the feeder circuit devices of the algorithm 340 of FIG. 12, but on branch circuits connected to the feeder circuits, sub-feeder circuits, and branch circuits connected to the sub-feeder circuits as will become apparent below.

The Adjusted SCCR Logic Loop 346 begins with supplying 360 information selected by the user after the system filtration of manufacturer, voltage rating, current rating, and HP ratings in the main database of the system. Once the information is supplied 360, the system determines whether the information pertains to a non-fuse switch or terminal block at step 362.

If the information corresponds to a non-fuse switch or terminal block at step 362, the system retrieves 364 the short-circuit current rating (SCCR) for the non-fuse switch or terminal block from the main database. The retrieved rating at step 364 is then compared at step 366 with a short-circuit rating of the overcurrent protection device (OCPD) selected by the user for preceding circuit in the proposed panel that is being analyzed. That is, for a feeder circuit, the preceding circuit would be the supply circuit. For a sub-feeder circuit the preceding circuit would be the feeder circuit. For branch circuits the preceding circuit would be the supply circuit, feeder circuit or sub-circuit to which the branch is connected.

Using the retrieved value at step 364 and the rating for the OCPD of the preceding circuit, the system looks to a default selection table including combination short-circuit ratings for various OPCD values and retrieved values for non-fuse switches or terminal blocks connected to one another. The combination ratings may be separately calculated or empirically determined to populate the default selection table.

At step 368, if the default selection table includes a combination short-circuit rating for the retrieved value and the OPCD value, the system selects 370 the combination rating from the selection table as the Adjusted SCCR value. If there is no combination short circuit-rating for the retrieved value and the OPCD value at step 368, the system selects 372 a default value, also contained in the default selection table, as the Adjusted SCCR Value.

If at step 362 the selected device does not correspond to a non-fused switch or terminal block, the system determines at step 374 whether the selected device information at step 360 corresponds to a magnetic controller type device.

If the information corresponds to a magnetic controller type device at step 374, the system retrieves 376 the SCCR for the magnetic controller type device from the main database. The retrieved rating at step 376 is then compared at step 378 with a short-circuit rating of the overcurrent protection device (OCPD) utilized in the preceding circuit in the panel. Using the retrieved value at step 376 and the rating for the OPCD, the system looks to a default selection table including combination short-circuit ratings for various OPCD values and retrieved values for magnetic controller type device when connected to one another. The combination ratings may be separately calculated or empirically determined to populate the default selection table.

At step 368, if the default selection table includes a combination short-circuit rating for the retrieved value and the OPCD value, the system selects 370 the combination rating from the selection table as the Adjusted SCCR value. If there is no combination short circuit-rating for the retrieved value and the OPCD value at step 368, the system selects 372 a default value, also contained in the default selection table, as the Adjusted SCCR Value.

If at step 374 the selected device does not correspond to a magnetic controller type device, the system determines at step 380 whether the selected device information at step 360 corresponds to a custom device that is not in the main database as a selectable device. For a custom device, the user manually enters the pertinent device information into the system, such as the manufacturer of the device, the voltage rating, the current rating, and the HP rating of the device.

If the information corresponds to a custom device at step 380, the system retrieves 382 the user-entered SCCR for the custom device. The retrieved rating at step 382 is then compared at step 384 with a short-circuit rating of the overcurrent protection device (OCPD) selected by the user for preceding circuit in the panel. Using the retrieved value at step 382 and the rating for the OPCD, the system looks to a default selection table including combination short-circuit ratings for various OPCD values and retrieved values for devices when connected to one another. The combination ratings may be separately calculated or empirically determined to populate the default selection table.

At step 368, if the default selection table includes a combination short-circuit rating for the retrieved value and the OPCD value, the system selects 370 the combination rating from the selection table as the Adjusted SCCR value. If there is no combination short circuit-rating for the retrieved value and the OPCD value at step 368, the system selects 372 a default value, also contained in the default selection table, as the Adjusted SCCR Value.

If at step 380 the selected device does not correspond to a custom device, the system determines at step 386 whether the selected device information at step 360 corresponds to a power conversion equipment type of device.

If the selected device information corresponds to a power conversion equipment type of device, the system retrieves 386 an $i^2t$ value for the selected device from the main database. The retrieved rating at step 388 is then compared at step 390 with an $i^2t$ value for the overcurrent protection device (OCPD) selected by the user for the preceding circuit in the panel.

If the $i^2t$ value of the OPCD is less than the $i^2t$ value of the selected power conversion equipment type device, the system selects 392 the SCCR value for the power conversion equipment type device as the Adjusted SCCR value.

If the $i^2t$ value of the OPCD is greater than the $i^2t$ value of the selected power conversion equipment type device, the system selects 394 an IR value for the OPCD, also stored in the main database, as the Adjusted SCCR value.

Figure 14:
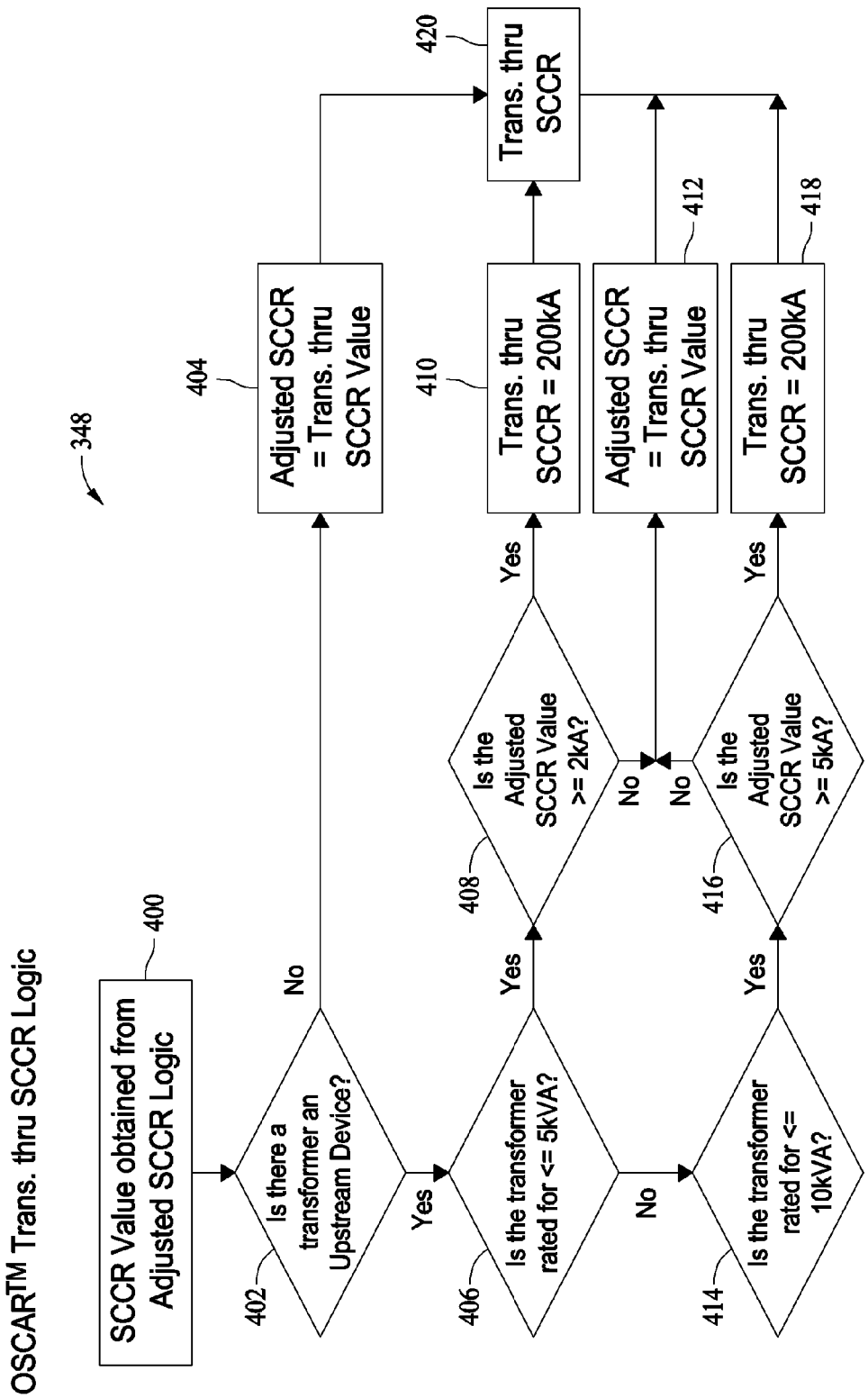

FIG. 14 illustrates the Trans. thru SCCR Logic loop 348. The Trans. thru SCCR Logic loop begins with the output of the Adjusted SCCR Logic loop 346 of FIG. 13 at one of the steps 370, 372, 392, or 394 wherein the Adjusted SCCR value is selected. The system then determines whether there is an upstream transformer in the preceding circuits in the panel. The system looks to upstream device selections to determine whether or not a transformer is present.

If at step 402 there is no upstream transformer, the Trans. Thru SCCR value output is set 404 equal to the Adjusted SCCR value at step 400.

If there is an upstream transformer at step 402, the system determines at step 406, based upon the transformer selected by the user and its corresponding data in the main database, whether or not the transformer has a rating that is less than a first predetermined amount, such as 5 kVA in one example. If the transformer rating is less than the first predetermined amount, the system determines whether Adjusted SCCR value at step 400 is greater than a predetermined amount or threshold, such as 2 kA in one example, that corresponds to the SCCR rating of the previous circuit analyzed, such as the result at step 336 in FIG. 11 for the supply circuit when the circuit presently being evaluated is a feeder circuit. If the Adjusted SCCR value is greater than this predetermined threshold at step 408, the system sets 410 the Trans. through SCCR value equal to the SCCR rating of the previous circuit analyzed. When the Adjusted SCCR value is less than the predetermined threshold at step 408, the system sets 412 the Trans. through SCCR value equal to Adjusted SCCR value of step 400.

If the transformer rating is not less than the first predetermined threshold at step 406, the system proceed to determine at step 414, based upon the transformer selected by the user and its corresponding data in the main database, whether or not the transformer has a rating that is less than a second predetermined amount that is greater than the first predetermined amount, such as 10 kVA in one example. If the transformer rating is less than the second predetermined amount, the system determines 416 whether the Adjusted SCCR value at step 400 is greater than the first predetermined amount of step 406.

If the Adjusted SCCR value is greater than the second predetermined amount at step 416, the system sets 418 the Trans. through SCCR value equal to the SCCR rating of the previous circuit analyzed. When the Adjusted SCCR value is less than the predetermined threshold at step 408, the system sets 412 the Trans. through SCCR value equal to Adjusted SCCR value of step 400.

Figure 15:
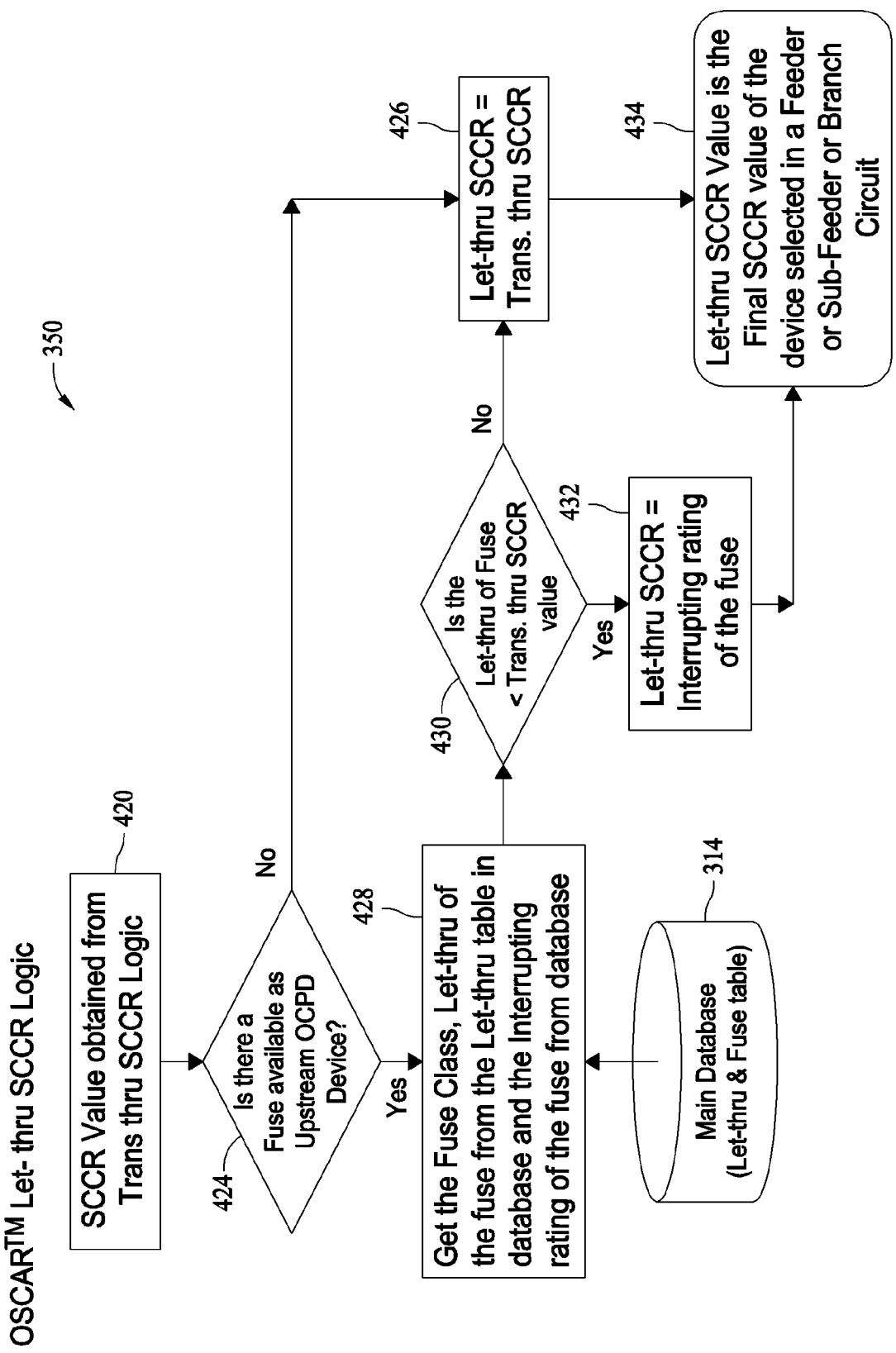

FIG. 15 illustrates the Let-thru SCCR Logic loop 350. The Let-thru SCCR Logic loop begins 420 with the output Trans. thru SCCR value 420 of FIG. 14. Once the Trans. thru SCCR value is supplied, the system determines 424 whether a fuse has been selected by the user as an upstream device to the circuit presently being analyzed. If no fuse has been selected, the system 426 sets a Let-thru SCCR value equal to the Trans. thru SCCR value supplied at step 420.

If a fuse has been selected as an upstream device, at step 428 the system retrieves 428, from the main database 314, data and information pertaining to the fuse class, a let-thru value from a lookup table, and an interrupting rating corresponding to the selected fuse. Once the information is retrieved at step 428 the system determines at step 430 whether the let-thru value of the fuse is less than the Trans. thru SCCR value supplied at step 420. If the let-thru value of the fuse is less than the Trans. thru SCCR value, the system sets 426 a Let-thru SCCR value equal to the Trans. thru SCCR value supplied at step 420.

If at step 430, the let-thru value of the fuse is greater than the Trans. thru SCCR value, the system sets 432 the Let-thru SCCR value equal to the interrupting rating of the fuse.

As indicated in FIG. 15, the Let-thru SCCR value is the final SCCR value for each feeder circuit, sub-feeder circuit, or branch circuit to be analyzed. This value, represented as step 434 in FIG. 15, is the result displayed, such as the result 352 shown in FIG. 12, at each iteration of analysis for the circuits found in the proposed panel design.

Figure 16:
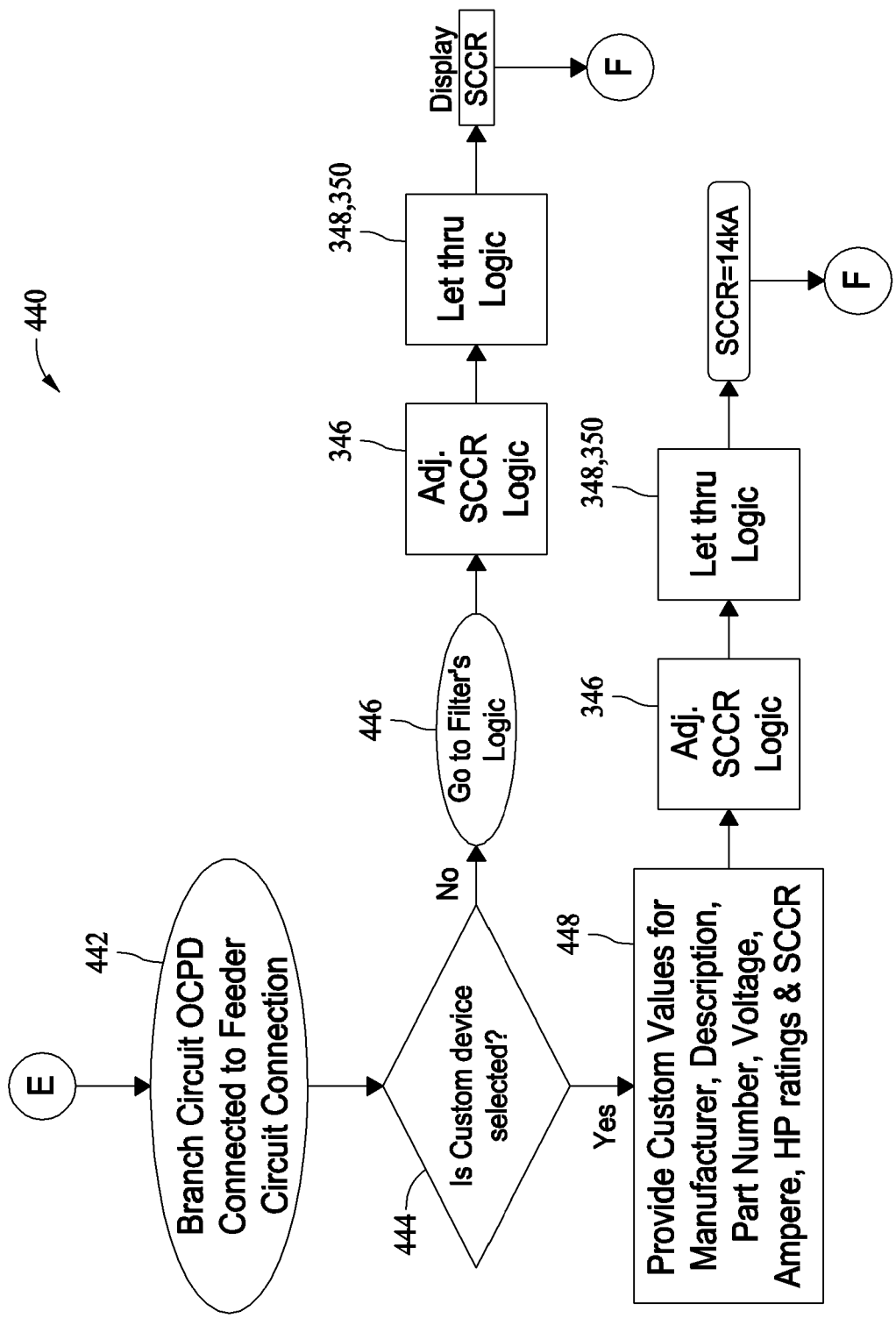

FIG. 16 illustrates a branch circuit analysis processing algorithm 440 for an overcurrent protection device in the first branch circuit connected to the feeder circuit in the exemplary proposed panel design. The algorithm 440 is performed after the algorithm 340 shown in FIG. 12, and the algorithm 440 operates on the user inputs from the feeder circuit data collection and navigation algorithm 218 shown in FIG. 5 at steps 246 and 248.

The branch circuit component selection processing algorithm 440 includes entering 442 a logic loop wherein the system determines 444 whether a custom device has been selected in the branch circuit. If no custom device is selected, the main system database is filtered 446 to obtain device data and information corresponding to the selected component devices in the algorithm 218 at step 246 (FIG. 5) for the feeder circuit. Via the filtering process, complete information regarding the selected devices is obtained, including, for example, device type codes, manufacturer names, device descriptions, device part-numbers, device voltage ratings, device current ratings, HP ratings, $i^2t$ values, IR values and SCCR ratings for the selected devices. Once the information is obtained at step Adjusted SCCR loop 346 and the let thru logic loops 348, 350 are performed to calculate and determine the output SCCR value for display.

If a custom device was selected, the user-entered data and information 448 for the custom device is used to perform the Adjusted SCCR loop 346 and the let thru logic loops 348, 350 to calculate and determine the output SCCR value for display. As seen in FIG. 16, in one example, the resultant SCCR value of 14 kA in the example, based upon the information for the custom device, does not match the previous SCCR value obtained at step 352 of FIG. 12.

Figure 17:
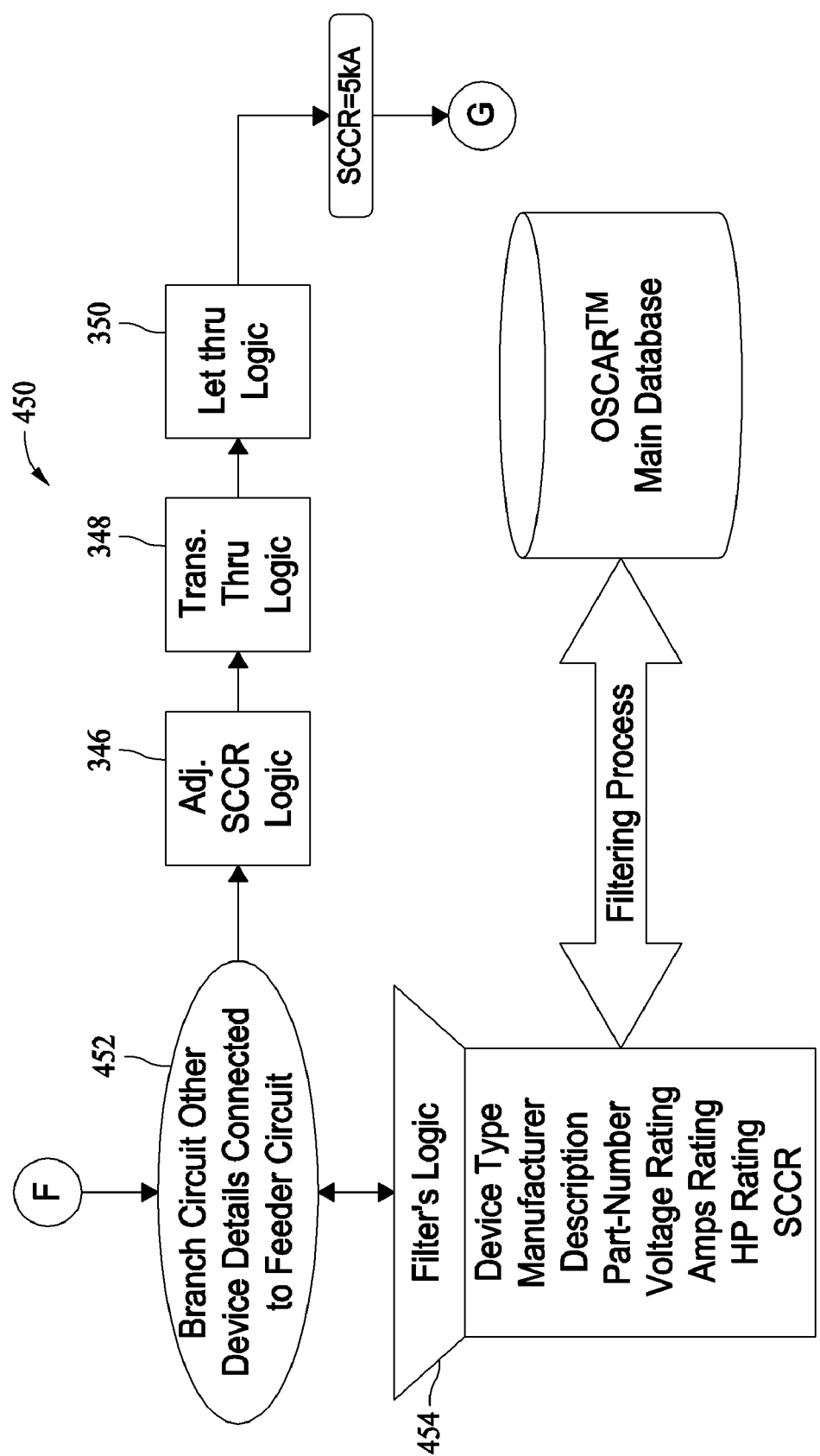

FIG. 17 illustrates a branch circuit analysis processing algorithm 450 for the "other" non-OCPD branch circuit device connected to the overcurrent protection device shown and analyzed in the algorithm shown in FIG. 16. The algorithm 450 is performed after the algorithm 440 shown in FIG. 16, and the algorithm 450 operates on the user inputs from the feeder circuit data collection and navigation algorithm 218 shown in FIG. 5 at step 248.

The branch circuit component selection processing algorithm 450 includes entering 452 a logic loop wherein the system filters 454 the main database 314 to obtain device data and information corresponding to the selected component devices in the algorithm step 248 (FIG. 5) for the second branch circuit. Via the filtering process, complete information regarding the selected devices is obtained, including, for example, device type codes, manufacturer names, device descriptions, device part-numbers, device voltage ratings, device current ratings, HP ratings, $i^2t$ values, IR values and SCCR ratings for the selected devices. Once the information is obtained at step 454, the Adjusted SCCR loop 346 and the let thru logic loops 348, 350 are performed to calculate and determine the output SCCR value for display. Of note, the resultant SCCR value of 5 kA shown in the example of FIG. 15 is unequal to both of the previously calculated SCCR values of FIGS. 12 and 16.

Figure 18:
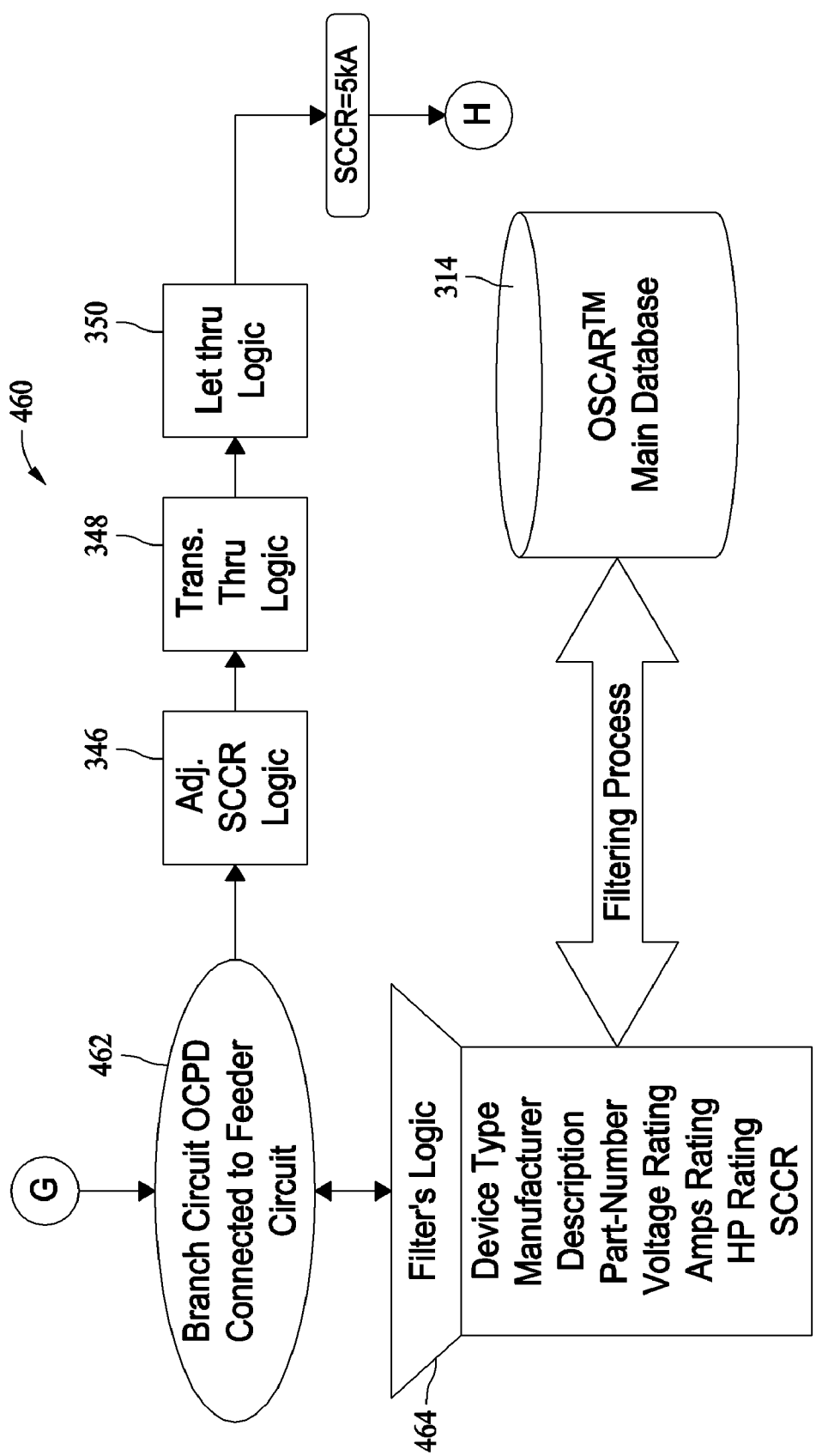
Figure 19:
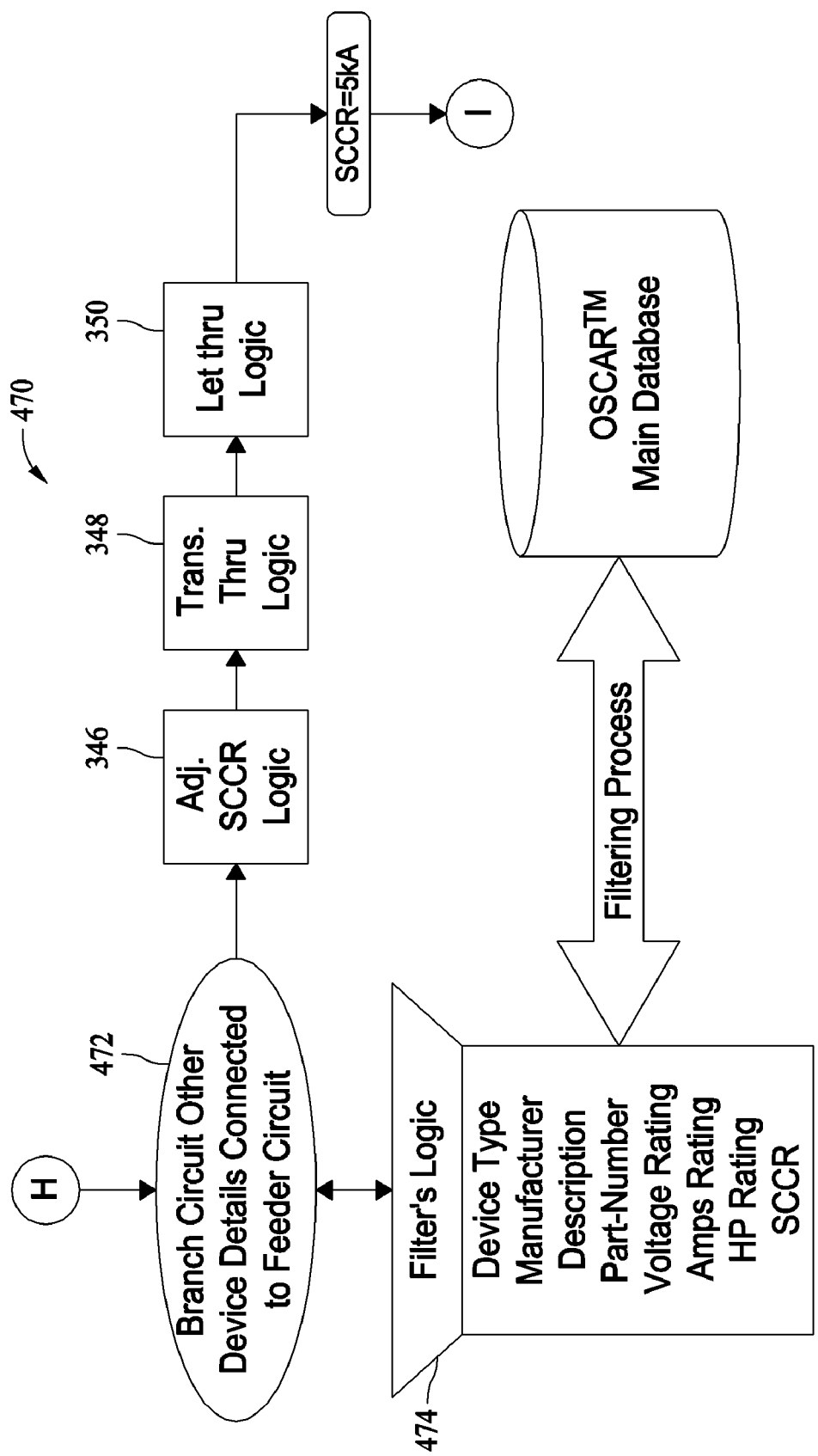

FIGS. 18 and 19 illustrate branch circuit analysis processing algorithms 460 and 470 for selected overcurrent protection devices and other devices in the second branch circuit connected to the feeder circuit in the exemplary proposed panel design. The algorithms 460 and 470 are similar to the algorithm 450 shown in FIG. 17, and generates the same output result as is shown in FIG. 17 in one example. That is, in the exemplary example, the properties of the devices selected in the second branch circuit do not change the output generated by the system under the analysis loops 346, 348 and 350.

Figure 20:
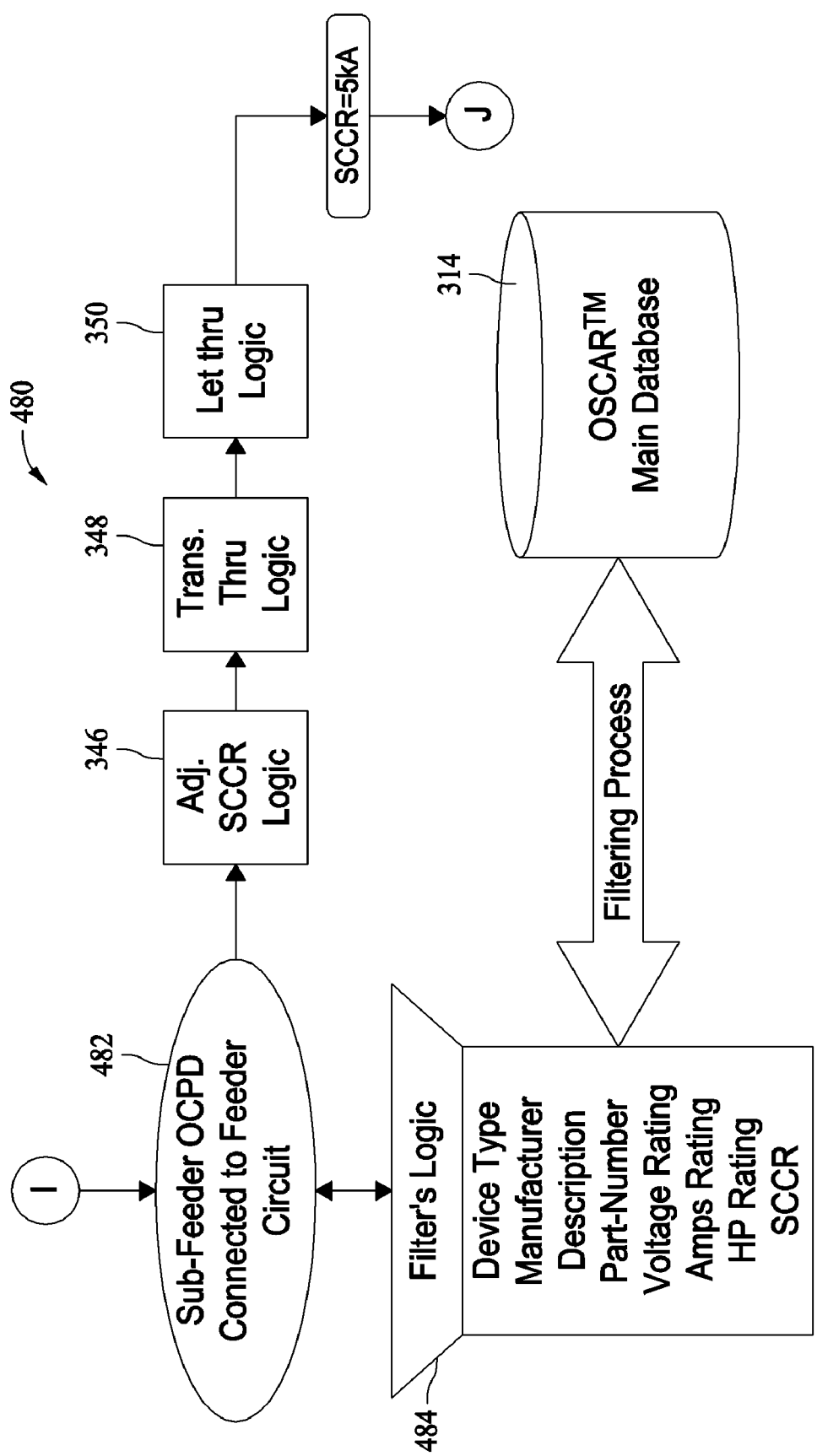

FIG. 20 illustrates a first sub-feeder circuit component analysis processing algorithm 480 that is performed after the branch circuit algorithms for branch circuits connected to the feeder circuit in the exemplary proposed panel design. The algorithm 480 operates on the user inputs from the sub-feeder circuit data collection and navigation algorithm 244 shown in FIG. 6 relating to the overcurrent protection device in the sub-feeder circuit.

The sub-feeder circuit component selection processing algorithm 480 includes entering 482 a logic loop wherein the system filters 484 the main database 314 to obtain device data and information corresponding to the selected OCPD device in the algorithm step 256 (FIG. 6) for the sub-feeder circuit. Via the filtering process, complete information regarding the selected devices is obtained, including, for example, device type codes, manufacturer names, device descriptions, device part-numbers, device voltage ratings, device current ratings, HP ratings, $i^2t$ values, IR values and SCCR ratings for the selected devices. Once the information is obtained at step 484, the Adjusted SCCR loop 346 and the let thru logic loops 348, 350 are performed to calculate and determine the output SCCR value for display.

Figure 21:
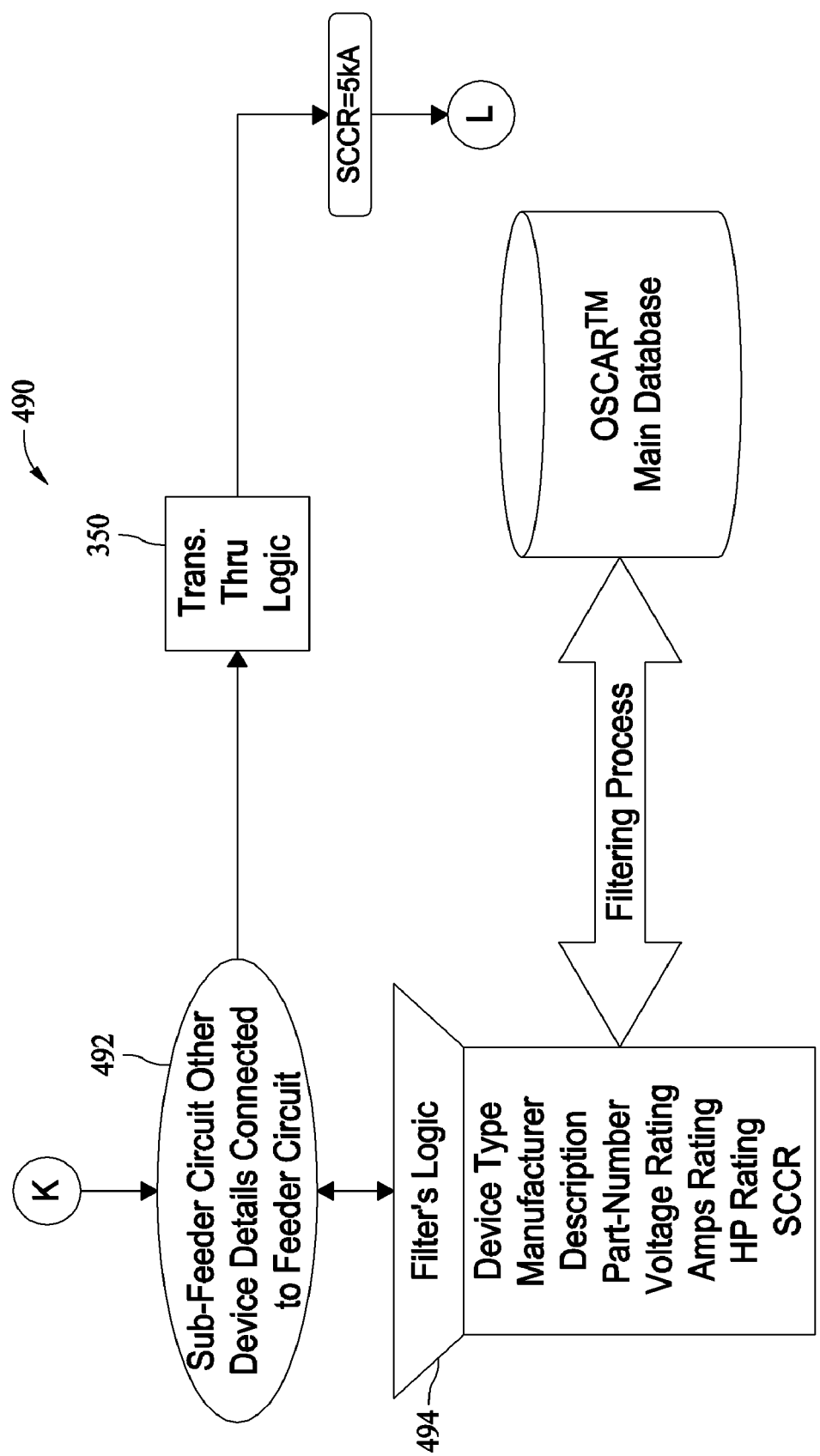

FIG. 21 illustrates a second sub-feeder circuit component analysis processing algorithm 490 that is performed after the sub-feeder circuit algorithms 480 for the OCPD of the sub-feeder circuit and relates to the other device connected to the OPCD. The algorithm 490 operates on the user inputs from the sub-feeder circuit data collection and navigation algorithm 244 shown in FIG. 6.

The sub-feeder circuit component selection processing algorithm 490 includes entering 492 a logic loop wherein the system filters 494 the main database 314 to obtain device data and information corresponding to the selected "other" or non-OCPD device in the algorithm step 258 (FIG. 6) for the sub-feeder circuit. Via the filtering process, complete information regarding the selected device is obtained, including, for example, device type codes, manufacturer names, device descriptions, device part-numbers, device voltage ratings, device current ratings, HP ratings, $i^2t$ values, IR values and SCCR ratings for the selected devices. Once the information is obtained at step 494, the Adjusted SCCR loop 346 and the let thru logic loops 348, 350 are performed to calculate and determine the output SCCR value for display.

Figure 22:
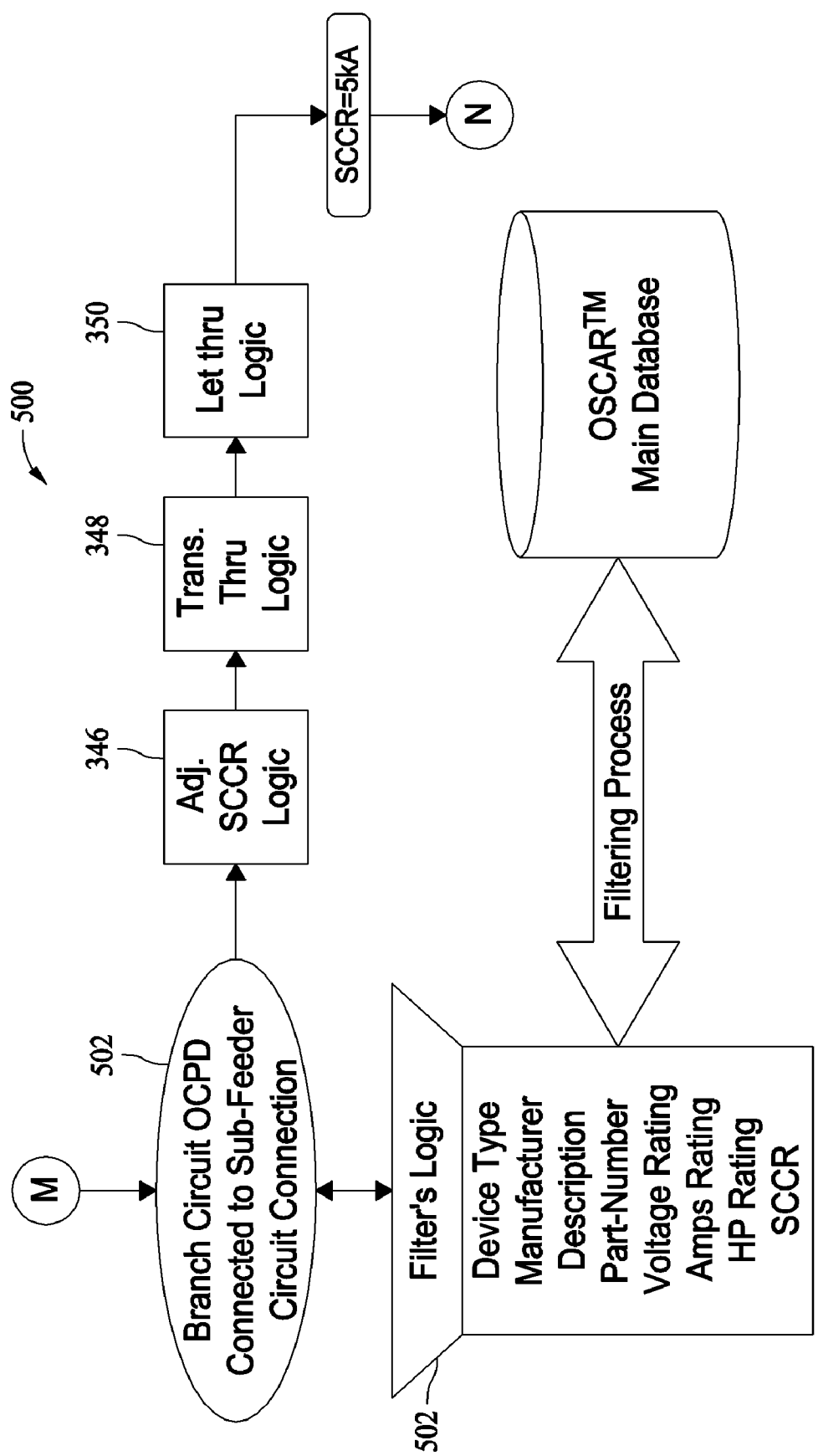
Figure 23:
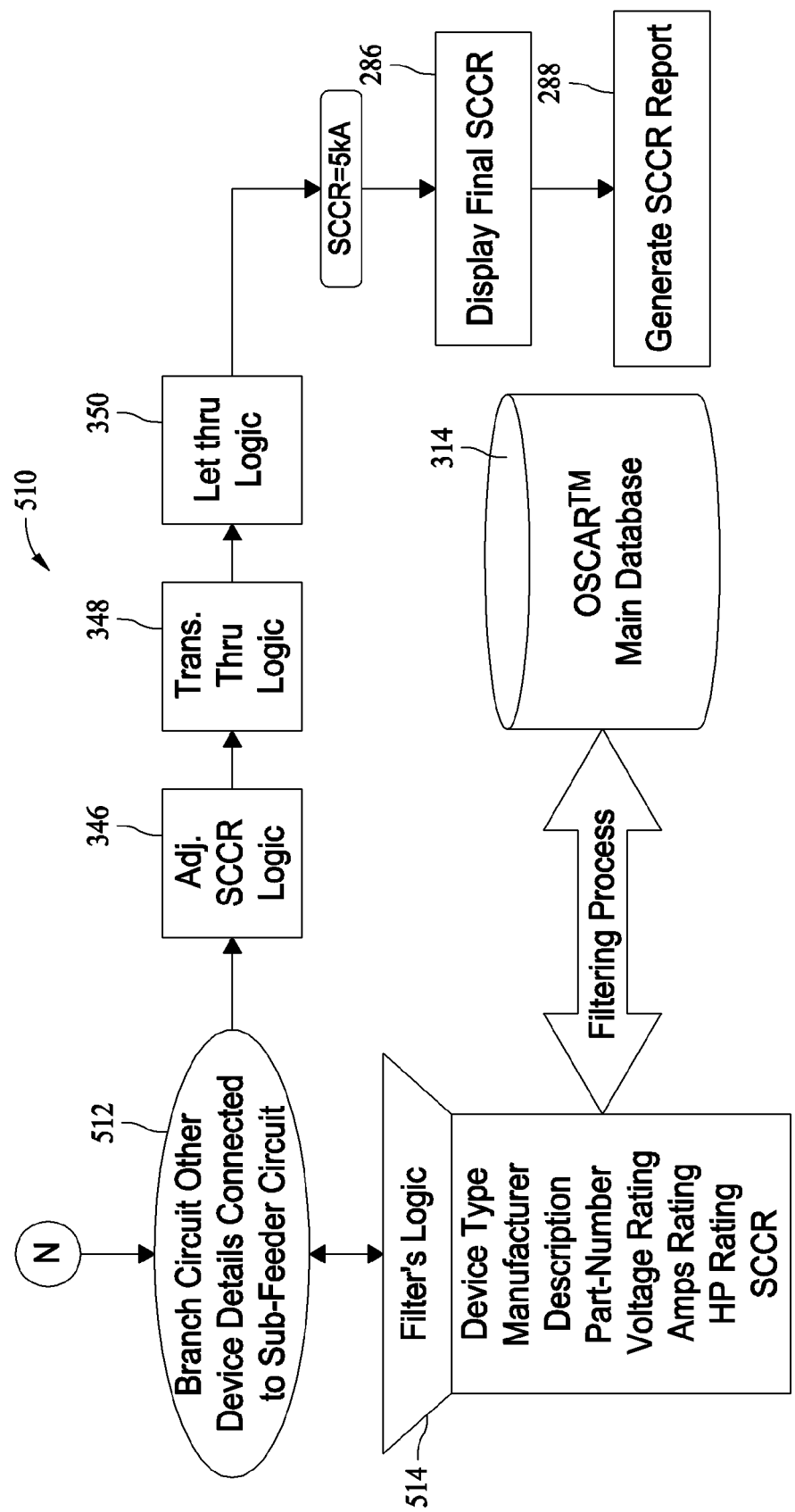

FIGS. 22 and 23 illustrate branch circuit analysis processing algorithms 500 and 510 for selected overcurrent protection devices and other devices in the second branch circuit connected to the sub-feeder circuit in the exemplary proposed panel design. The algorithms 500 and 510 are similar to the algorithms 480 and 490 shown in FIGS. 20 and 21, and generate the same output result as is shown in FIGS. 20 and 21 in one example. That is, in the exemplary example, the properties of the devices selected in the second branch circuit do not change the output generated by the system under the analysis loops 346, 348 and 360.

As shown in FIG. 23, the branch circuit connected to the sub-feeder circuit is the last circuit in the exemplary proposed panel design, so having considered all the circuits and all of the devices in each circuit, the system proceeds to display 286 a final SCCR rating for the entire panel, and if desired the system generates 288 a detailed report for review by a user. The final SCCR rating matches the output result obtained by the algorithm that considers the last circuit device in the proposed design.

As is believed to be evident from the algorithms 8-23, the system guides the user through the device selection process for the applicable circuits in the proposed panel design, and as each circuit device is selected, the system evaluates values corresponding to the selected devices in relation to upstream overcurrent protection device, upstream transformer components and upstream fuses to adjust the SCCR rating of the combined circuits appropriately. The algorithms flexibly accommodate a variety of different devices in the circuits, and capably manage the SCCR adjustments for a large number of circuit devices and associated circuits. While exemplary algorithms are described, it is understood that other algorithms may likewise be utilized, the described algorithms may be changed or modified, and that less than all of the described algorithms may be employed to achieve varying degrees of functionality and sophistication in different embodiments of the invention.

IV. THE USER INTERFACE OF THE INVENTION

Having now described exemplary processes utilized by the invention, the methods and processes described above may be implemented using a menu-driven graphical interface described in the examples below that guide the user through entering of panel information and selection of devices, while providing real time feedback and analysis regarding SCCR ratings at each step of the process.

FIGS. 24-44 illustrate exemplary displays of a user interface for the system 150 in an exemplary embodiment. The examples of FIGS. 24-44 are illustrative only, and it is contemplated that other interfaces and display may likewise be utilized in different embodiments of the invention without limitation.

Figure 24:
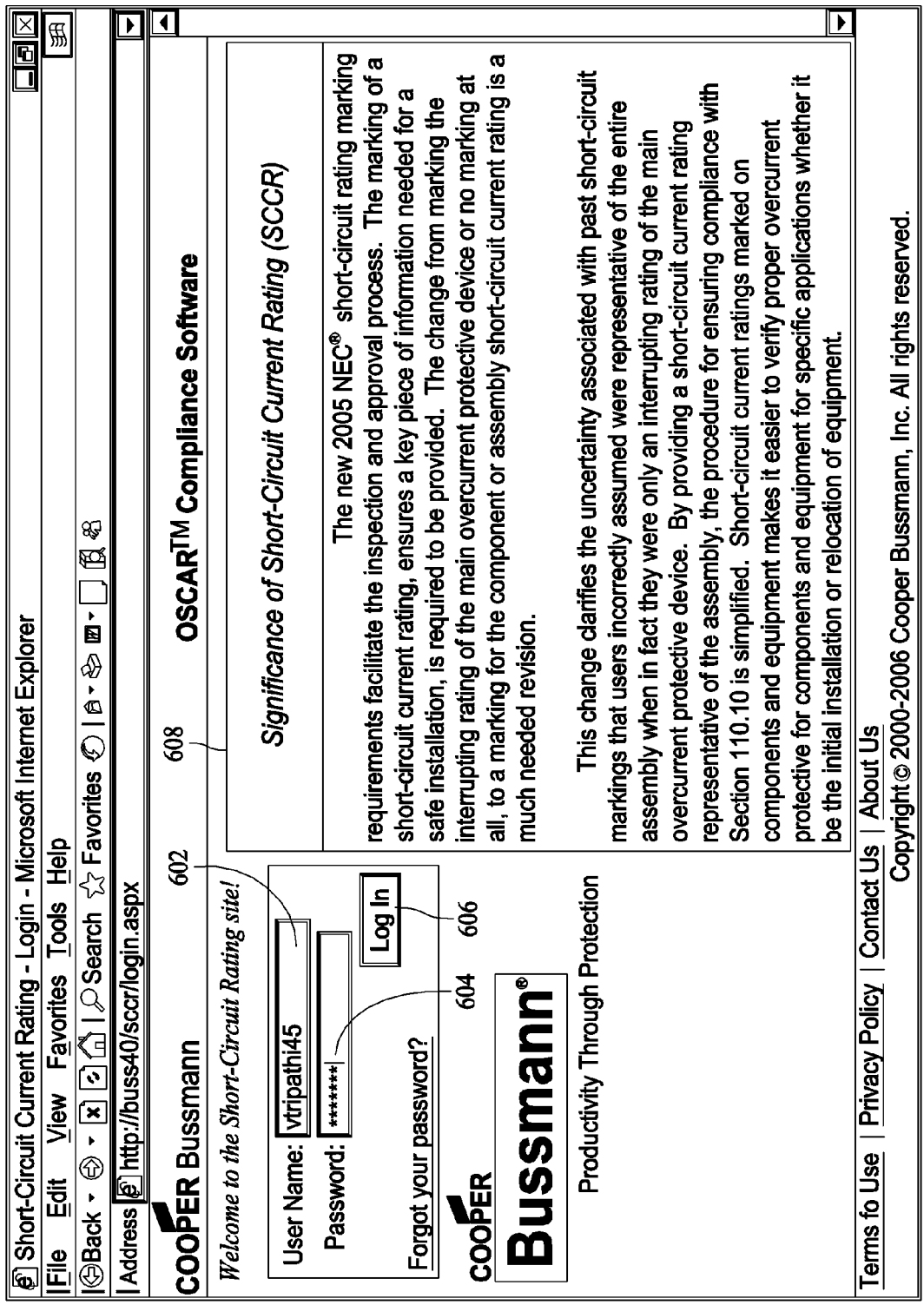

FIG. 24 is an example embodiment of a user interface displaying a logon screen for a user of analysis and evaluation system 150 described above. Authorized system users may log onto the analysis and evaluation system 150 with a conventional username data field 602, password data field 604, and a login button 606. Unauthorized system users are prevented from entering or accessing analysis and evaluation system 150 using the algorithm 300 shown in FIG. 8. The logon screen 600 in the illustrated embodiment also includes a welcome field 608 including a brief technical description regarding the importance of compliance with N.E.C. Article 409 in electrical panel design. Other welcome messages or explanation may alternatively be provided if desired.

Figure 25:
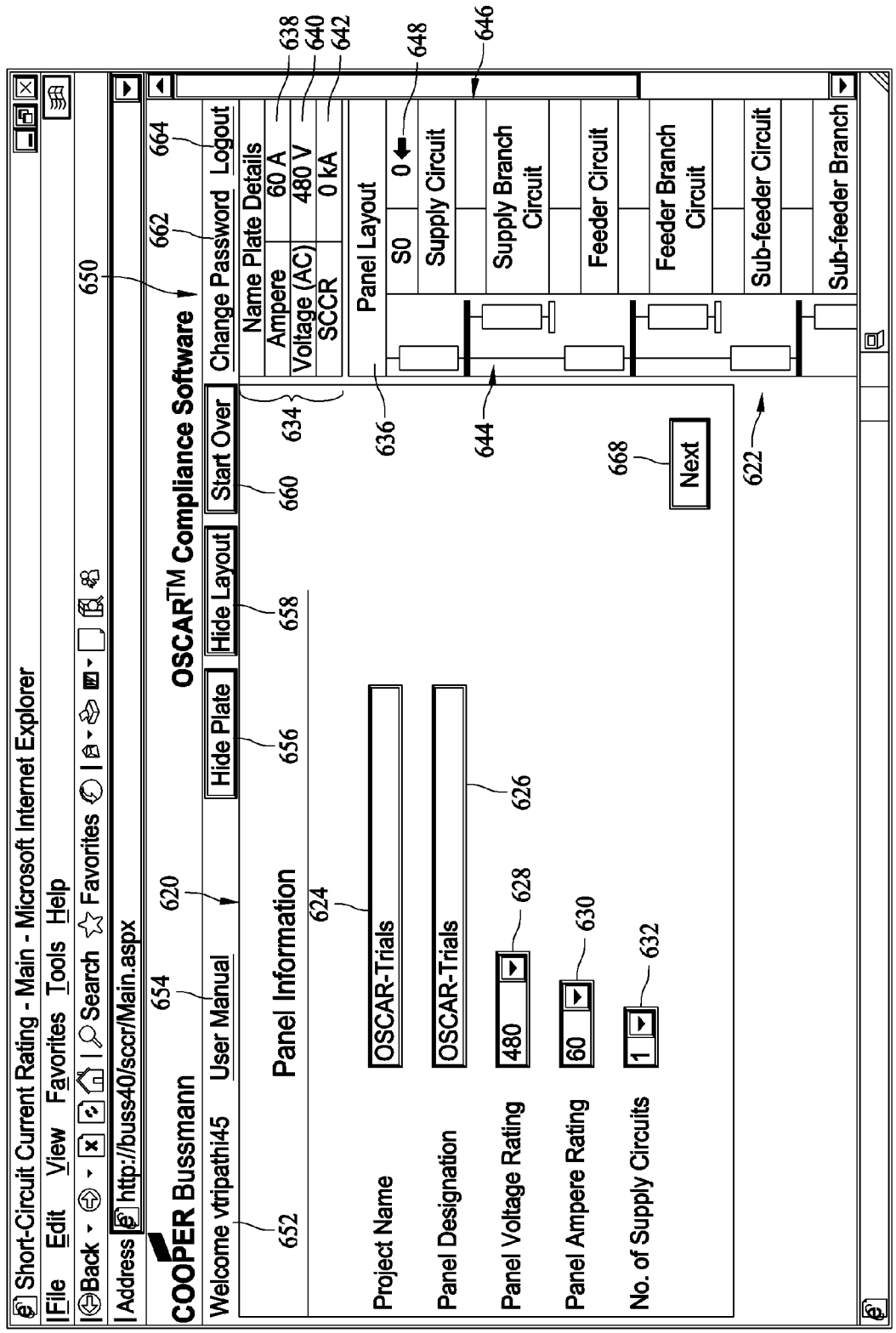

FIG. 25 is an example of a user interface displaying a panel information screen for a user of the analysis and evaluation system 150 after a successful login has occurred. The panel information screen includes a panel information section 620 and a graphical analysis and display section 622.

The panel information section 620 may include a project name data field 624, a panel designation data field 626, a panel voltage rating field 628, a panel ampere rating field 630, and a number of supply circuits data field 632. The project name and panel designation data fields 624 and 626 are open data fields wherein the user may type in or otherwise enter a name and panel designation of the user's choosing, while the voltage rating field 628, a panel ampere rating field 630, and a number of supply circuits data field 632 include drop-down menus wherein the user may choose from a predetermined set of values. The panel information section 620 may be presented in connection with the algorithm 310 shown in FIG. 10.

The analysis and display section 622 may include a panel name plate section 634 and a panel layout section 636. The name plate section 634 includes an ampere rating field 638 and a panel voltage rating field 640 that are each populated by the system 150 with the values selected in the data fields 630 and 628. The name plate section 634 may also include an SCCR rating field 642 that is populated by the most current value output from the algorithms shown in FIGS. 11-23 for example. Because the user at this point has not selected any devices used in the circuits of the panel, the SCCR rating field 642 reads zero in FIG. 25

The panel layout section 636 includes a schematic section 644 and a status section 646. The status section 646 includes fields for supply circuits, supply branch circuits, feeder circuits, feeder branch circuits, sub-feeder circuits and sub-feeder branch circuits to be analyzed for a proposed panel design. A pointer or arrow 648 is provided to indicate the present stage of analysis to the user. As shown in FIG. 25, the user has not yet selected the number of supply circuits in the field 632 so that arrow is 648 present in the supply circuit data field and "0" is displayed to indicate that zero supply circuits have been selected.

A navigation bar 650 is provided in the upper portion of the screen, and the navigation bar 620 includes a welcome field that is populated by the system with the username from the field 602 in the logon screen, a user manual link 654, a hide plate button 656, a hide layout button 658, a start over button 660, a change password link 662 and a logout link 664 for exiting the system. The user manual link 654 when selected presents a user manual to the user for assistance in using the system. The hide plate and layout buttons 656 and 658 render the name plate section and the layout section 634 and 636, respectively, visible and invisible when selected. The start over button 660 clears the panel information screen, and the change password link 662 provides the user with an opportunity to select a different password.

Once the user has entered or selected appropriate information in the fields 624, 626, 628, 630 and 632 for the proposed panel design of interest, the user may select a next button 668 to continue.

Figure 26:
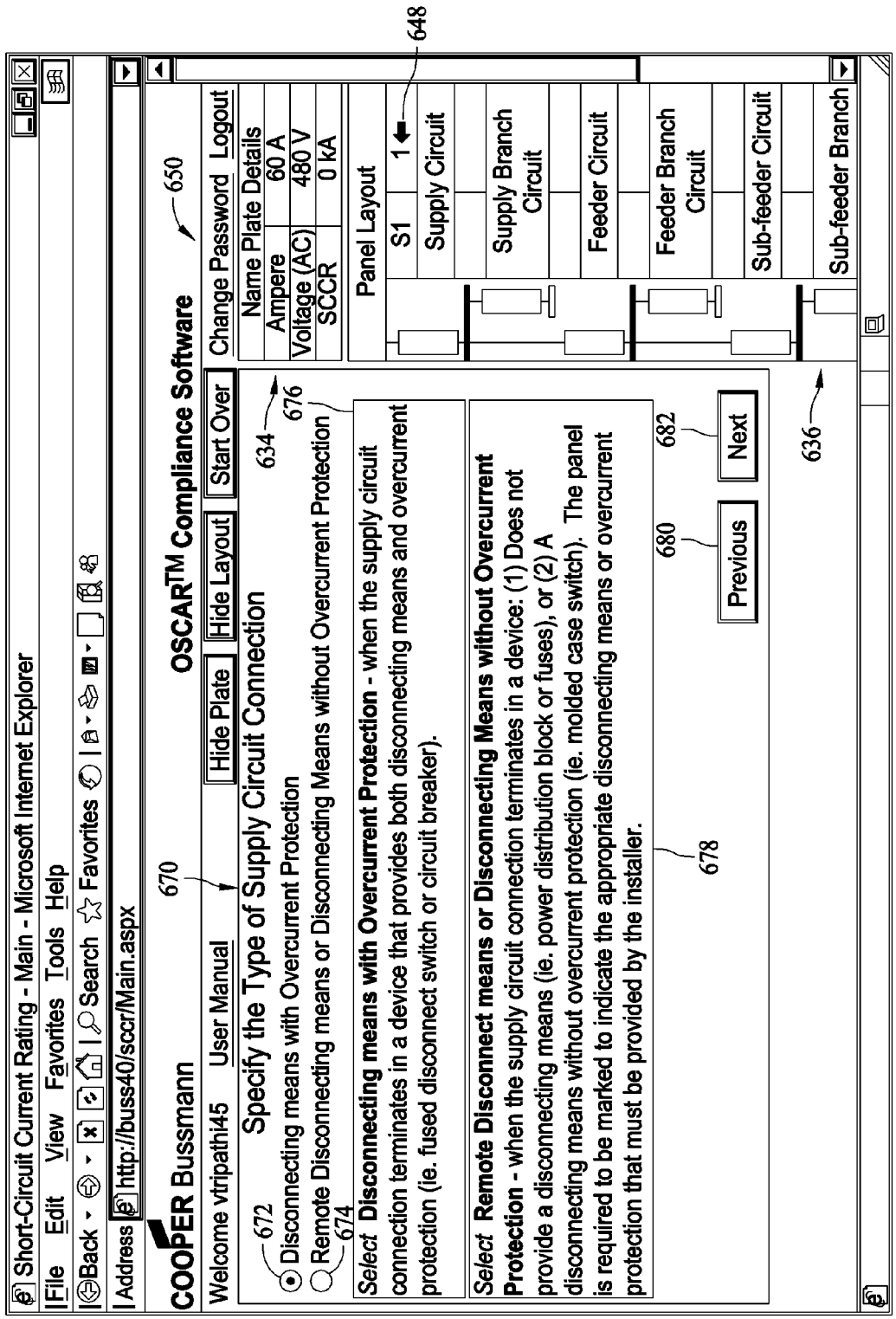

FIG. 26 is an example of a user interface displaying a supply circuit connection screen for a user of the analysis and evaluation system 150 that is displayed after the previously described screen. The supply circuit connection screen includes the name plate section 634, the layout section 636, the navigation bar 650 and a supply circuit type section 670. The supply circuit type section 670 includes selectors 672 and 674 for supply circuits having disconnecting means with overcurrent protection and remote disconnecting means or disconnecting means without overcurrent protection, respectively. Explanatory sections 676 and 678 are also provided for the user's guidance in selecting between the two types of supply circuits.

The arrow 648 is presented to the user in FIG. 26 as a pointer to the supply circuit field in the status section, and "1" is indicated in the supply circuit field as a reminder that the first supply circuit is currently under consideration. A previous button 680 is provided that when selected returns the user to the panel information screen, and a next button 682 is provided to allow the user to continue once the user has made an appropriate selection via the selectors 672 and 674. In the example shown in FIG. 26, the user has selected a supply circuit type as "disconnecting means with overcurrent protection" and the user may then select the next button 682 to proceed.

Figure 27:
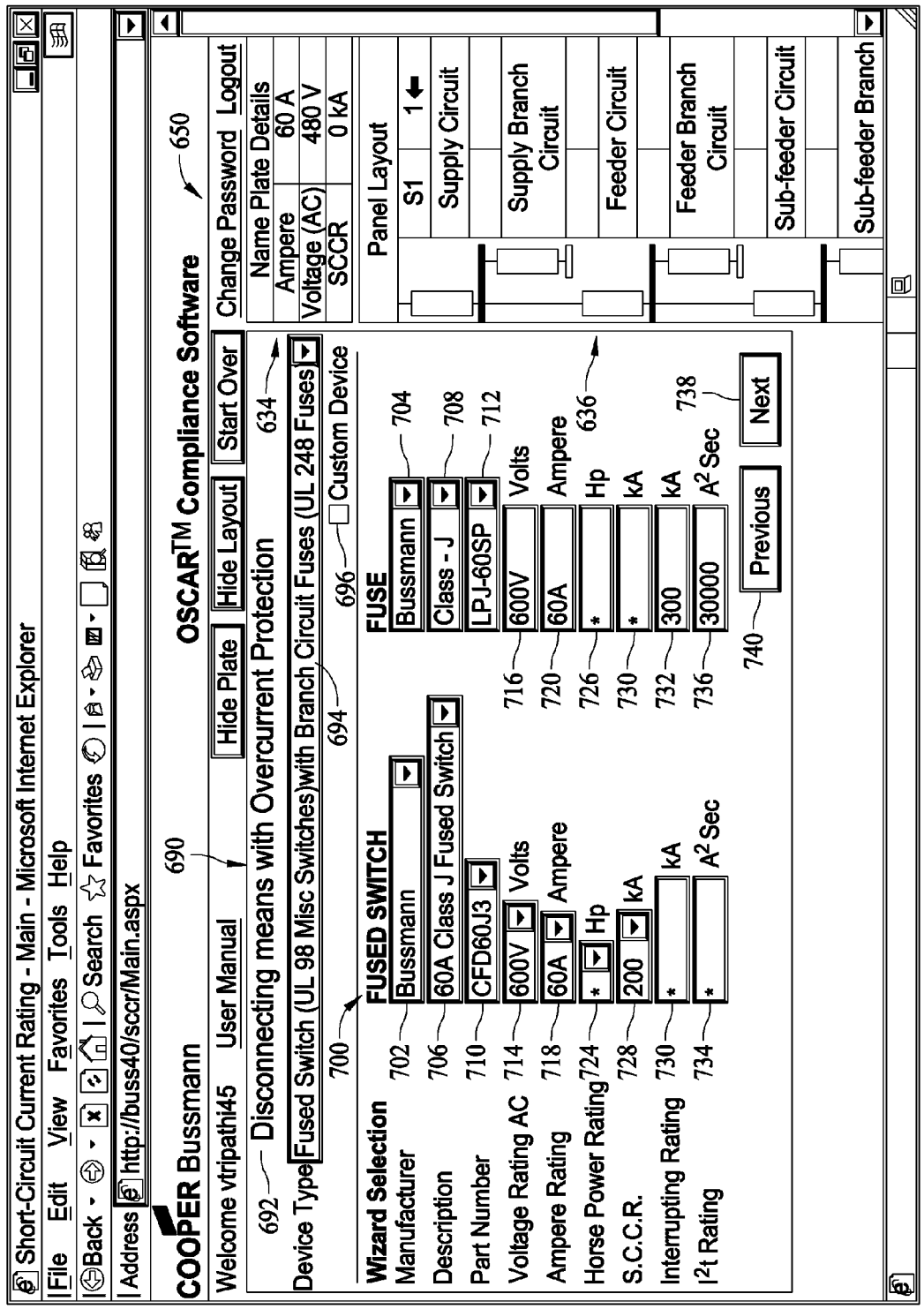

FIG. 27 is an example of a user interface displaying a supply circuit component selection screen to the user of the analysis and evaluation system 150 after the supply circuit type screen shown in FIG. 26. The supply circuit component selection screen includes the name plate section 634, the layout section 636, the navigation bar 650 and a supply circuit device selection section 690.

The supply circuit device selection section 690 includes a descriptive legend 692 corresponding to the supply circuit type selected in the screen of FIG. 26, a device type field 694, and a custom device selector 696. The device type field 694 includes a drop down menu listing any of the devices described above that are compatible with the user's supply circuit type selection. In the example shown in FIG. 27, the user has selected a device type of "Fused Switch (UL 98 Misc. Switches) with Branch Circuit Fuses (UL 248 Fuses)."

A device detail section 700 is provided including manufacturer name fields 702 and 704 for the devices selected in the device type field 694, description fields 706 and 708 for the selected devices, part number fields 708, 710 by the selected devices, voltage ratings 714 and 716 for the devices selected, current ratings 718 and 720 for the selected devices, horse power ratings 724 and 726 for the selected devices, SCCR ratings 728 and 730 for the respective devices, interrupting ratings 730 and 732 for the selected devices, and $i^2t$ fields 734 and 736 for the selected devices. As shown in FIG. 27, drop down menus are selected for required choices or selections by the user, and the remainder of the fields are populated by the system with values found in the system database or databases for the selected devices using the fields 702 through 714, 718, 724 and 728. Also as shown in FIG. 27, values for all of the fields may not exist for the selected devices, in which case a dash appears in the respective field. Once the user makes appropriate selections in the device type field 694 and the detail section 700, the user may select the next button 738 to proceed or the previous button 740 to return to the previous screen.

When the user selects the next button, the algorithm 330 of FIG. 11 is executed to process the data and information associate with the selected devices. The user may select a custom device with the selector 696 and manually enter the required data values for devices outside of the device selections available through the drop down menus as explained later below.

Figure 28:
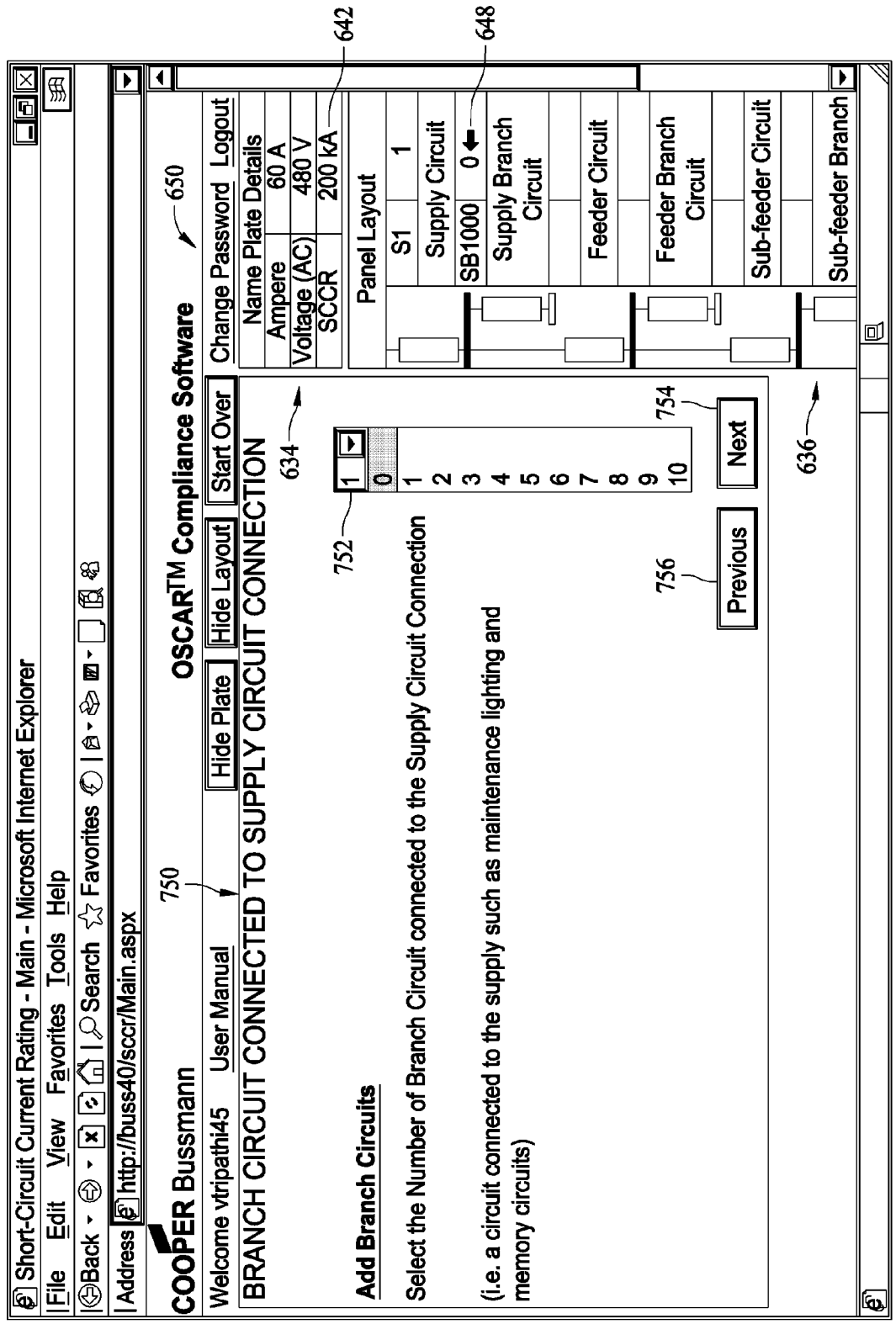

FIG. 28 is an example of a user interface displaying a branch circuit selection screen for a user of the analysis and evaluation system 150 after the supply circuit device selection screen shown in FIG. 27. The supply circuit component selection screen includes the name plate section 634, the layout section 636, the navigation bar 650 and a branch circuit selection section 750. Because circuit devices have now been selected by virtue of the previous screen, the system now displays an SCCR value in the field 642. Also, the user may see that the arrow 648 now points to the supply branch circuit field in the layout section 636, which indicates zero because a selection has not yet been made.

The branch circuit selection section 650 may include a drop down menu selection field 752 for the user to choose the number of branch circuits connected to the supply circuit in the proposed panel design of interest. When the appropriate number of branch circuits have been selected, the user may select the next button 754 to proceed or the previous button 756 to return to the previous screen. In the illustrated example, zero has been selected for the number of branch circuits connected to the supply circuit.

Figure 29:
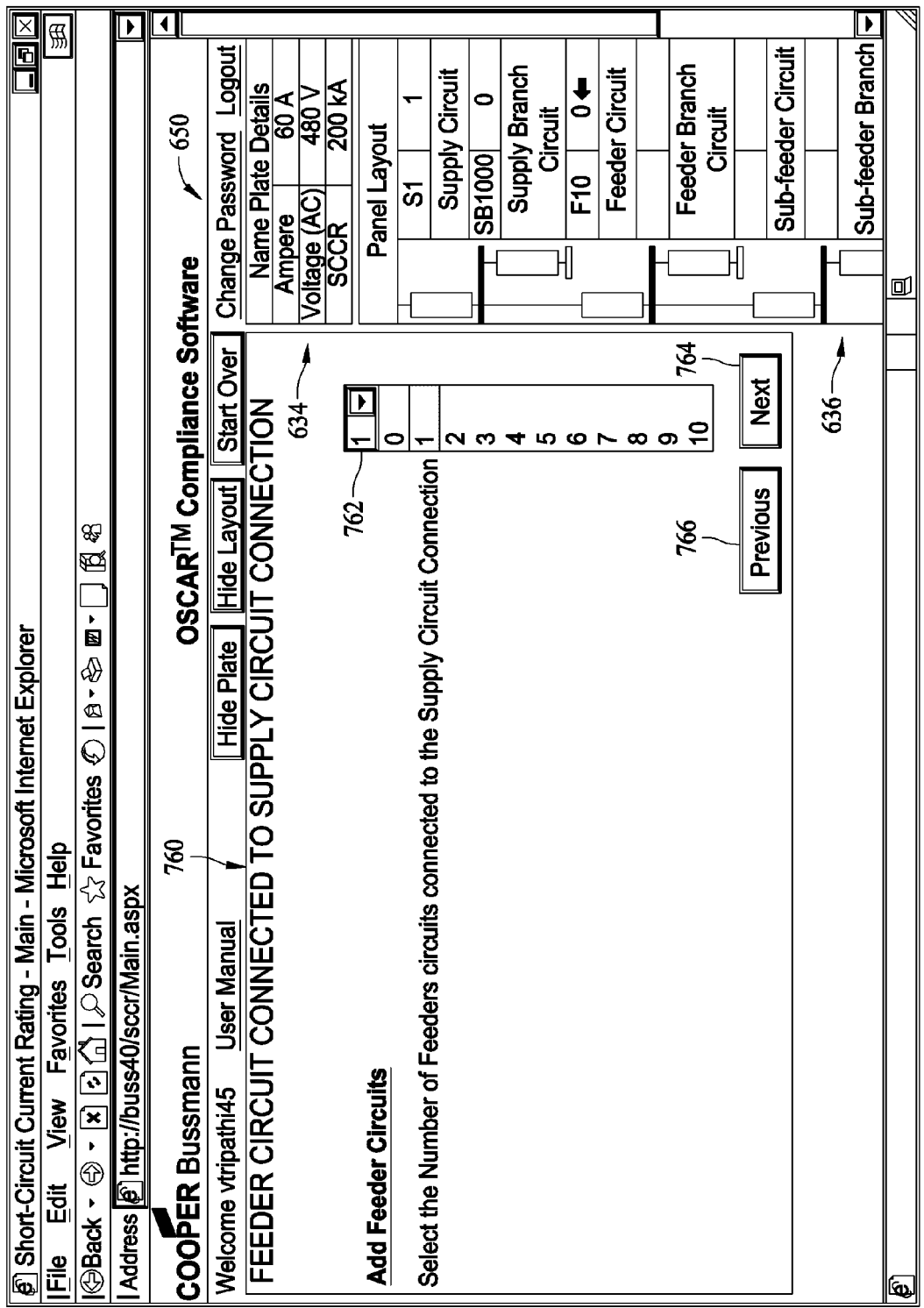

FIG. 29 is an example of a user interface displaying a feeder circuit screen for a user of the analysis and evaluation system 150 after the supply circuit device selection screen shown in FIG. 28. The feeder circuit screen includes the name plate section 634, the layout section 636, the navigation bar 650 and a feeder circuit section 760. Because circuit devices have now been selected by virtue of the previous screen, the system now displays a current SCCR value in the field 642. Also, the user may see that the arrow 648 now points to the feeder circuit field in the layout section 636, which indicates zero because a selection has not yet been made. Also, the supply circuit field in the layout section 636 now reads "1" and the supply branch circuit now reads "0" to reflect the analysis previously completed.

The feeder circuit selection section 760 may include a drop down menu selection field 762 for the user to choose the number of branch circuits connected to the supply circuit in the proposed panel design of interest. When the appropriate number of feeder circuits have been selected, the user may select the next button 764 to proceed or the previous button 766 to return to the previous screen. In the illustrated example, "1" has been selected for the number of feeder circuits connected to the supply circuit.

Figure 30:
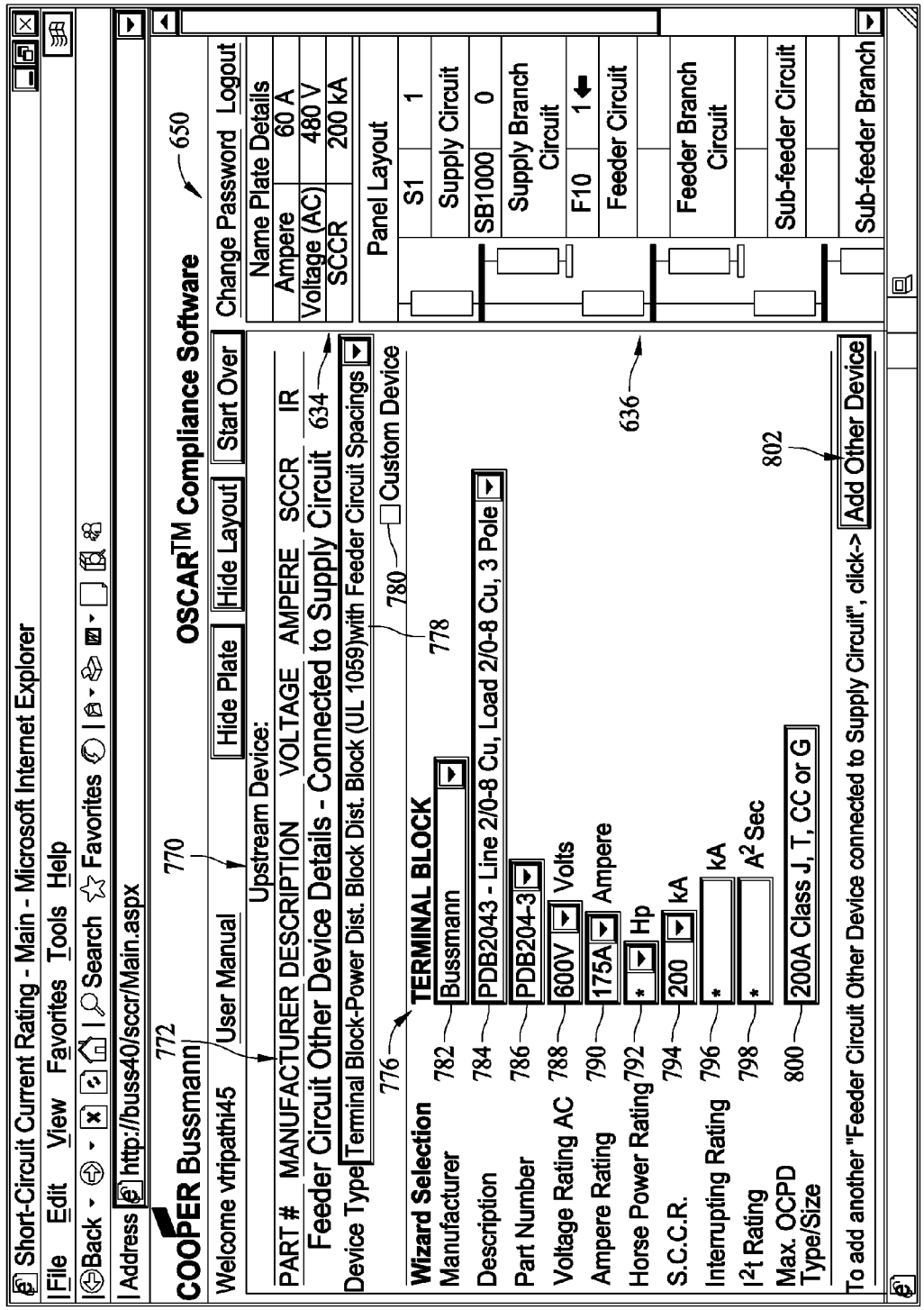

FIG. 30 is an example of a user interface displaying a feeder circuit component selection screen for a user of the system 150. The feeder circuit component selection screen includes the name plate section 634, the layout section 636, the navigation bar 650 and a feeder circuit device selection section 770.

The feeder circuit device selection section 770 includes an upstream device section 772, a device type section 774, and a device detail section 776. The device type section 774 includes a device type field 778, and a custom device selector 780. The device type field 778 includes a drop down menu listing any of the devices described above for a feeder circuit. In the example shown in FIG. 30, a device type of "Terminal Block—Power Dist. Block (UL 1059) with Feeder Circuit Spacings" has been selected.

The device detail section 776 is provided including a manufacturer name field 782, a description field 784, a part number field 786, a voltage rating 788, a current rating 790, a horse power rating 792, an SCCR rating 794, an interrupting ratings 796, an $i^2t$ and a maximum OCPD type/size field 800. As shown in FIG. 30, drop down menus are selected for required choices or selections by the user, and the remainder of the fields are populated by the system with values found in the system database or databases for the selected device using the fields 782 through 794. Also as shown in FIG. 30, values for all of the fields may not exist for any given selected device, in which case a dash appears in the respective field.

Once the user makes appropriate selections in the device type field 778 and the detail section 776, the user may select an add other device button 802 to select another device for the branch circuit, or the user may select by scrolling down to the bottom of the screen a next button to proceed or a previous button to return to the previous screen. When the next button is selected the algorithms described above are performed on the selected device information and the result is displayed in the name plate section 634.

Figure 31:
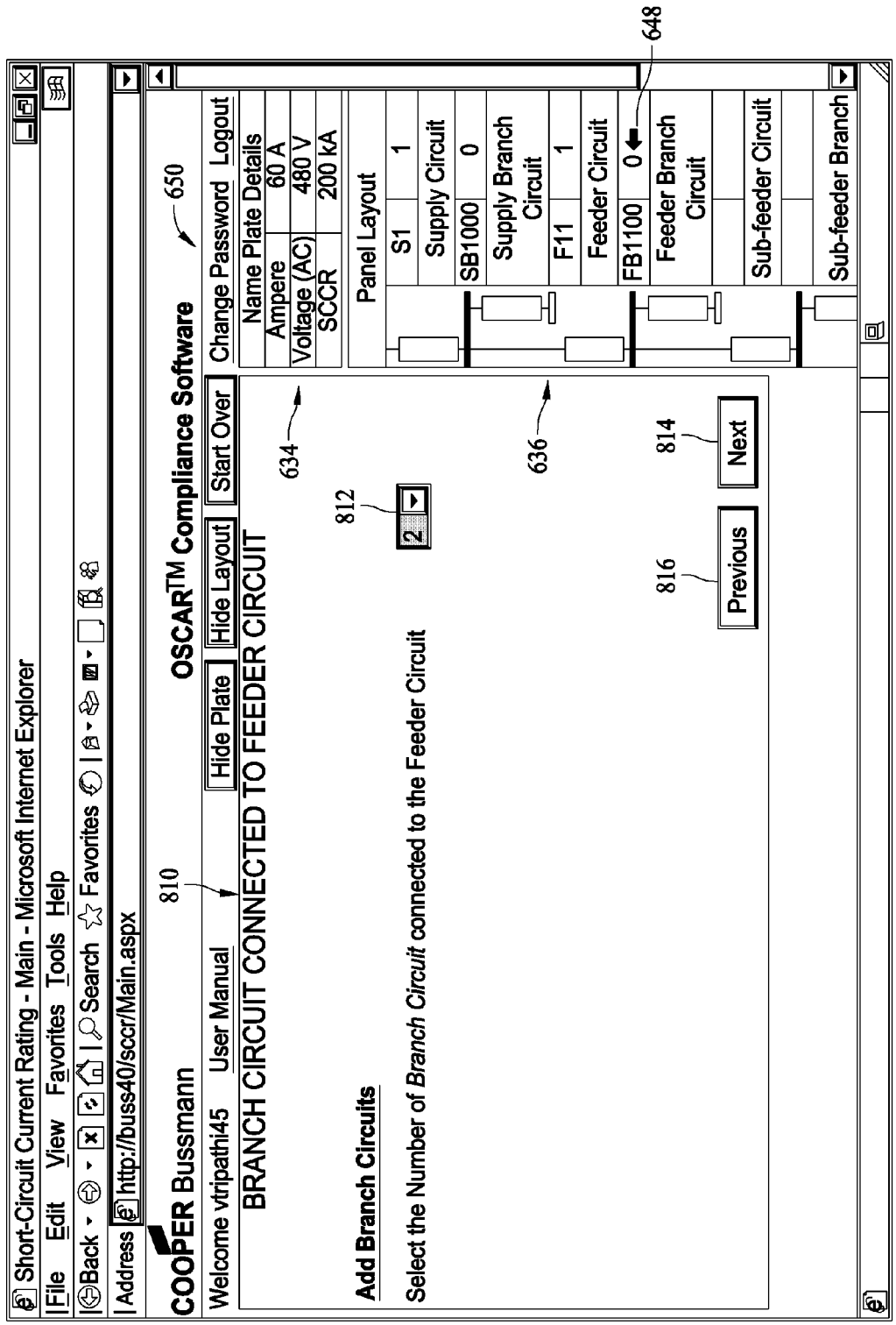

FIG. 31 is an example of a user interface displaying a branch circuit screen for a user of the analysis and evaluation system 150 after the screen shown in FIG. 30. The branch circuit screen includes the name plate section 634, the layout section 636, the navigation bar 650 and a branch circuit selection section 810. Because circuit devices have now been selected by virtue of the previous screen and analyzed by the system, a current SCCR value is displayed in the field 642. The SCCR value of 200 kA displayed in FIG. 31 is the same as that displayed in FIG. 30, indicating to the user that devices selected in the previous screen did not affect the SCCR of the proposed panel.

Also, in FIG. 31 the user may see that the arrow 648 now points to the feeder branch circuit field in the layout section 636, which indicates zero because a selection has not yet been made. Also, the supply circuit field in the layout section 636 now reads "1", the supply branch circuit field reads "0", the feeder circuit field reads "1" and the feeder branch circuit reads "0" to indicate to the user that a branch circuit connected to the feeder circuit is now under consideration.

The branch circuit selection section 810 may include a drop down menu selection field 812 for the user to choose the number of branch circuits connected to the supply circuit in the proposed panel design of interest. When the appropriate number of branch circuits have been selected, the user may select the next button 814 to proceed or the previous button 816 to return to the previous screen. In the illustrated example, "2" has been selected for the number of branch circuits connected to the feeder circuit.

Figure 32:
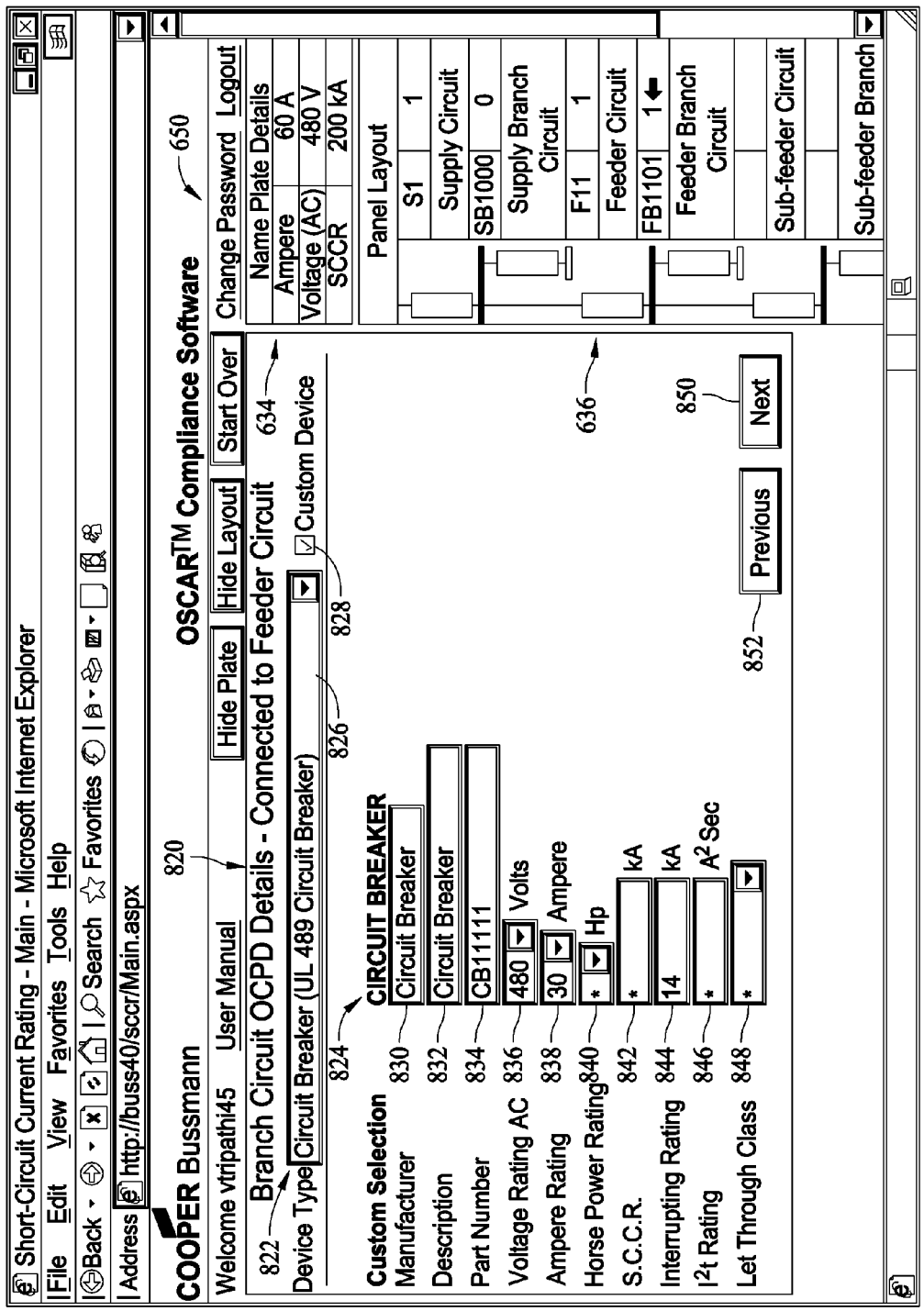

FIG. 32 is an example of a user interface displaying a first branch circuit component selection screen for a user of the system of the system 150. The branch circuit component selection screen includes the name plate section 634, the layout section 636, the navigation bar 650 and a feeder circuit device selection section 820.

The feeder circuit device selection section 820 includes a device type section 822, and a device detail section 824. The device type section 822 includes a device type field 826, and a custom device selector 826 that has been selected in FIG. 32.

When the custom device selector 826 has been selected, the device detail section 824 presents a number of fields to be completed by the user concerning the custom device. The fields include a manufacturer name field 830, a description field 832, a part number field 834, a voltage rating 836, a current rating 838, a horse power rating 840, an SCCR rating 842, an interrupting rating 844, an $i^2t$ rating 846 and a let through class field 848. As shown in FIG. 32, drop down menus are provided for the voltage, current and horsepower rating fields 842, 844 and 846, while the remaining fields are open fields to be typed or otherwise completed by the user without menu selections. As shown in FIG. 32, values for all of the fields may not exist for any given selected device, in which case a dash appears in the respective field.

Once the user makes appropriate selections in the device type field 822 and the detail section 824, the user may select a next button 850 to proceed or a previous button 852 to return to the previous screen. When the next button 850 is selected, the algorithms described above are performed using the data and information in the screen of FIG. 31, and the SCCR result, including any adjustments is displayed in the name plate section 634.

Figure 33:
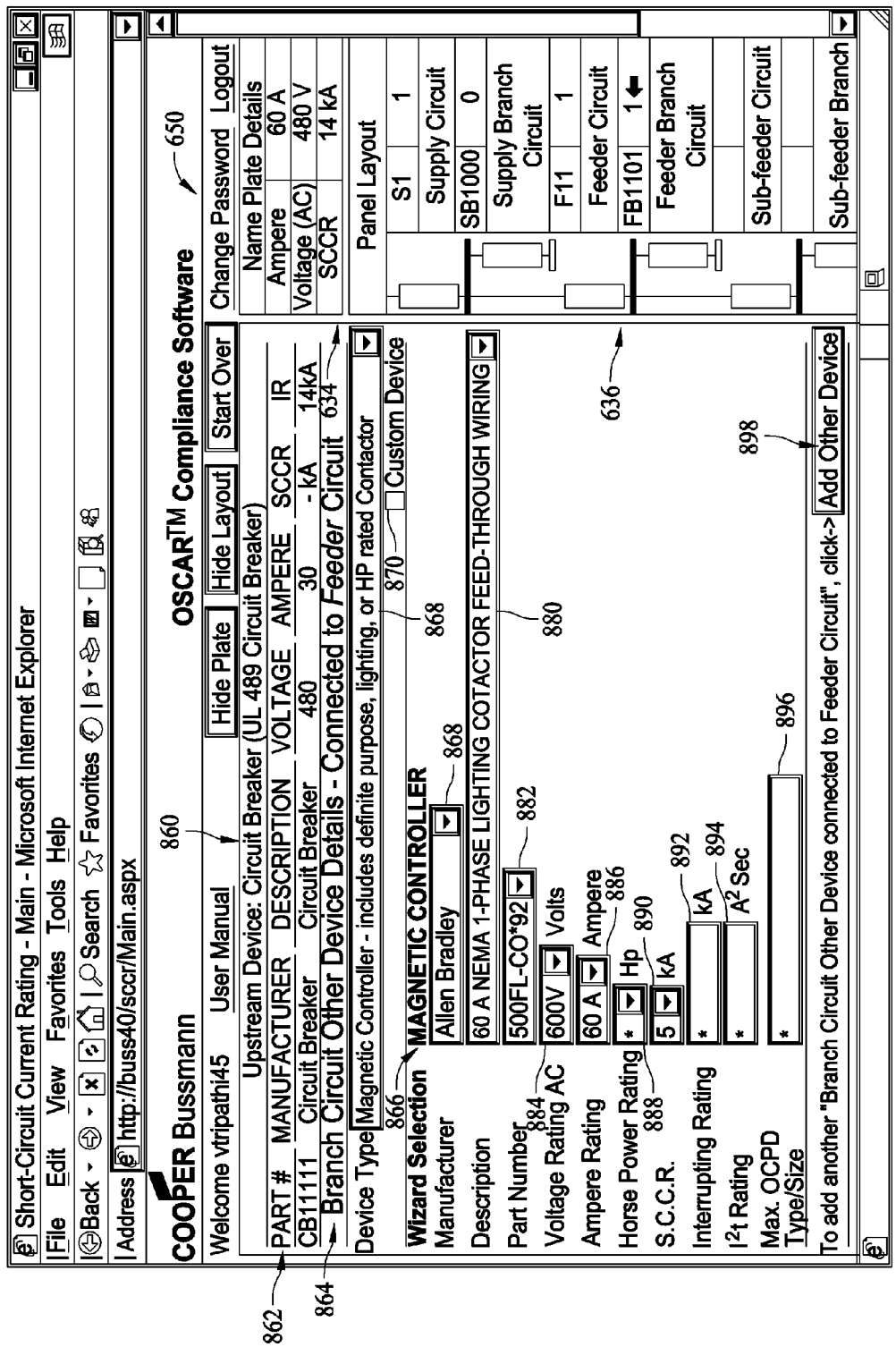

FIG. 33 is an example of a user interface displaying a second branch circuit component selection screen for a user of the system 150. The branch circuit component selection screen includes the name plate section 634, the layout section 636, the navigation bar 650 and a feeder circuit device selection section 860. The SCCR value of 14 kA displayed in FIG. 33 is different from that displayed in FIG. 32, indicating to the user that devices selected in the previous caused adjustments in the SCCR of the proposed panel to be made.

The feeder circuit device selection section 770 includes an upstream device section 862 populated with data corresponding to the selection made in the screen of FIG. 32, a device type section 864, and a device detail section 866. The device type section 864 includes a device type field 868 and a custom device selector 870. The device type field 876 includes a drop down menu listing any of the devices described above for a branch circuit connected to a feeder circuit. In the example shown in FIG. 33, a device type of "Magnetic Controller" has been selected.

The device detail section 866 is provided including a manufacturer name field 868, a description field 880, a part number field 882, a voltage rating 884, a current rating 886, a horse power rating 888, an SCCR rating 890, an interrupting rating 892, an $i^2t$ rating 894 and a maximum OCPD type/size field 896. As shown in FIG. 33, drop down menus are selected for required choices or selections by the user, and the remainder of the fields are populated by the system with values found in the system database or databases for the selected device using the fields 868 through 890. Also as shown in FIG. 33, values for all of the fields may not exist for any given selected device, in which case a dash appears in the respective field.

Once the user makes appropriate selections in the device type field 868 and the detail section 866, the user may select an add other device button 898 to select another device for the branch circuit, or the user may select by scrolling down to the bottom of the screen a next button to proceed or a previous button to return to the previous screen. When the next button is selected, the algorithms described above are performed using the data and information in the screen of FIG. 34, and the SCCR result, including any adjustments, is displayed in the name plate section 634.

Figure 34:
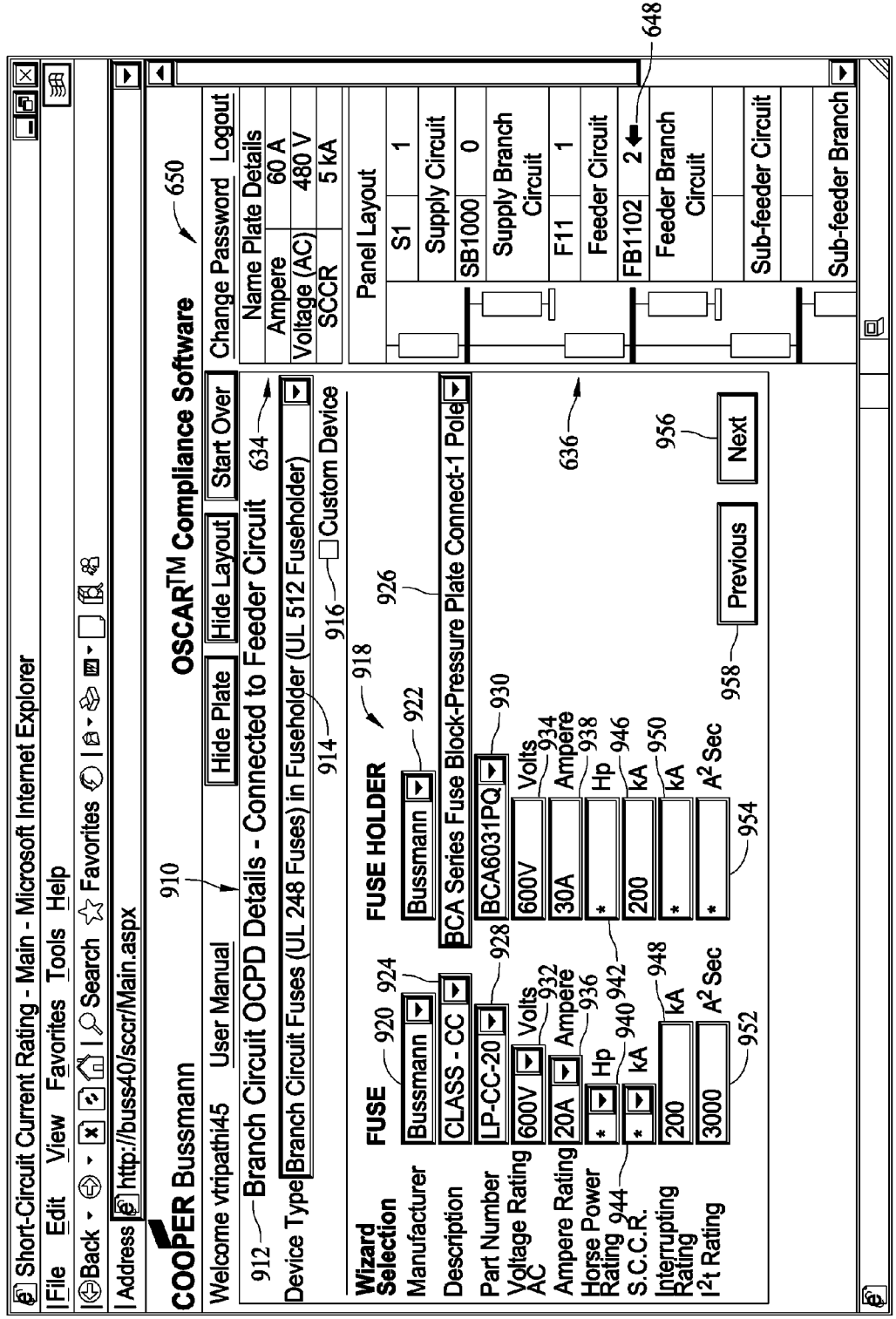

FIG. 34 is an example of a user interface displaying a third branch circuit component selection screen for a user of the analysis and evaluation system 150 after the screen shown in FIG. 33. The branch circuit component selection screen includes the name plate section 634, the layout section 636, the navigation bar 650 and a branch circuit device selection section 910. The SCCR value of 5 kA displayed in FIG. 34 is different from the 14 kA displayed in FIG. 33, indicating to the user that devices selected in the previous caused adjustments in the SCCR of the proposed panel to be made.

Also, the user may see that the arrow 648 now points to the feeder branch circuit field in the layout section 636. The supply circuit field in the layout section 636 now reads "1", the supply branch circuit field reads "0", the feeder circuit field reads "1" and the feeder branch circuit reads "2" to indicate to the user that the second branch circuit connected to the feeder circuit is now under consideration.

The branch circuit device selection section 910 includes a descriptive legend 912, a device type field 914, and a custom device selector 916. The device type field 914 includes a drop down menu listing any of the devices described above for a branch circuit. In the example shown in FIG. 34, a device type of "Branch Circuit Fuses (UL 248 Fuses) in Fuseholder (UL 512 Fuseholder)" has been selected.

A device detail section 918 is provided including manufacturer name fields 920 and 920 for the devices selected in the device type field 914, description fields 924 and 926 for the selected devices, part number fields 928 and 930 for the selected devices, voltage ratings 932 and 934 for the devices selected, current ratings 936 and 938 for the selected devices, horse power ratings 940 and 942 for the selected devices, SCCR ratings 944 and 946 for the respective devices, interrupting ratings 948 and 950 for the selected devices, and $i^2t$ fields 952 and 954 for the selected devices. As shown in FIG. 34, drop down menus are selected for required choices or selections by the user, and the remainder of the fields are populated by the system with values found in the system database or databases for the selected devices using the fields 920 through 932 and 936, 940 and 944. Also as shown in FIG. 34, values for all of the fields may not exist for the selected devices, in which case a dash appears in the respective field. Once the user makes appropriate selections in the device type field 914 and the detail section 918, the user may select the next button 956 to proceed or the previous button 958 to return to the previous screen.

When the next button is selected, the algorithms described above are performed using the data and information in the screen of FIG. 34, and the SCCR result, including any adjustments, is displayed in the name plate section 634.

Figure 35:
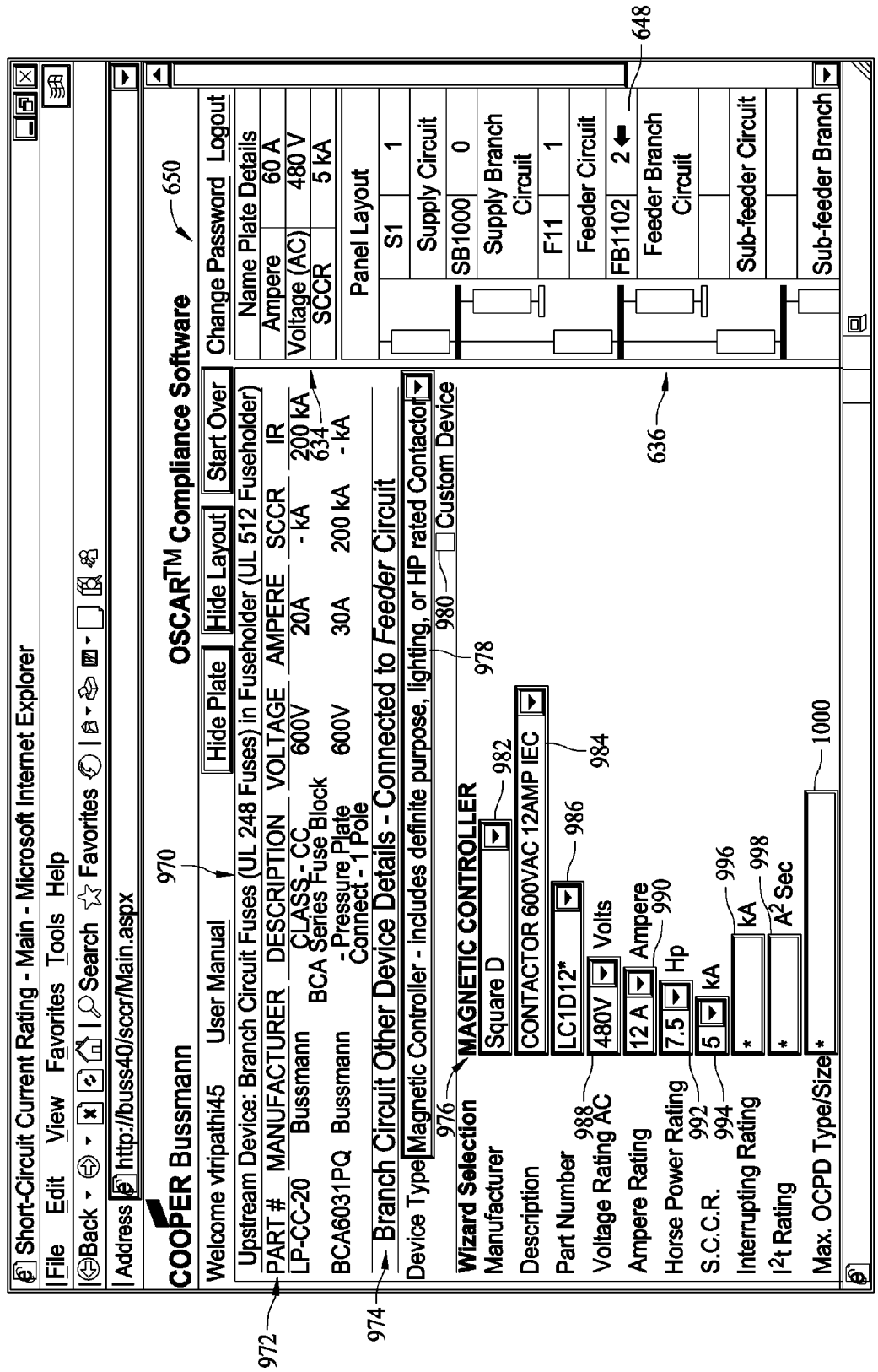

FIG. 35 is an example of a user interface displaying a fourth branch circuit component selection screen for a user of the system 150. The branch circuit component selection screen includes the name plate section 634, the layout section 636, the navigation bar 650 and a branch circuit device selection section 970. The SCCR value is equal to that of the previous screen, indicating that devices selected in the previous screen did not cause an adjustment to the SCCR value. The supply circuit field in the layout section 636 now reads "1", the supply branch circuit field reads "0", the feeder circuit field reads "1" and the feeder branch circuit still reads "2" to indicate to the user that the second branch circuit connected to the feeder circuit is still under consideration. The arrow 648 also points to the feeder branch circuit field in the layout section 636.

The feeder circuit device selection section 970 includes an upstream device section 972 populated with data corresponding to the previously made selections for the second branch circuit, a device type section 974, and a device detail section 976. The device type section 974 includes a device type field 978 and a custom device selector 980. The device type field 978 includes a drop down menu listing any of the devices described above for a branch circuit connected. In the example shown in FIG. 35, a device type of "Magnetic Controller" has been selected.

The device detail section 976 is provided including a manufacturer name field 982, a description field 984, a part number field 986, a voltage rating 988, a current rating 990, a horse power rating 992, an SCCR rating 994, an interrupting rating 996, an $i^2t$ rating 998 and a maximum OCPD type/size field 1000. As shown in FIG. 35, drop down menus are selected for required choices or selections by the user, and the remainder of the fields are populated by the system with values found in the system database or databases for the selected device using the fields 982 through 994. Also as shown in FIG. 35, values for all of the fields may not exist for any given selected device, in which case a dash appears in the respective field.

Once the user makes appropriate selections in the device type field 978 and the detail section 976, the user may scroll down the screen and select an add other device button, or may select a next button to proceed or a previous button to return to the previous screen. When the next button is selected, the algorithms described above are performed using the data and information in the screen of FIG. 35, and the SCCR result, including any adjustments, is displayed in the name plate section 634.

Figure 36:
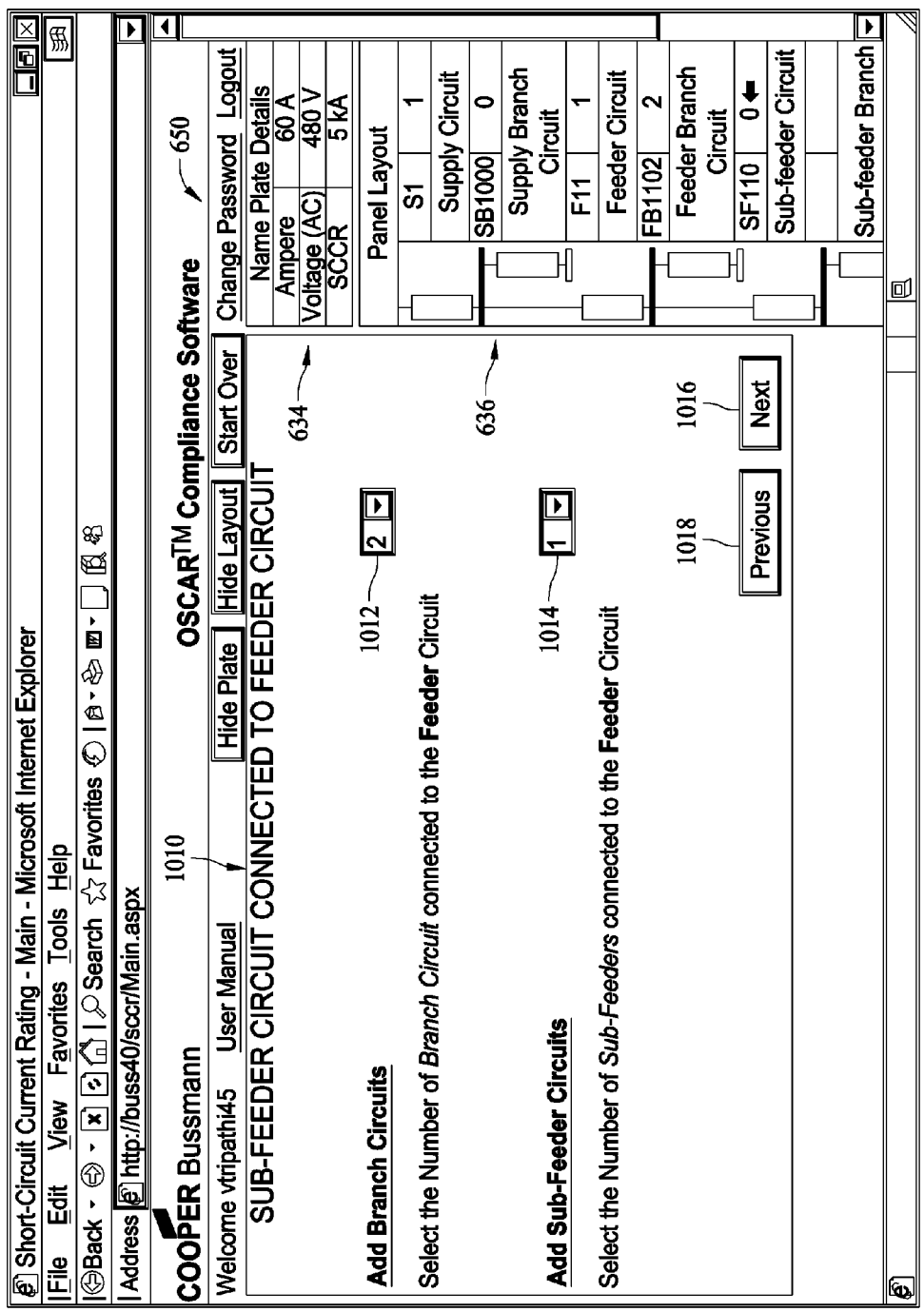

FIG. 36 is an example of a user interface displaying a sub-feeder circuit screen for a user of the analysis and evaluation system 150. The sub-feeder circuit screen includes the name plate section 634, the layout section 636, the navigation bar 650 and a sub-feeder circuit section 1010. The SCCR value is the same as the previous screen, indicating that no adjustments were required by the device selected in the previous screen. The supply circuit field in the layout section 636 now reads "1", the supply branch circuit field reads "0", the feeder circuit field reads "1", the feeder branch circuit reads "2", and the sub-feeder circuit field reads "0" as an indication that a selection has not been made. The arrow 648 also points to the sub-feeder circuit field in the layout section 636.

The sub-feeder circuit selection section 1010 displays a field 1012 indicating the previously selected number of branch circuits connected to the feeder circuit, and a sub-feeder circuit field 1014 wherein the user may select a number of sub-feeder circuits connected to the feeder circuit.

The fields 1012 and 1014 may include a drop down menu selections for the user to choose the number of branch circuits and sub-feeder circuits connected to the feeder circuit in the proposed panel design of interest. When the appropriate number of branch circuits and sub-feeder circuits have been selected, the user may select the next button 1016 to proceed or the previous button 1018 to return to the previous screen. In the illustrated example, "1" has been selected for the number of sub-feeder circuits connected to the feeder circuit.

Figure 37:
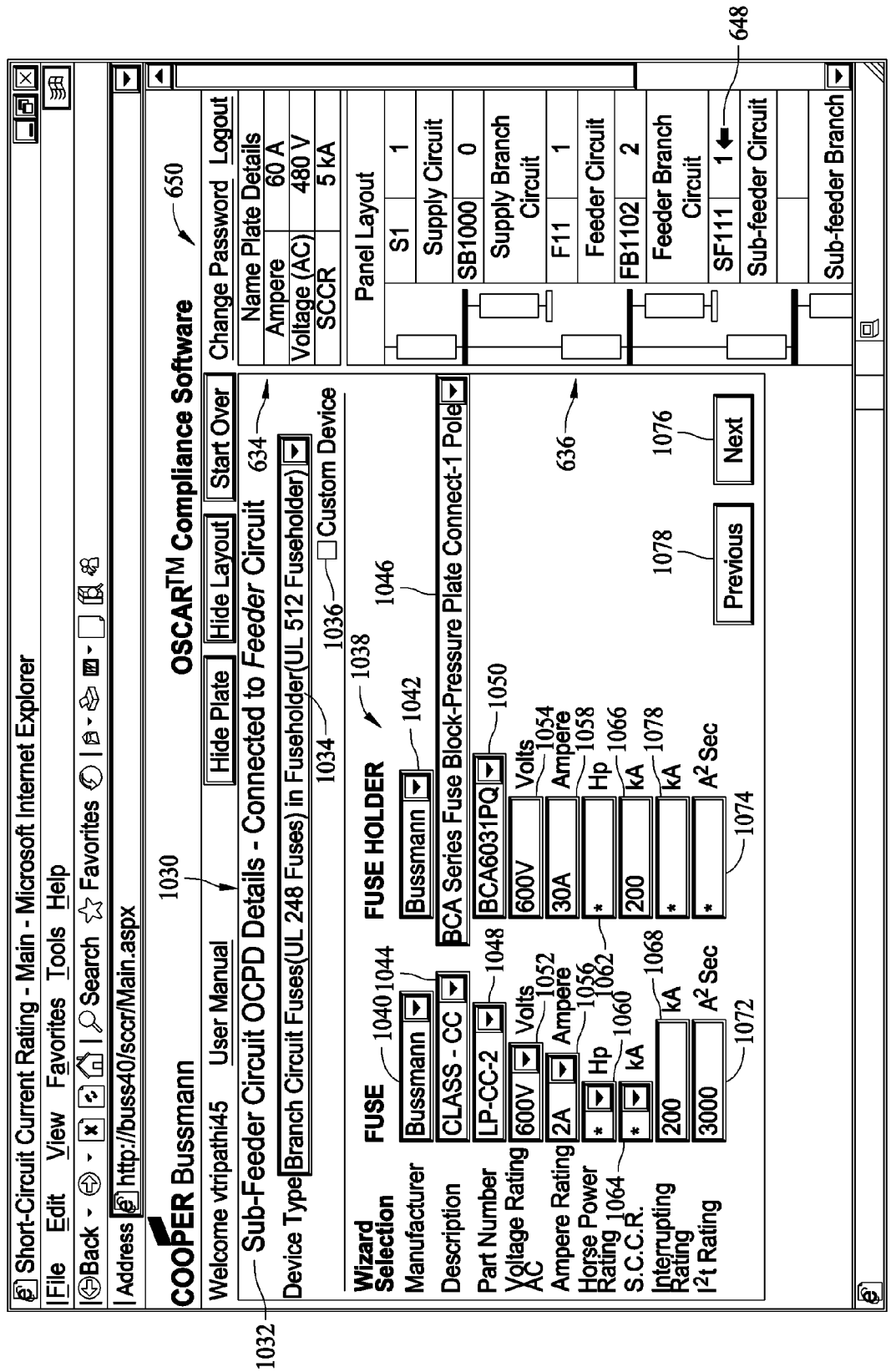

FIG. 37 is an example of a user interface displaying a first sub-feeder circuit component selection screen for a user of the analysis and evaluation system 150 after the screen shown in FIG. 36. The sub-feeder circuit component selection screen includes the name plate section 634, the layout section 636, the navigation bar 650 and a branch circuit device selection section 1030. A current SCCR value is displayed in the field 642. Also, the user may see that the arrow 648 now points to the sub-feeder branch circuit field in the layout section 636. The supply circuit field in the layout section 636 now reads "1", the supply branch circuit field reads "0", the feeder circuit field reads "1", the feeder branch circuit reads "2", and the sub-feeder circuit field now reads "1" to indicate to the user that the sub-feeder circuit connected to the feeder circuit is now under consideration.

The sub-feeder circuit device selection section 1030 includes a descriptive legend 1032, a device type field 1034, and a custom device selector 1036. The device type field 1034 includes a drop down menu listing any of the devices described above for a sub-feeder circuit. In the example shown in FIG. 37, a device type of "Branch Circuit Fuses (UL 248 Fuses) in Fuseholder (UL 512 Fuseholder)" has been selected.

A device detail section 1038 is provided including manufacturer name fields 1040 and 1042 for the devices selected in the device type field 1034, description fields 1044 and 1046 for the selected devices, part number fields 1048 and 1050 for the selected devices, voltage ratings 1052 and 1054 for the devices selected, current ratings 1056 and 1058 for the selected devices, horse power ratings 1060 and 1062 for the selected devices, SCCR ratings 1064 and 1066 for the respective devices, interrupting ratings 1068 and 1070 for the selected devices, and $i^2t$ fields 1072 and 1074 for the selected devices. As shown in FIG. 37, drop down menus are selected for required choices or selections by the user, and the remainder of the fields are populated by the system with values found in the system database or databases for the selected devices using the fields 1040 through 1052 and 1056, 1060 and 1064. Also as shown in FIG. 37, values for all of the fields may not exist for the selected devices, in which case a dash appears in the respective field.

Once the user makes appropriate selections in the device type field 1034 and the detail section 1038, the user may select the next button 1076 to proceed or the previous button 1078 to return to the previous screen. When the next button is selected, the algorithms described above are performed using the data and information in the screen of FIG. 37, and the SCCR result, including any adjustments, is displayed in the name plate section 634.

Figure 38:
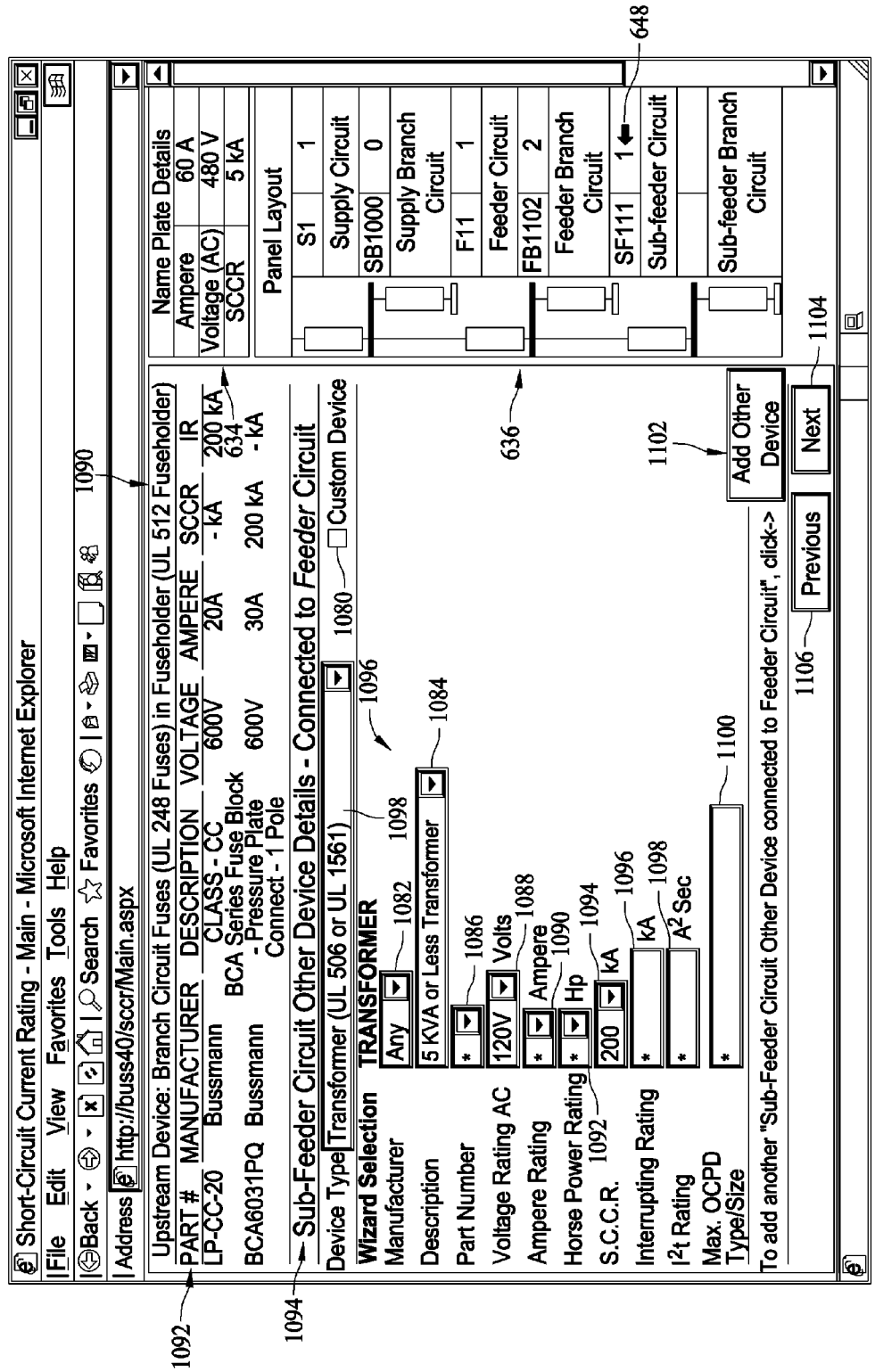

FIG. 38 is an example of a user interface displaying a second sub-feeder circuit component selection screen for a user of the system 150. The branch circuit component selection screen includes the name plate section 634, the layout section 636, the navigation bar 650 (not visible in FIG. 38 because the screen is scrolled down) and a branch circuit device selection section 1090. The SCCR value displayed is the same as the previous screen, indicating that devices selected in the screen did lead to an SCCR adjustments. The supply circuit field in the layout section 636 now reads "1", the supply branch circuit field reads "0", the feeder circuit field reads "1", the feeder branch circuit field reads "2", and the sub-feeder circuit field reads "1" to indicate to the user that the sub-feeder circuit connected to the feeder circuit is still under consideration. The arrow 648 also points to the sub-feeder branch circuit field in the layout section 636.

The feeder circuit device selection section 1090 includes an upstream device section 1092 populated with data corresponding to previously selected devices, a device type section 1094, and a device detail section 1096. The device type section 1094 includes a device type field 1098 and a custom device selector 1080. The device type field 1098 includes a drop down menu listing any of the devices described above for a sub-feeder circuit. In the example shown in FIG. 38, a device type of "Transformer (UL 506 or UL 1561)" has been selected.

The device detail section 1096 is provided including a manufacturer name field 1082, a description field 1084, a part number field 1086, a voltage rating 1088, a current rating 1090, a horse power rating 1092, an SCCR rating 1094, an interrupting rating 1096, an $i^2t$ rating 1098 and a maximum OCPD type/size field 1100. As shown in FIG. 38, drop down menus are available for required choices or selections by the user, and the remainder of the fields are populated by the system with values found in the system database or databases for the selected device using the fields 1082 through 1094. Also as shown in FIG. 388, values for all of the fields may not exist for any given selected device, in which case a dash appears in the respective field.

Once the user makes appropriate selections in the device type field 1098 and the detail section 1096, the user may select an add other device button 1102, a next button 1104 to proceed or a previous button 1106 to return to the previous screen. When the next button is selected, the algorithms described above are performed using the data and information in the screen of FIG. 38, and the SCCR result, including any adjustments, is displayed in the name plate section 634.

Figure 39:
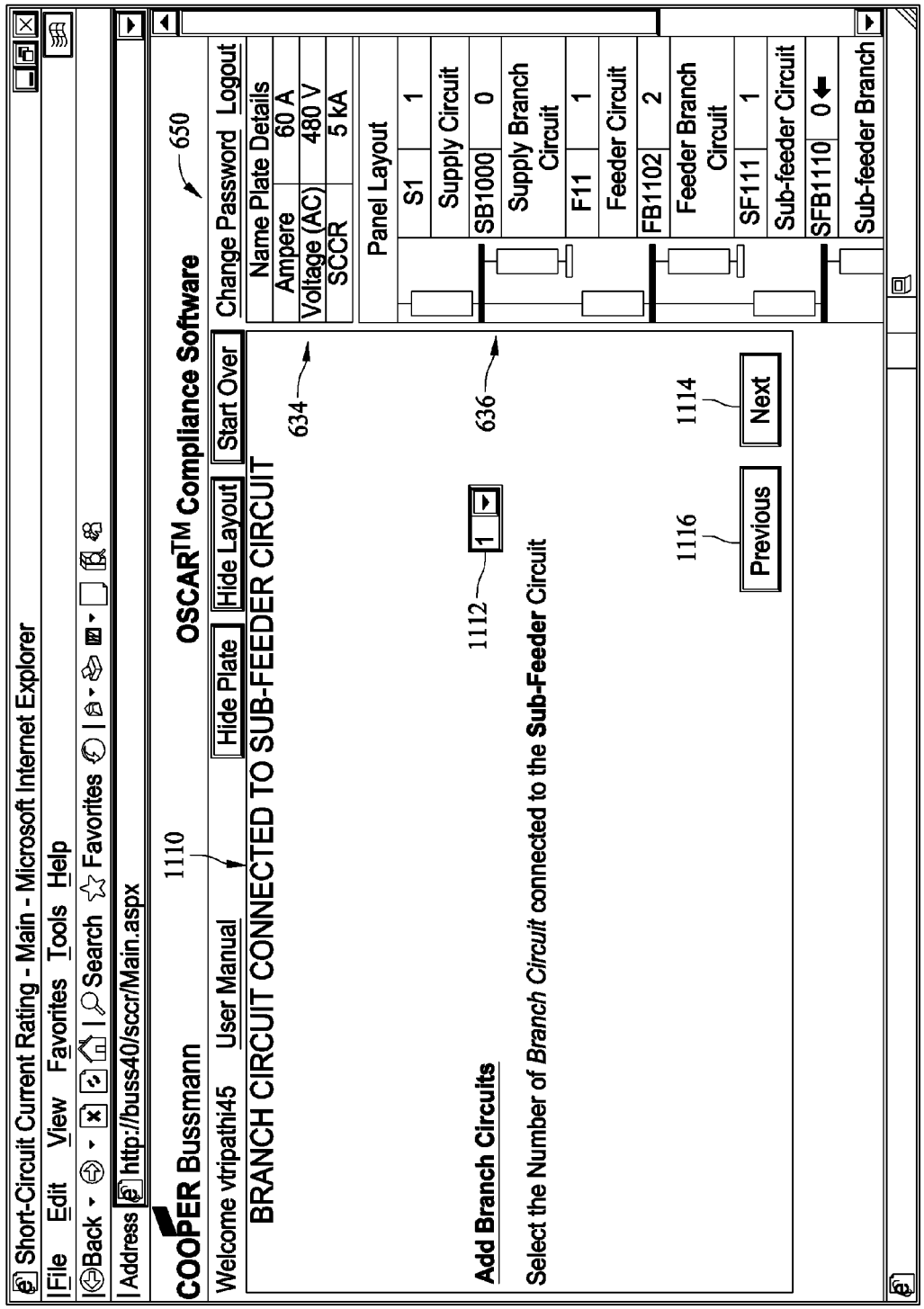

FIG. 39 is an example of a user interface displaying a branch circuit to sub-feeder circuit screen for a user of the analysis and evaluation system 150 after the supply circuit device selection screen shown in FIG. 38. The branch circuit to sub-feeder circuit screen includes the name plate section 634, the layout section 636, the navigation bar 650 and a branch circuit selection section 1110. The SCCR value displayed is the same as the previous screen, indicated that devices selected in the previous screen did not trigger any adjustments in the SCCR. The supply circuit field in the layout section 636 now reads "1", the supply branch circuit field reads "0", the feeder circuit field reads "1", the feeder branch circuit field reads "2", the sub-feeder circuit field reads "1", and the sub-feeder branch circuit field displays "0" to indicate to the user that a selection has not been made. The arrow 648 also points to the sub-feeder branch circuit field in the layout section 636.

The branch circuit selection section 1110 may include a drop down menu selection field 1112 for the user to choose the number of branch circuits connected to the sub-feeder circuit in the proposed panel design of interest. When the appropriate number of branch circuits have been selected, the user may select the next button 1114 to proceed or the previous button 1116 to return to the previous screen. In the illustrated example, "1" has been selected for the number of branch circuits connected to the sub-feeder circuit.

Figure 40:
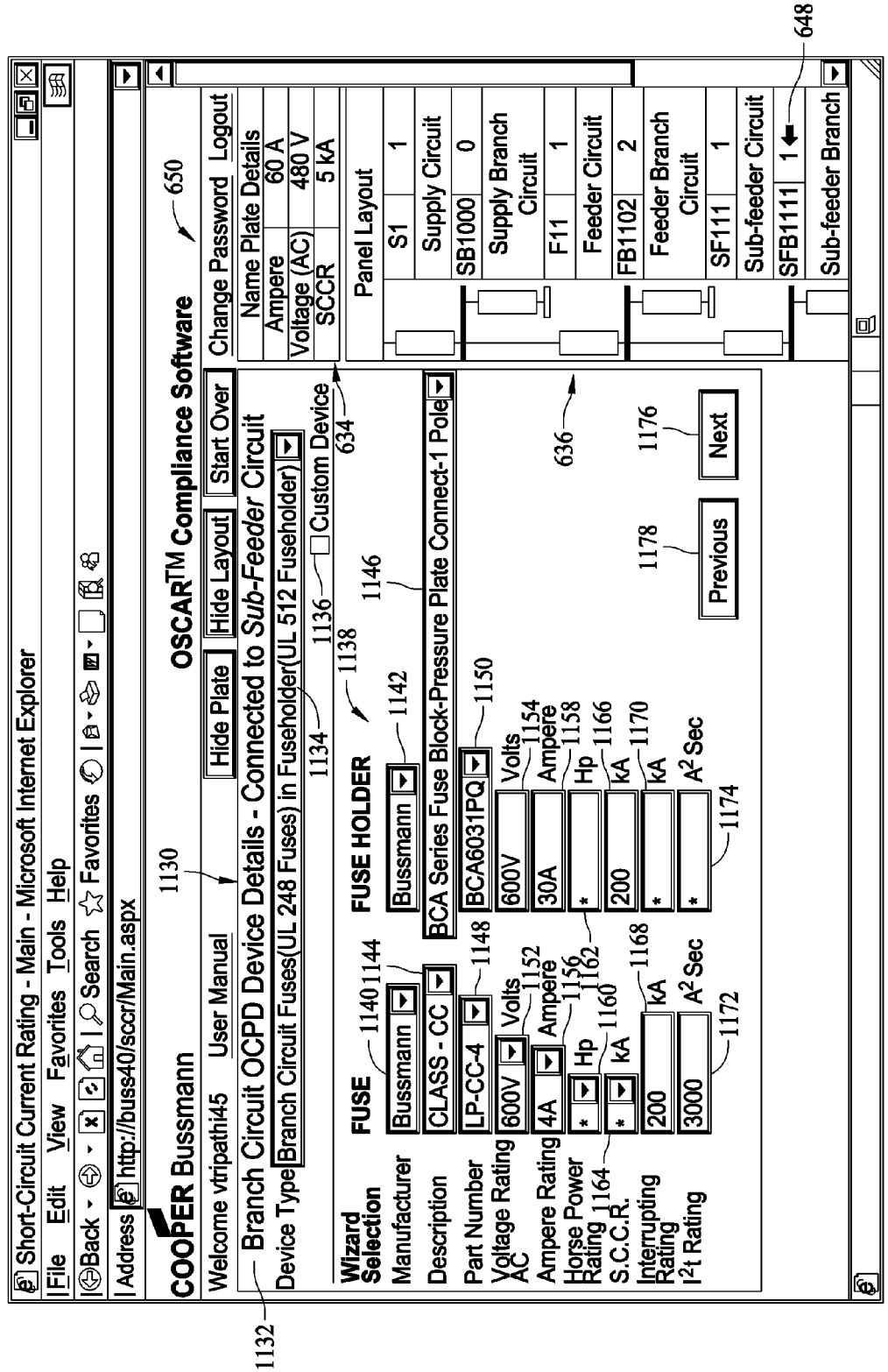

FIG. 40 is an example of a user interface displaying a first branch circuit to sub-feeder circuit component selection screen for a user of the analysis and evaluation system 150 after the screen shown in FIG. 39. The sub-feeder circuit component selection screen includes the name plate section 634, the layout section 636, the navigation bar 650 and a branch circuit device selection section 1130. A current SCCR value is displayed in the field 642. Also, the user may see that the arrow 648 points to the sub-feeder branch circuit field in the layout section 636. The supply circuit field in the layout section 636 now reads "1", the supply branch circuit field reads "0", the feeder circuit field reads "1", the feeder branch circuit reads "2", and the sub-feeder circuit field now reads "1", and the sub-feeder branch circuit field now reads "1" to indicate to the user that branch circuit connected to the sub-feeder is now under consideration.

The sub-feeder circuit device selection section 1130 includes a descriptive legend 1132, a device type field 1134, and a custom device selector 1136. The device type field 1134 includes a drop down menu listing any of the devices described above for a branch circuit. In the example shown in FIG. 40, a device type of "Branch Circuit Fuses (UL 248 Fuses) in Fuseholder (UL 512 Fuseholder)" has been selected.

A device detail section 1138 is provided including manufacturer name fields 1140 and 1142 for the devices selected in the device type field 1134, description fields 1144 and 1146 for the selected devices, part number fields 1148 and 1150 for the selected devices, voltage ratings 1152 and 1154 for the devices selected, current ratings 1156 and 1158 for the selected devices, horse power ratings 1160 and 1162 for the selected devices, SCCR ratings 1164 and 1166 for the respective devices, interrupting ratings 1168 and 1170 for the selected devices, and $i^2t$ fields 1172 and 1174 for the selected devices. As shown in FIG. 40, drop down menus are selected for required choices or selections by the user, and the remainder of the fields are populated by the system with values found in the system database or databases for the selected devices using the fields 1140 through 1152 and 1156, 1160 and 1164. Also as shown in FIG. 40, values for all of the fields may not exist for the selected devices, in which case a dash appears in the respective field.

Once the user makes appropriate selections in the device type field 1134 and the detail section 1138, the user may select the next button 1176 to proceed or the previous button 1178 to return to the previous screen. When the next button is selected, the algorithms described above are performed using the data and information in the screen of FIG. 40, and the SCCR result, including any adjustments, is displayed in the name plate section 634.

Figure 41:
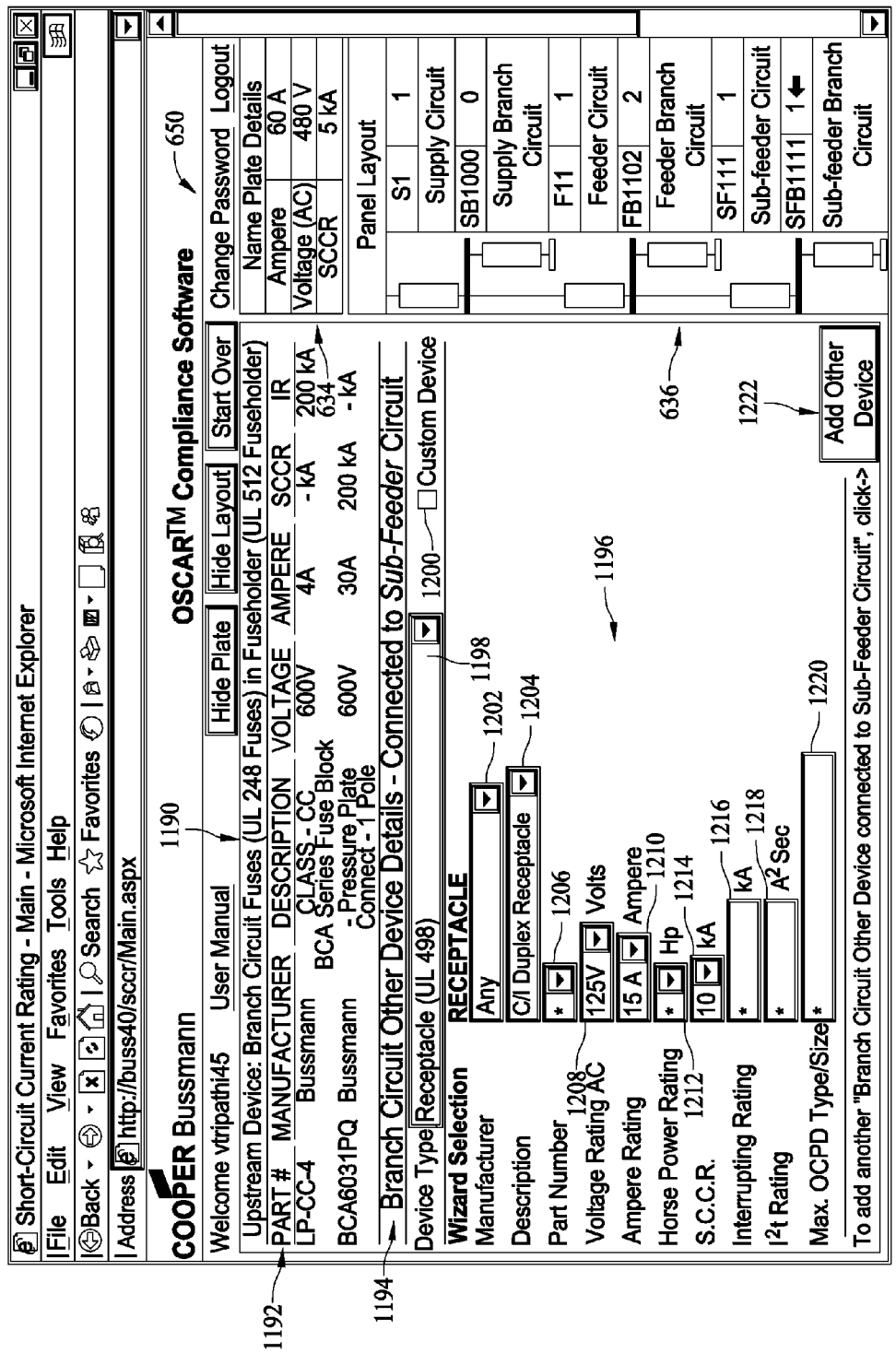

FIG. 41 is an example of a user interface displaying a second branch circuit component selection screen for a user of the system 150. The branch circuit component selection screen includes the name plate section 634, the layout section 636, the navigation bar 650 and a branch circuit device selection section 1190. The SCCR value displayed is the same as the previous screen, indicating that devices selected in the previous screen did not lead to SCCR adjustment. The supply circuit field in the layout section 636 now reads "1", the supply branch circuit field reads "0", the feeder circuit field reads "1", the feeder branch circuit field reads "2", and the sub-feeder circuit field reads "1", and the sub-feeder branch circuit field reads "1" to indicate to the user that the branch circuit connected to the sub-feeder circuit is still under consideration. The arrow 648 also points to the sub-feeder branch circuit field in the layout section 636.

The branch circuit device selection section 1190 includes an upstream device section 1192 populated with data corresponding to previously selected devices, a device type section 1194, and a device detail section 1196. The device type section 1194 includes a device type field 1198 and a custom device selector 1200. The device type field 1198 includes a drop down menu listing any of the devices described above for a branch circuit. In the example shown in FIG. 41, a device type of "Receptacle (UL 498)" has been selected.

The device detail section 1196 is provided including a manufacturer name field 1202, a description field 1204, a part number field 1206, a voltage rating 1208, a current rating 1210, a horse power rating 1212, an SCCR rating 1214, an interrupting rating 1216, an $i^2t$ rating 1218 and a maximum OCPD type/size field 1220. As shown in FIG. 40, drop down menus are available for required choices or selections by the user, and the remainder of the fields are populated by the system with values found in the system database or databases for the selected device using the fields 1202 through 1214. Also as shown in FIG. 41, values for all of the fields may not exist for any given selected device, in which case a dash appears in the respective field.

Once the user makes appropriate selections in the device type field 1198 and the detail section 1196, the user may select an add other device button 1222, a next button to proceed or a previous button (not visible in FIG. 41 but accessible by scrolling the screen down) to return to the previous screen. When the next button is selected, the algorithms described above are performed using the data and information in the screen of FIG. 34, and the SCCR result, including any adjustments, is displayed in the name plate section 634.

Figure 42:
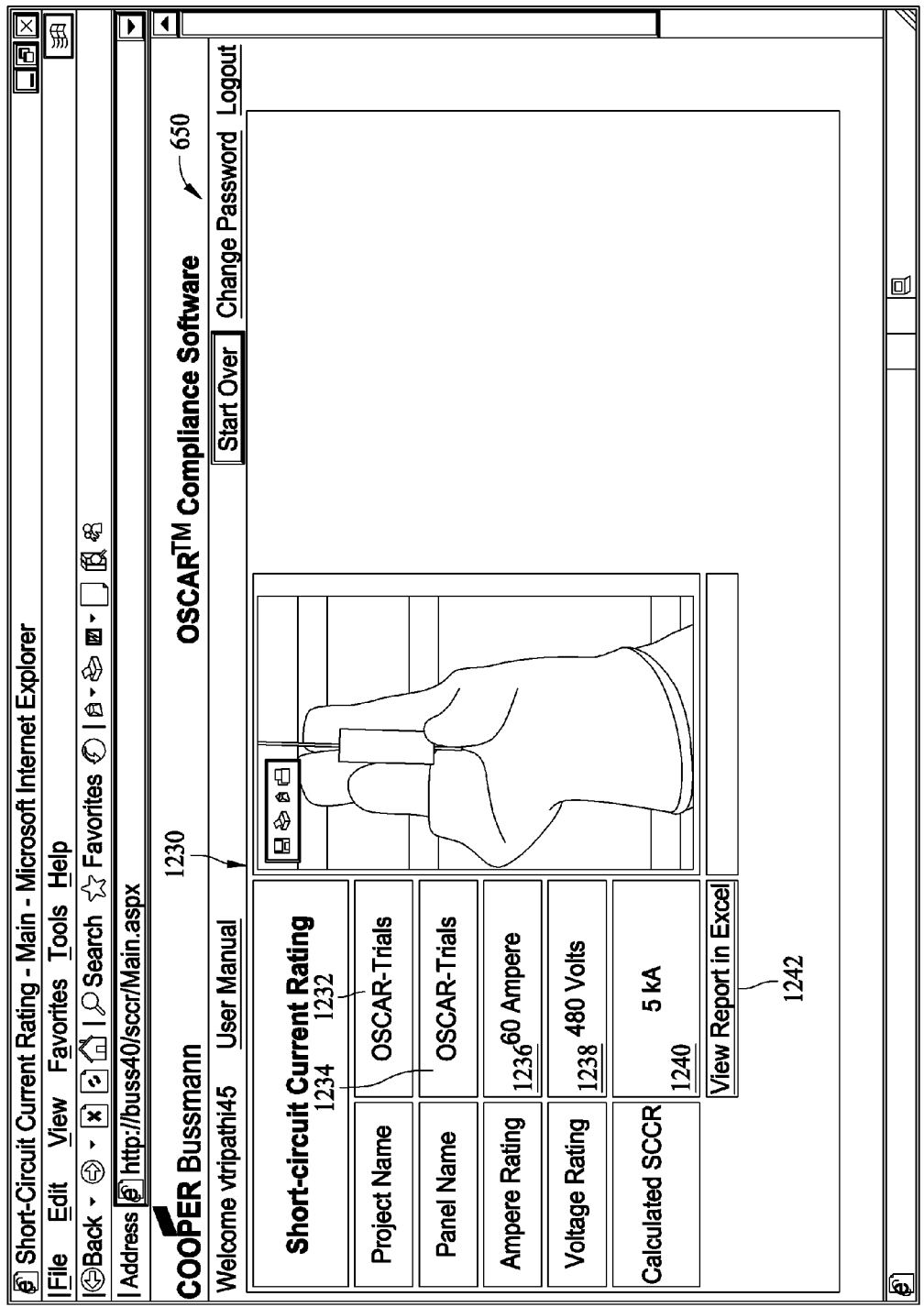

FIG. 42 is an example of a user interface displaying a project summary analysis screen including the navigation bar 650 and a summary analysis section 1230. The analysis section 1230 includes a panel name field 1232, a panel name field 1234, a current rating field 1236, a voltage rating field 1238, an a final SCCR rating field 1240 for the proposed panel design as entered by the user in the previous screens. The fields 1232 through 1240 may be used to print a name plate for the panel. If the desired final SCCR rating value does not meet the needs of a particular load to be connected to the panel, the user may use the previous buttons in the various screens to review the analysis results, determine which devices impact the final result, and choose other devices in an attempt to achieve a different result.

A detailed report generation link 1242 may also be provided. When the report generation link 1242 is selected, a detailed report may be generated for the user's records and for user study of the step-by-step analysis performed by the system and the output SCCR result at each point of analysis.

FIG. 43 is an example of a user interface displaying a detailed project analysis screen for a user of the system 150 for exemplary selected component. The report may include key values for the analysis, and notes and comments indicating the effects of upstream devices on the SCCR rating obtained. The report may be generated electronically in a spreadsheet software package such as Microsoft Excel, or in another convenient format for the user. The detailed report may also be printed or otherwise provided in hard copy form as desired.

Figure 44:
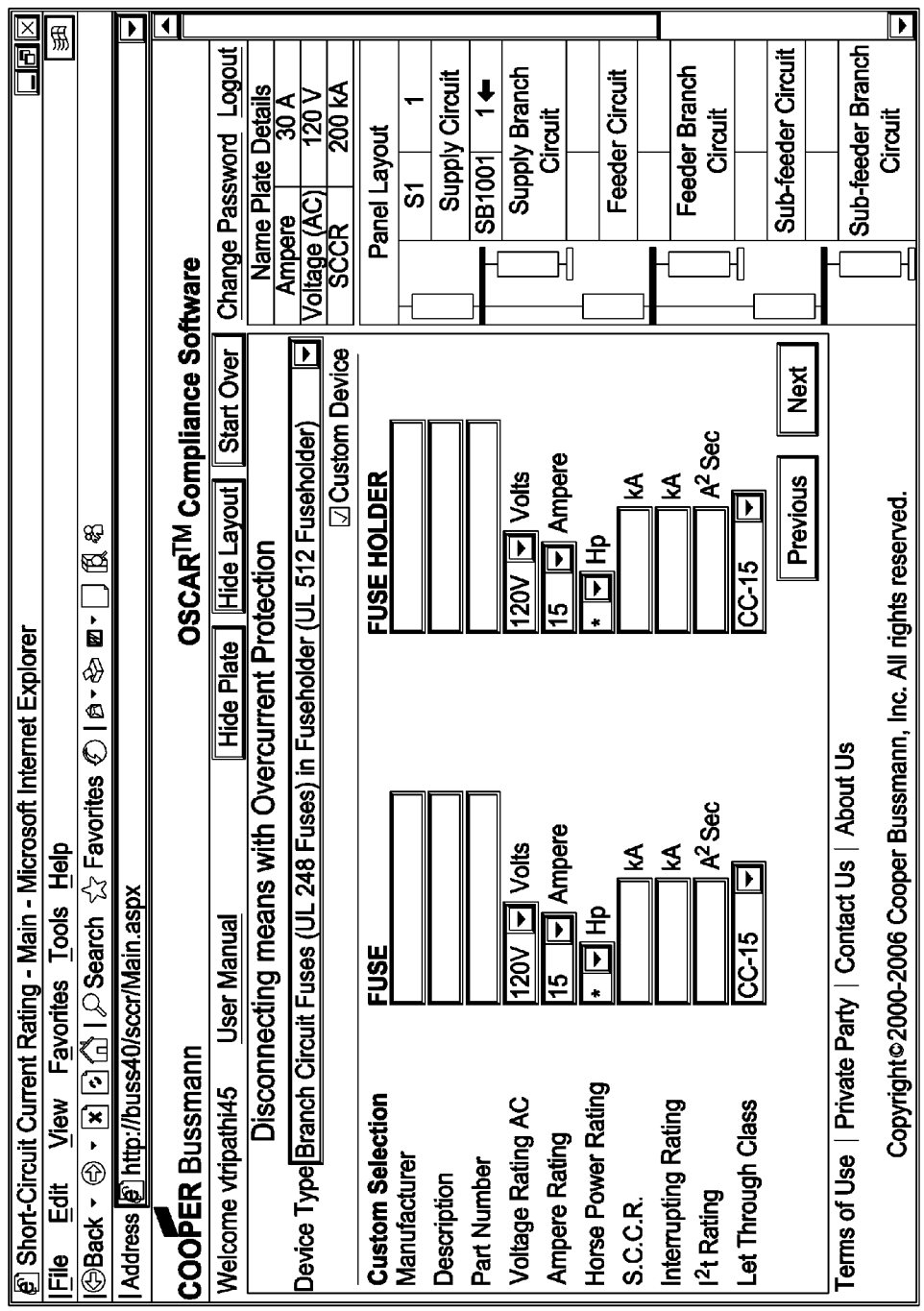

FIG. 44 is another example of a custom device selection screen presenting various fields for the user to complete. The fields presented in the custom device selection screen will vary with the device type selected.

The above described displays and screens shown in FIGS. 24-44 may be effectively used to accommodate complex panel designs, while ensuring an accurately determined SCCR rating according to U.L. 508A. The user interface displays and screens capably present voluminous amounts of data and circuit device details in easy to use, menu-driven form with intuitive links and graphical displays to quickly understand the circuit and device selections, the current point of analysis at each step, and step-by-step analysis results and feedback.

The user interface displays may be implemented conventionally in a computer program embodied on a computer readable medium and having segments of code or instructions executed by a computer that correspond to the various functions and features described above.

It is understood that additional segments of code corresponding to additional displays, links, graphics, information, and indicia may be provided in further embodiments, and further that not all of the exemplary information provided in the above-described displays and screens need be used in some embodiments of the invention. The user interface displays may be varied to suit the needs of specific electrical systems, customized for particular devices, and may be used for assessment and evaluation of standards other than N.E.C. §110.10 and U.L. 508A.

When the user interface displays are implemented on a network-based system as described above, the system may flexibly present information and perform analysis of proposed designs to multiple users simultaneously, and through menu-driven graphical displays and information links, system users may quickly access needed information to properly manage and reliably evaluate compliance of proposed product and system designs with promulgated industry standards. Device selections, data, and analysis may be saved on the system 150 by virtue of the unique project names and panel designations for later access by authorized users. As such, the user need not complete the entire analysis in a single session, but rather may conveniently exit the system and later return to the project. Detailed reports may likewise be saved on the system 150 for further study and analysis.

V. SYSTEM ADAPTATIONS

The systems and processes described above are not limited to the specific embodiments described herein. Components of each system and each process can be practiced independent and separate from other components and processes described herein. Each component and process also can be used in combination with other components, systems and processes.

For example, the foregoing analysis and evaluation system 150 may be implemented in whole or in part to meet the needs of a particular electrical system or for cost management reasons. In other words, the analysis and evaluation system 150 may not require selection of all of the described circuit and components, or perform all of the described functions set forth above. Likewise, the analysis and evaluation system 150 may be configured or adapted to require input or selection of circuits and devices and that are not described above, and to perform functions other than those specifically described. Varying degrees of complexity and functionality may be provided for cost management reasons and to meet the needs of particular users. It should now be apparent that the system components and functionality may be mixed and matched to generate varying systems which obtain the benefits of the present invention to varying degrees.

VI. CONCLUSION

The benefits and advantages of the invention are now believed to be amply demonstrated in the various embodiments disclosed.

One embodiment of a method of evaluating a proposed design of a product having a plurality of interconnected devices in light of a promulgated industry standard is disclosed. The method includes: accepting data and information corresponding to the plurality of devices, the data and information relating to an application of the standard to the proposed design; applying the standard to the accepted data and information as it is accepted; and presenting analysis information as information corresponding to each device is accepted.

Optionally, the method may also include presenting the analysis information in a screen display, with the screen display including a selection section for one of the plurality of devices, and a name plate section including the analysis information. The screen display may also include a product layout section. The method may also include generating a detailed analysis report.

The promulgated industry standard may relate to an electrical system, and the electrical system may optionally include an electrical control panel. The standard may relate to a short-circuit current rating of the electrical control panel. The plurality of devices may be located in one of a supply circuit to an electrical product, a branch circuit connected to the supply circuit, a feeder circuit connected to the supply circuit, a branch circuit connected to the feeder circuit, a sub-feeder circuit, or a branch-circuit connected to the sub-feeder circuit. The devices may be interconnected in a plurality of electrical circuits, and the standard may relate to an electrical rating of the combination of interconnected circuits.

Applying the standard in the method may include obtaining a reference value for each individual device, and adjusting the reference value based upon a comparison of the reference value and a default value. Applying the standard may also include obtaining a reference value for each component analyzed, and adjusting the reference value based upon a presence of a specified device connected upstream to the component being analyzed and a comparison of the obtained reference value and a corresponding reference value for the specified device. Still further, applying the standard may include obtaining a reference value for each component analyzed, and adjusting the reference value based upon a comparison of the obtained reference values and a value associated with another device, which may be an overcurrent protection device.

The method may additionally include accepting product information, and filtering the accepted data and information for the devices consistently with the accepted product information. The method may also include prompting selection of the data and information to a user.

An embodiment of a network-based system for evaluating a proposed electrical product design having interconnected electrical circuit devices for compliance with a promulgated standard is also disclosed. The system includes a client system having a browser, a database for storing information, and a server system adapted to be coupled to the client system and the database. The server is adapted to accept device data and information corresponding to eligible circuit devices for the proposed product design, receive user provided data and information regarding the proposed product, selectively present the device data and information to a user based on the received user provided data and information for the product, and apply the standard to devices selected by a user from the selectively presented device data and information.

Optionally, the server may also be adapted to display a result of the applied standard as each device is selected by the user. The server may present selection information in a screen display, with the screen display including a selection section for one of an overcurrent protection device and an other device, and a name plate section including analysis information for the standard. The product may be an electrical control panel, and the server may be adapted to present a screen display including a circuit layout section for the panel. The standard may relate to a short-circuit current rating for the product, and the server may be adapted to present a screen display including an updated short-circuit current rating value for the product as each device is selected. The server may also be adapted to generate a detailed analysis report.

Optionally, the plurality of interconnected devices may be located in one of a supply circuit to an electrical control panel, a branch circuit connected to the supply circuit, a feeder circuit connected to the supply circuit, a branch circuit connected to the feeder circuit, a sub-feeder circuit, or a branch-circuit connected to the sub-feeder circuit. Each of the circuit may include an overcurrent protection device.

The server may be adapted to apply the standard by obtaining a reference value for each individual device that is a non-overcurrent protection device, and adjusting the reference value based upon a comparison of the reference value and a default value. Also, the server may be adapted to apply the standard by obtaining a reference value for each individual device analyzed, and adjust the reference value based upon a presence of a specified device connected upstream to the component being analyzed and a comparison of the obtained reference value and a corresponding reference value for the specified device, which may be a transformer. The server may also be adapted to apply the standard by obtaining a reference value for the device being analyzed and comparing a current let through value of the overcurrent protection device with the obtained value. The server may be adapted to apply the provisions of NEC Article 409 and U.L. 508A to an electrical control panel design.

Overcurrent devices may optionally be selected from the group of a fused pullout device, a pullout switch, a fused switch, a circuit breaker, a combination starter, a branch circuit fuse and a custom device. The circuit devices may be part of a remote disconnection means, with the circuit devices being selected from the group of: branch circuit fuses in a fuse holder, a bus bar system, a GFCI receptacle, a magnetic controller, a magnetic motor starter, a manual motor starter, a molded case switch, a non-fuse switch, an overload relay, power conversion equipment, a receptacle, a semiconductor fuse, a silicon control rectifier, a terminal block, and a custom device. The circuit devices may also be part of a feeder circuit, with the circuit devices being selected from the group of: a bus bar system, a magnetic controller, a molded case switch, a non-fused switch, a semiconductor fuse, a silicon control rectifier, a terminal block, a transformer, a multi-lug terminal and a custom device.

An embodiment of a network-based system for evaluating a short-circuit current rating of a proposed design of an electrical control panel having multiple interconnected circuits is also disclosed. The circuits include at least one of a feeder circuit connected to a supply circuit, a branch circuit connected to the supply circuit, a sub-feeder circuit, and a branch circuit connected to the sub-feeder circuit, wherein each of the circuits comprises an overcurrent protection device and another device. The system includes a client system comprising a browser, a database for storing information, and a server system adapted to be coupled to the client system and the database. The server is further adapted to accept device data and information corresponding to eligible overcurrent protection devices and other devices for the proposed control panel, receive user provided data and information regarding the proposed control panel, selectively present the device data and information to a user based on the received user provided data and information for the proposed panel, and determine the short circuit current rating for the panel as each device is selected by the user from the selectively presented device data and information.

Optionally, the server may also be adapted to display the determined short circuit current rating to the user. The server may be adapted to present selection information in a screen display, the screen display including a name plate section including the determined short circuit current rating. The display may also include a circuit layout section for the panel and an indicator to identify circuits being analyzed. The server may also be adapted to generate a detailed short circuit current rating report for the proposed panel design.

Optionally, the server may be adapted to determine an Adjusted SCCR Rating as devices are selected. The server may also determine a Trans. Through SCCR value based on the Adjusted SCCR value. The server may further determine a Let-Thru SCCR value based upon the Trans. Through SCCR value.

The server may be adapted to prompt selection of the data and information to a user. Overcurrent protection devices may be selected from the group of group of a fused pullout device, a pullout switch, a fused switch, a circuit breaker, a combination starter, a branch circuit fuse and a custom device. The circuit devices are part of a remote disconnection means, and the circuit devices may be selected from the group of: branch circuit fuses in a fuse holder, a bus bar system, a GFCI receptacle, a magnetic controller, a magnetic motor starter, a manual motor starter, a molded case switch, a non-fuse switch, an overload relay, power conversion equipment, a receptacle, a semiconductor fuse, a silicon control rectifier, a terminal block, and a custom device. The circuit devices may be part of a feeder circuit, with the circuit devices being selected from the group of: a bus bar system, a magnetic controller, a molded case switch, a non-fused switch, a semiconductor fuse, a silicon control rectifier, a terminal block, a transformer, a multi-lug terminal and a custom device.

A computer program embodied on a computer readable medium for evaluating and assessing a proposed electrical system in light of a promulgated industry standard is also disclosed. The program comprises at least one code segment that receives user provided selections for devices utilized in the proposed electrical system, and, in response to the received selections; determines an output value corresponding to the promulgated industry standard; and displays the output value for inspection by a user when a selection is received.

Optionally, the program may also include code segments for one or more of the following features: a display of a product name plate including a current rating for the proposed electrical system, a voltage rating for the proposed electrical system, and the output value; a display of a product layout section for the proposed electrical system, an indication of a current stage of the analysis for the proposed electrical system; and display of device information for selected devices. The device information may including at least one of a manufacturer name, a description, a part number, a voltage rating, a current rating, a horse power rating, an SCCR rating, an interrupting rating, an $i^2t$ rating, a maximum overcurrent protection device type/size value, a let thru class value.

Additionally, the program may also include code segments for one or more of the following optional features 50: a display of a supply circuit selection screen, a display of a feeder circuit selection screen, a display of a sub-feeder circuit selection screen, a display of a branch circuit selection screen, a display of a short-circuit current rating screen for the proposed electrical system, generation of a detailed short-circuit current rating report for the proposed electrical system, which may be an electrical control panel.

An electronic system for evaluating a short circuit current rating of multiple interconnected circuits is also disclosed. The system includes means for storing data and information relating to eligible circuit devices for the interconnected circuits, means for receiving user provided circuit device selections; means for determining the short current rating after each circuit device selection is received, and means for communicating the short current rating to the user after each circuit device selection is received.

Optionally, the means for storing installation data may comprise a database. The data and information may be selected from the group of a manufacturer name, a description, a part number, a voltage rating, a current rating, a horse power rating, an SCCR rating, an interrupting rating, an $i^2t$ rating, a maximum overcurrent protection device type/size value, a let thru class value.

The means for receiving may comprise a network-based system. The means for displaying may comprise a computer program embodied on a computer readable medium. The means for communicating may comprise a display screen.

The circuits may comprise overcurrent protection devices and other devices. The overcurrent protection devices may be selected from the group of group of a fused pullout device, a pullout switch, a fused switch, a circuit breaker, a combination starter, a branch circuit fuse and a custom device. The circuit devices may be part of a remote disconnection means, with the circuit devices being selected from the group of: branch circuit fuses in a fuse holder, a bus bar system, a GFCI receptacle, a magnetic controller, a magnetic motor starter, a manual motor starter, a molded case switch, a non-fuse switch, an overload relay, power conversion equipment, a receptacle, a semiconductor fuse, a silicon control rectifier, a terminal block, and a custom device. The circuit devices may be part of a feeder circuit, with the circuit devices being selected from the group of: a bus bar system, a magnetic controller, a molded case switch, a non-fused switch, a semiconductor fuse, a silicon control rectifier, a terminal block, a transformer, a multi-lug terminal and a custom device.

While the invention has been described in terms of various specific embodiments, those skilled in the art will recognize that the invention can be practiced with modification within the spirit and scope of the claims.

What is claimed is:

1. A method of evaluating a proposed design of a product having a plurality of interconnected devices in light of a promulgated industry standard, the method implemented in a computer system, the method comprising:
   accepting, with the computer system, data and information corresponding to the plurality of devices, the data and information relating to an application of the standard to the proposed design;
   applying, by the computer system, the standard to the accepted data and information as it is accepted; and
   presenting, with the computer system, analysis information to a user as information corresponding to each device is accepted.

2. The method of claim 1, further comprising presenting the analysis information in a screen display, the screen display including a selection section for one of the plurality of devices, and a name plate section including the analysis information.

3. The method of claim 2, the screen display further comprising a product layout section.

4. The method of claim 1, further comprising generating a detailed analysis report.

5. The method of claim 1, wherein the promulgated industry standard relates to an electrical system.

6. The method of claim 5, wherein the electrical system includes an electrical control panel.

7. The method of claim 6, wherein the promulgated industry standard relates to a short-circuit current rating of the electrical control panel.

8. The method of claim 1, wherein the plurality of devices are located in one of a supply circuit to an electrical product, a branch circuit connected to the supply circuit, a feeder circuit connected to the supply circuit, a branch circuit connected to the feeder circuit, a sub-feeder circuit, or a branch-circuit connected to the sub-feeder circuit.

9. The method of claim 1, wherein the devices are interconnected in a plurality of electrical circuits, and wherein the standard relates to an electrical rating of the combination of interconnected circuits.

10. The method of claim 1, wherein applying the standard comprises obtaining a reference value for each individual device, and adjusting the reference value based upon a comparison of the reference value and a default value.

11. The method of claim 1, wherein applying the standard comprises obtaining a reference value for each component analyzed, and adjusting the reference value based upon a presence of a specified device connected upstream to the component being analyzed and a comparison of the obtained reference value and a corresponding reference value for the specified device.

12. The method of claim 1, wherein applying the standard comprises obtaining a reference value for each component analyzed, and adjusting the reference value based upon a comparison of the obtained reference values and a value associated with another device.

13. The method of claim 12, wherein the another device comprises an overcurrent protection device.

14. The system of claim 1, further comprising accepting product information, and filtering the accepted data and information for the devices consistently with the accepted product information.

15. The method of claim 1, further comprising prompting selection of the data and information to a user.

16. A network-based system for evaluating a proposed electrical product design having interconnected electrical circuit devices for compliance with a promulgated standard, the system comprising:
   a client system comprising a browser;
   a database for storing information; and
   a server system adapted to be coupled to the client system and the database, the server further adapted to:
      accept device data and information corresponding to eligible circuit devices for the proposed product design;
      receive user provided data and information regarding the proposed product;
      selectively present the device data and information to a user based on the received user provided data and information for the product;
      apply the standard to devices selected by a user from the selectively presented device data and information; and
      display a result of the applied standard as each device is selected by the user.

17. The system of claim 16, the server further adapted to present selection information in a screen display, the screen display including a selection section for one of an overcurrent protection device and an other device, and a name plate section including analysis information for the standard.

18. The system of claim 16, wherein the product comprises an electrical control panel, the server further adapted to present a screen display, the display comprising a circuit layout section for the panel.

19. The system of claim 16, wherein the standard relates to a short-circuit current rating for the product, the server further adapted to present a screen display, the display including an updated short-circuit current rating value for the product as each device is selected.

20. The system of claim 16, wherein the server is adapted to generate a detailed analysis report.

21. The system of claim 16, wherein the plurality of interconnected devices are located in one of a supply circuit to an electrical control panel, a branch circuit connected to the supply circuit, a feeder circuit connected to the supply circuit, a branch circuit connected to the feeder circuit, a sub-feeder circuit, or a branch-circuit connected to the sub-feeder circuit.

22. The system of claim 16, wherein the electrical circuits each comprise an overcurrent protection device.

23. The system of claim 16, wherein the server is adapted to apply the standard by obtaining a reference value for each individual device that is a non-overcurrent protection device, and adjust the reference value based upon a comparison of the reference value and a default value.

24. The system of claim 16, wherein the server is adapted to apply the provisions of NEC Article 409 and U.L. 508A to an electrical control panel design.

25. The system of claim 16, wherein the server is adapted to apply the standard by obtaining a reference value for each individual device analyzed, and adjusting the reference value based upon a presence of a specified device connected upstream to the component being analyzed and a comparison of the obtained reference value and a corresponding reference value for the specified device.

26. The system of claim 25, wherein the specified device is a transformer.

27. The system of claim 16, wherein the devices include overcurrent protection devices, and the server is adapted to apply the standard by obtaining a reference value for the device being analyzed and comparing a current let through value of the overcurrent protection device with the obtained value.

28. The system of claim 16, the server further adapted to prompt selection of the data and information to a user.

29. The system of claim 16, wherein the circuit devices comprise overcurrent protection devices, the overcurrent devices including at least one or more of a fused pullout device, a pullout switch, a fused switch, a circuit breaker, a combination starter, a branch circuit fuse, a custom device and combinations thereof.

30. The system of claim 16, wherein the circuit devices are part of a remote disconnection means, the circuit devices including at least one or more of a branch circuit fuse in a fuse holder, a bus bar system, a GFCI receptacle, a magnetic controller, a magnetic motor starter, a manual motor starter, a molded case switch, a non-fuse switch, an overload relay, power conversion equipment, a receptacle, a semiconductor fuse, a silicon control rectifier, a terminal block, a custom device, and combinations thereof 31. The system of claim 16, wherein the circuit devices are part of a feeder circuit, the circuit devices including at least one or more one or more of a bus bar system, a magnetic controller, a molded case switch, a non-fused switch, a semiconductor fuse, a silicon control rectifier, a terminal block, a transformer, a multi-lug terminal, a custom device, and combinations thereof.

32. A network-based system for evaluating a short-circuit current rating of a proposed design of an electrical control panel having multiple interconnected circuits, the circuits including at least one of a feeder circuit connected to a supply circuit, a branch circuit connected to the supply circuit, a sub-feeder circuit, and a branch circuit connected to the sub-feeder circuit, wherein each of the circuits comprises an overcurrent protection device and another device, the system comprising:
a client system comprising a browser;
a database for storing information; and
a server system adapted to be coupled to the client system and the database, the server further adapted to:
accept device data and information corresponding to eligible overcurrent protection devices and other devices for the proposed control panel;
receive user provided data and information regarding the proposed control panel;
selectively present the device data and information to a user based on the received user provided data and information for the proposed panel; and
determine the short circuit current rating for the panel as each device is selected by the user from the selectively presented device data and information.

33. The system of claim 32, the server further adapted to display the determined short circuit current rating to the user.

34. The system of claim 32, the server further adapted to present selection information in a screen display, the screen display including a name plate section including the determined short circuit current rating.

35. The system of claim 32, wherein the server is further adapted to present a screen display, the display comprising a circuit layout section for the panel and an indicator to identify circuits being analyzed.

36. The system of claim 32, wherein the server is adapted to generate a detailed short circuit current rating report for the proposed panel design.

37. The system of claim 32, wherein the server is adapted to determine an Adjusted SCCR Rating as devices are selected.

38. The system of claim 37, wherein the server is further adapted to determine a Trans. Through SCCR value based on the Adjusted SCCR value.

39. The system of claim 38, wherein the server is further adapted to determine a Let-Thru SCCR value based upon the Trans. Through SCCR value.

40. The system of claim 32, the server further adapted to prompt selection of the data and information to a user.

41. The system of claim 32, wherein the overcurrent protection devices include at least one or more of a fused pullout device, a pullout switch, a fused switch, a circuit breaker, a combination starter, a branch circuit fuse, a custom device and combinations thereof.

42. The system of claim 32, wherein the circuit devices are part of a remote disconnection means, the circuit devices including at least one or more of a branch circuit fuse in a fuse holder, a bus bar system, a GFCI receptacle, a magnetic controller, a magnetic motor starter, a manual motor starter, a molded case switch, a non-fuse switch, an overload relay, power conversion equipment, a receptacle, a semiconductor fuse, a silicon control rectifier, a terminal block, a custom device, and combinations thereof.

43. The system of claim 32, wherein the circuit devices are part of a feeder circuit, the circuit devices including one or more of a bus bar system, a magnetic controller, a molded case switch, a non-fused switch, a semiconductor fuse, a silicon control rectifier, a terminal block, a transformer, a multi-lug terminal and a custom device.

44. A computer program embodied on a non-transitional computer readable medium for evaluating and assessing a proposed electrical system in light of a promulgated industry standard, the program comprising at least one code segment for instructing a computer that receives user provided selections for devices utilized in the proposed electrical system, and, in response to the received selections;
determines an output value corresponding to the promulgated industry standard; and displays the output value for inspection by a user when each selection is received.

45. The program of claim 44, further comprising at least one code segment that displays a product name plate including a current rating for the proposed electrical system, a voltage rating for the proposed electrical system, and the output value.

46. The program of claim 44, further comprising at least one code segment that displays a product layout section for the proposed electrical system.

47. The program of claim 44, further comprising at least one code segment that indicates a current stage of the analysis for the proposed electrical system.

48. The program of claim 44, further comprising at least one code segment that displays device information for selected devices, the device information including at least one of a manufacturer name, a description, a part number, a voltage rating, a current rating, a horse power rating, an SCCR rating, an interrupting rating, an $i^2t$ rating, a maximum overcurrent protection device type/size value, a let thru class value.

49. The program of claim 44, further comprising at least one code segment that displays a supply circuit selection screen.

50. The program of claim 44, further comprising at least one code segment that displays a feeder circuit selection screen.

51. The program of claim 44, further comprising at least one code segment that displays a sub-feeder circuit selection screen.

52. The program of claim 44, further comprising at least one code segment that displays a branch circuit selection screen.

53. The program of claim 44, further comprising at least one code segment that displays a short-circuit current rating screen for the proposed electrical system.

54. The program of claim 44, further comprising at least one code segment generating a detailed short-circuit current rating report for the proposed electrical system.

55. The program of claim 44, wherein the proposed electrical system comprises an electrical control panel.

56. An electronic system for evaluating a short circuit current rating of multiple interconnected circuits, the system comprising:
  means for storing data and information relating to eligible circuit devices for the interconnected circuits;
  means for receiving user provided circuit device selections; and
  means for determining the short current rating after each circuit device selection is received; and
  means for communicating the short current rating to the user after each circuit device selection is received.

57. The system of claim 56 wherein the means for storing installation data comprises a database.

58. The system of claim 56 wherein the data and information includes one or more of a manufacturer name, a description, a part number, a voltage rating, a current rating, a horse power rating, an SCCR rating, an interrupting rating, an $i^2t$ rating, a maximum overcurrent protection device type/size value, a let thru class value, and combinations thereof.

59. The system of claim 56 wherein the means for receiving comprises a network-based system.

60. The system of claim 56 wherein the means for displaying comprises a computer program embodied on a computer readable medium.

61. The system of claim 56 wherein the means for communicating comprises a display screen.

62. The system of claim 56 wherein the circuits comprise overcurrent protection devices and other devices.

63. The system of claim 62, wherein the overcurrent protection devices include at least one or more of a fused pullout device, a pullout switch, a fused switch, a circuit breaker, a combination starter, a branch circuit fuse, a custom device, and combinations thereof.

64. The system of claim 56, wherein the circuit devices are part of a remote disconnection means, the circuit devices including at least one or more of a branch circuit fuse in a fuse holder, a bus bar system, a GFCI receptacle, a magnetic controller, a magnetic motor starter, a manual motor starter, a molded case switch, a non-fuse switch, an overload relay, power conversion equipment, a receptacle, a semiconductor fuse, a silicon control rectifier, a terminal block, a custom device, and combinations thereof.

65. The system of claim 56, wherein the circuit devices are part of a feeder circuit, the circuit devices including at least one or more of a bus bar system, a magnetic controller, a molded case switch, a non-fused switch, a semiconductor fuse, a silicon control rectifier, a terminal block, a transformer, a multi-lug terminal, a custom device, and combinations thereof.

* * * * *